United States Patent
Yamazaki et al.

(10) Patent No.: US 9,425,226 B2
(45) Date of Patent: Aug. 23, 2016

(54) IMAGING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Masayuki Sakakura, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/643,248

(22) Filed: Mar. 10, 2015

(65) Prior Publication Data

US 2015/0263053 A1    Sep. 17, 2015

(30) Foreign Application Priority Data

Mar. 13, 2014 (JP) ................. 2014-050267

(51) Int. Cl.
*H01L 29/10* (2006.01)
*H01L 27/146* (2006.01)
(Continued)

(52) U.S. Cl.
CPC ...... *H01L 27/14616* (2013.01); *H01L 27/1207* (2013.01); *H01L 27/1464* (2013.01); *H01L 27/14632* (2013.01); *H01L 27/14641* (2013.01); *H01L 29/7869* (2013.01); *H01L 27/14621* (2013.01); *H01L 27/14627* (2013.01); *H01L 27/14636* (2013.01); *H01L 27/14643* (2013.01)

(58) Field of Classification Search
CPC ............. H01L 27/1225; H01L 27/14643; H01L 27/12014; H01L 27/14636
USPC .................................... 257/43, 291
See application file for complete search history.

(56) References Cited

U.S. PATENT DOCUMENTS 5,698,844 A    12/1997 Shinohara et al.
5,731,856 A    3/1998 Kim et al.
(Continued)

FOREIGN PATENT DOCUMENTS

CN    102857711 A    1/2013
EP    1737044 A    12/2006
(Continued)

OTHER PUBLICATIONS

International Search Report (Application No. PCT/IB2015/051635) Dated Jun. 16, 2015.
(Continued)

*Primary Examiner* — Brook Kebede
(74) *Attorney, Agent, or Firm* — Fish & Richardson P.C.

(57) ABSTRACT

An imaging device which is capable of taking images with high quality and can be manufactured at low cost is provided. A first circuit includes a first transistor and a second transistor and a second circuit includes a third transistor and a photodiode. The first transistor and the third transistor are each an n-channel transistor including an oxide semiconductor layer as an active layer, and the second transistor is a p-channel transistor including an active region in a silicon substrate. The photodiode is provided in the silicon substrate. A region in which the first transistor and the second transistor overlap each other with an insulating layer positioned therebetween is provided. A region in which the third transistor and the photodiode overlap each other with the insulating layer positioned therebetween is provided.

21 Claims, 70 Drawing Sheets

(51) Int. Cl.
*H01L 29/786* (2006.01)
*H01L 27/12* (2006.01)

(56) References Cited

U.S. PATENT DOCUMENTS

| | | | |
|---|---|---|---|
| 5,744,864 A | 4/1998 | Cillessen et al. |
| 6,204,524 B1 | 3/2001 | Rhodes |
| 6,251,712 B1 | 6/2001 | Tanaka et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,849,853 B2 | 2/2005 | Ikeda et al. |
| 6,960,817 B2 | 11/2005 | Ogura et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,115,923 B2 | 10/2006 | Hong |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,776 B2 | 9/2008 | Hoffman et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,800,148 B2 | 9/2010 | Lee et al. |
| 7,916,195 B2 | 3/2011 | Kudoh |
| 7,956,394 B2 | 6/2011 | Lee |
| 8,164,256 B2 | 4/2012 | Sano et al. |
| 8,193,045 B2 | 6/2012 | Omura et al. |
| 8,333,913 B2 | 12/2012 | Inoue et al. |
| 8,378,391 B2 | 2/2013 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125038 A1 | 6/2006 | Mabuchi |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018075 A1 | 1/2007 | Cazaux et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001192 A1* | 1/2008 | Inoue ............... H01L 27/14603 257/291 |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0303072 A1 | 12/2008 | Lee et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140609 A1 | 6/2010 | Yano et al. |
| 2010/0201834 A1 | 8/2010 | Maruyama et al. |
| 2011/0108836 A1* | 5/2011 | Koyama ............... H01L 27/1225 257/43 |
| 2013/0001403 A1 | 1/2013 | Yamakawa |
| 2013/0285045 A1 | 10/2013 | Sasaki et al. |

FOREIGN PATENT DOCUMENTS

| | | |
|---|---|---|
| EP | 2226847 A | 9/2010 |
| JP | 60-198861 A | 10/1985 |
| JP | 63-174356 A | 7/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-118977 A | 4/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-114453 A | 4/2000 |
| JP | 2000-150900 A | 5/2000 |
| JP | 2001-160624 A | 6/2001 |
| JP | 2002-076356 A | 3/2002 |
| JP | 2002-246580 A | 8/2002 |
| JP | 2002-289859 A | 10/2002 |
| JP | 2003-086000 A | 3/2003 |

(56) References Cited

FOREIGN PATENT DOCUMENTS

| JP | 2003-086808 A | 3/2003 |
|----|---------------|--------|
| JP | 2003-197890 A | 7/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-173351 A | 6/2006 |
| JP | 2006-229047 A | 8/2006 |
| JP | 2007-096055 A | 4/2007 |
| JP | 2007-123861 A | 5/2007 |
| JP | 2007-250862 A | 9/2007 |
| JP | 2008-198791 A | 8/2008 |
| JP | 2009-158528 A | 7/2009 |
| JP | 2009-176950 A | 8/2009 |
| JP | 2011-119711 A | 6/2011 |
| JP | 2013-033896 A | 2/2013 |
| JP | 2013-243352 A | 12/2013 |
| KR | 2006-0067872 A | 6/2006 |
| KR | 2013-0007444 A | 1/2013 |
| TW | I278108 | 4/2007 |
| WO | WO-2004/114391 | 12/2004 |
| WO | WO-2009/031377 | 3/2009 |

OTHER PUBLICATIONS

Written Opinion (Application No. PCT/IB2015/051635) Dated Jun. 16, 2015.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al.,"First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05 : Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Peformance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.O et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductors", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

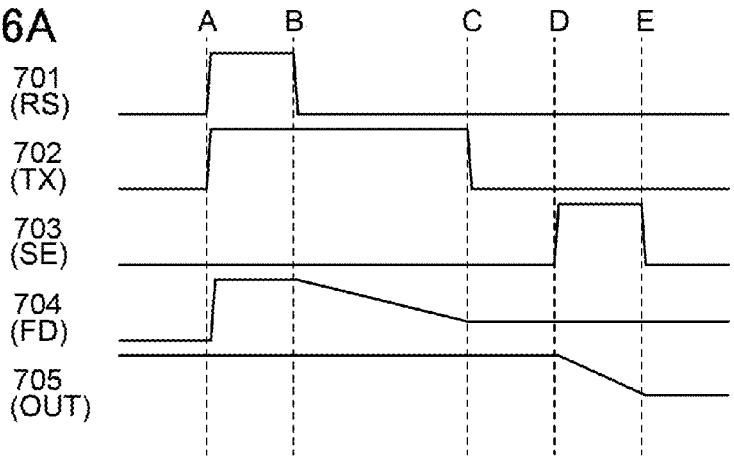
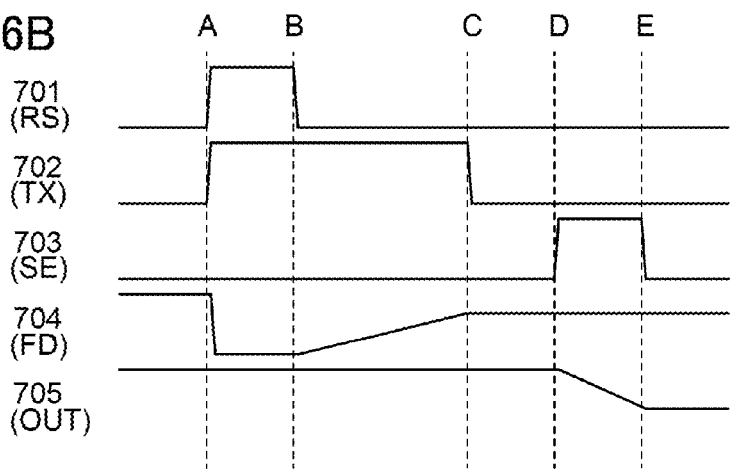
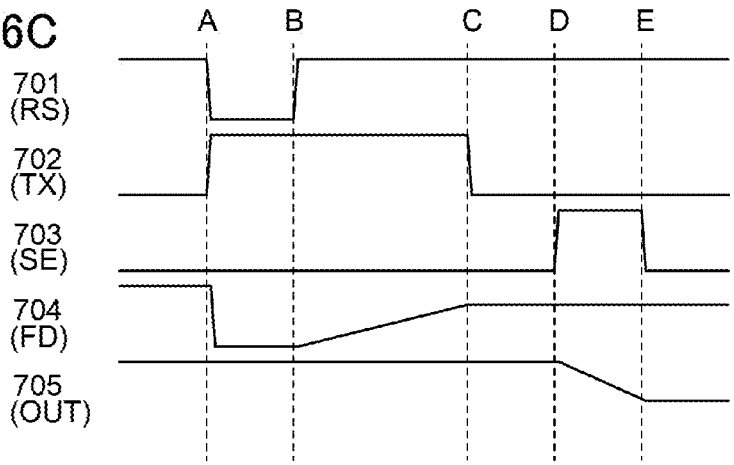

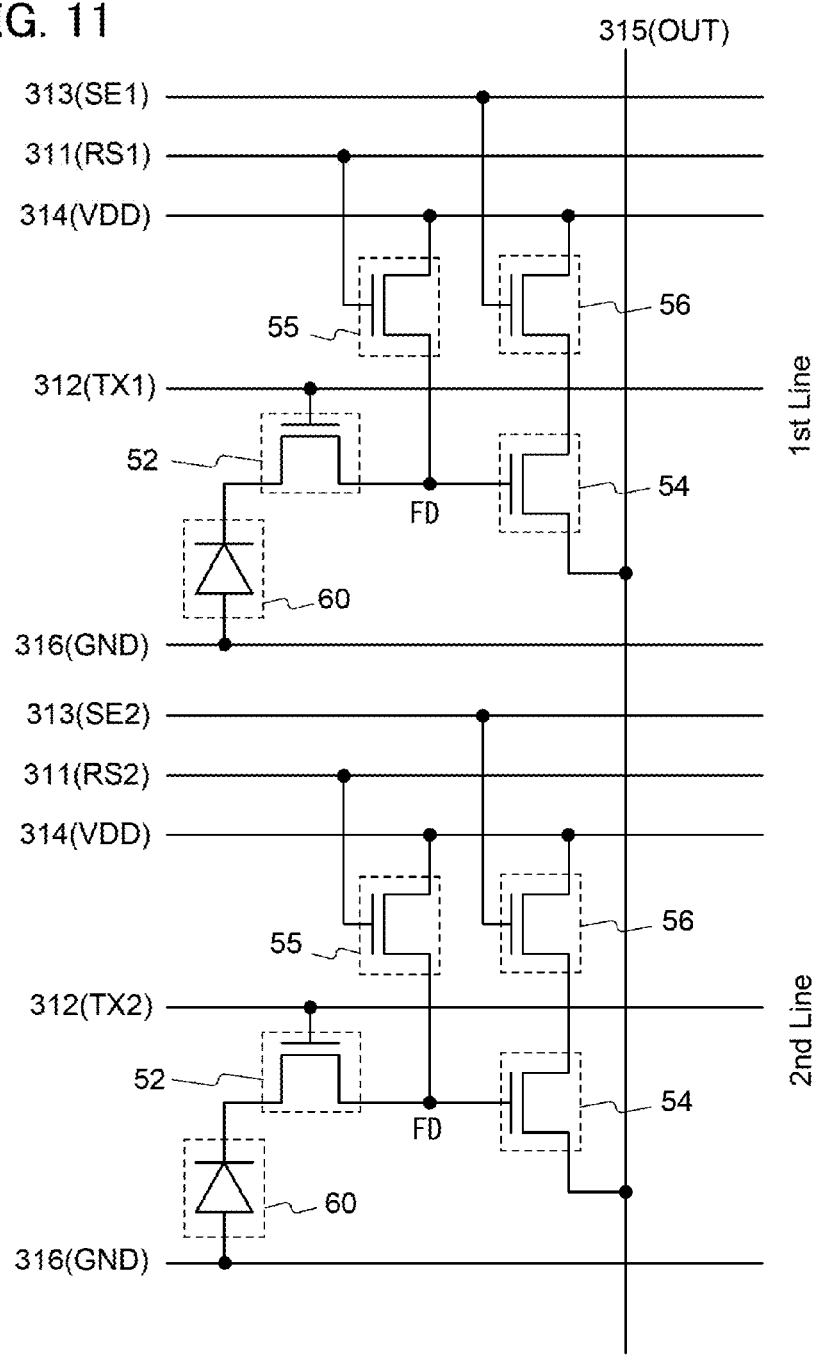

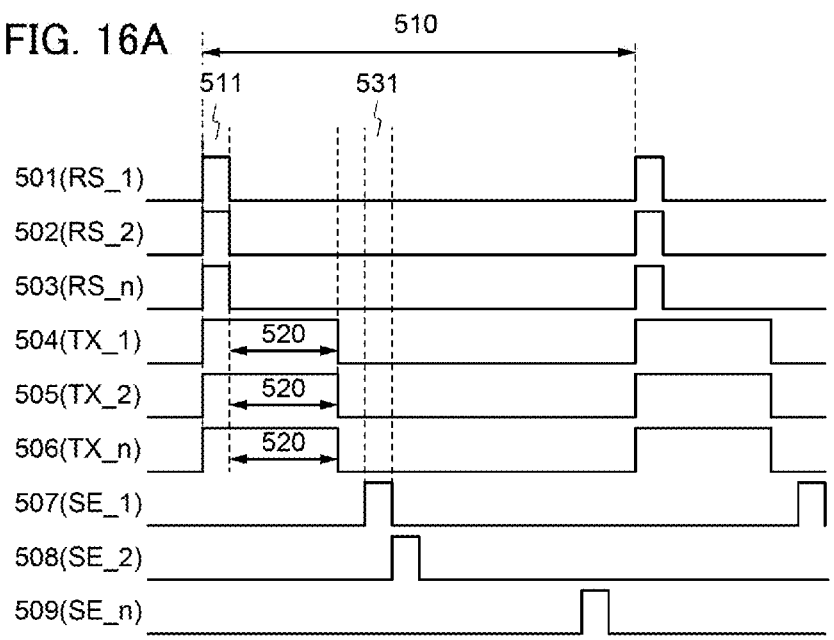
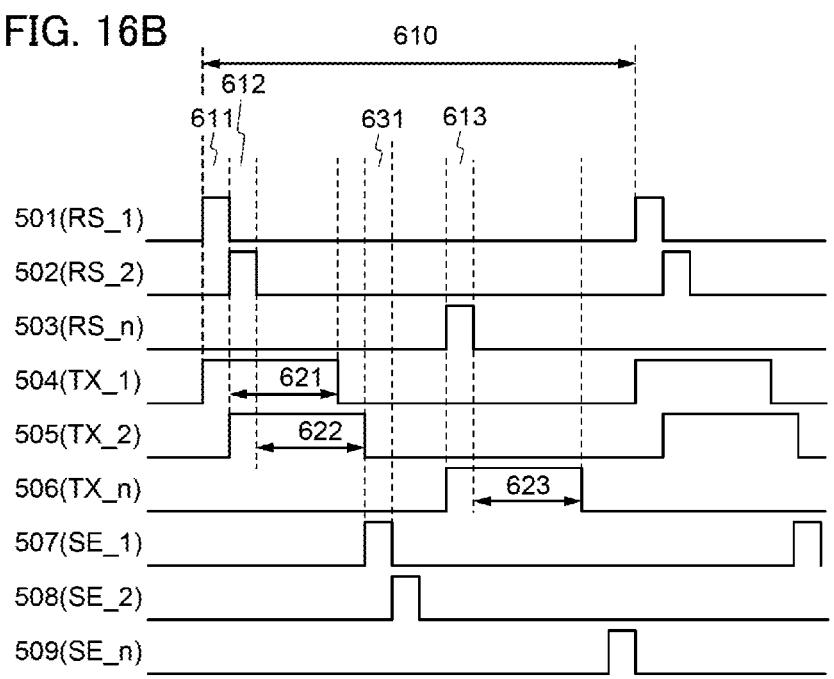

120
173
130a / 130c
130b
130

120
173
130a / 130c
130b
130

FIG. 50A  Initial ($V_OH$)
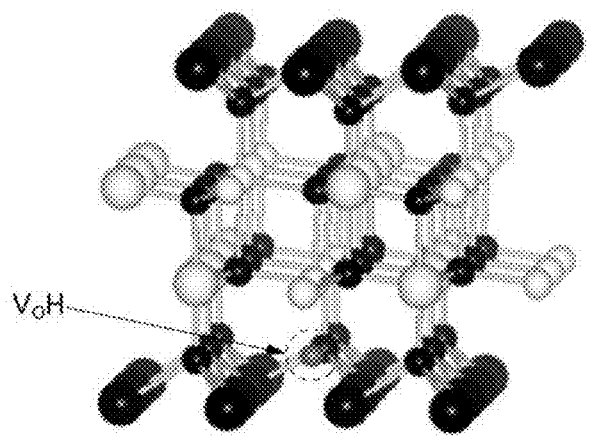
FIG. 50B  Final ($V_O$, H-O)
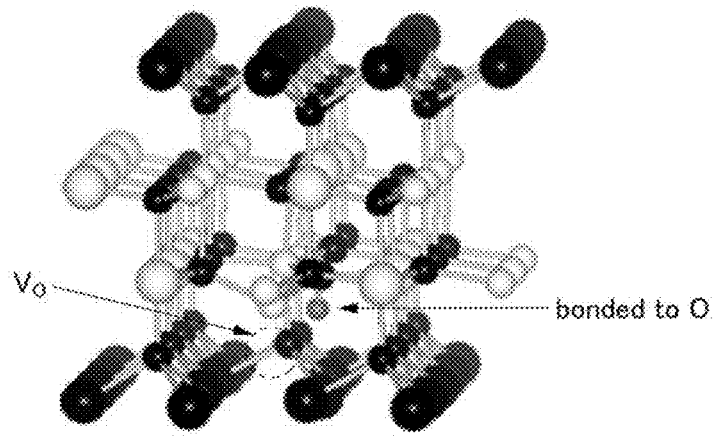

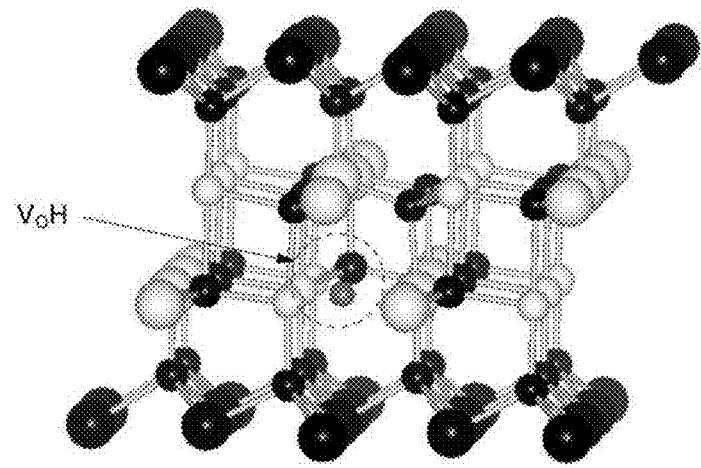
FIG. 52A  Initial (V$_O$H)
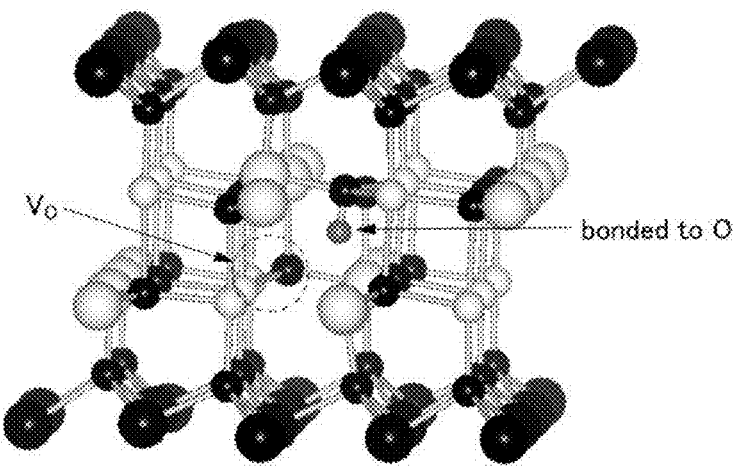
FIG. 52B  Final (V$_O$, H-O)

InGaZnO_4

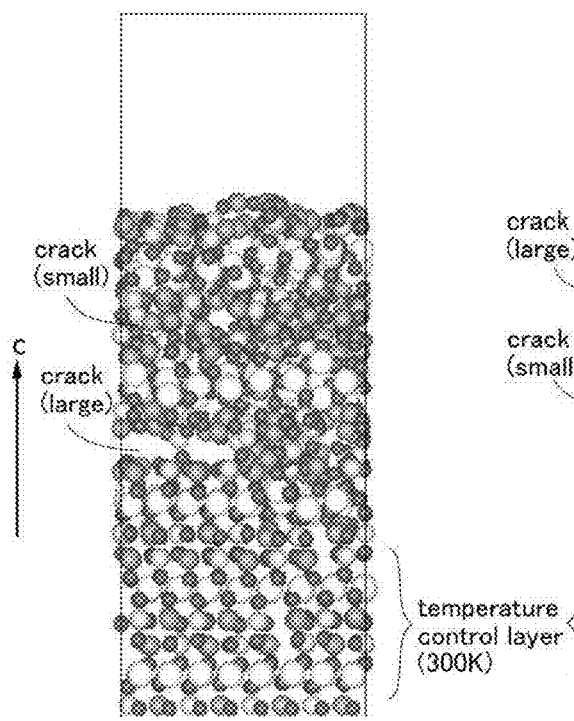
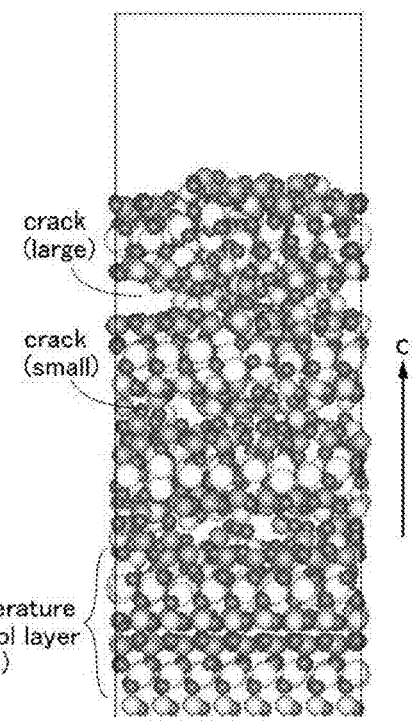

trajectories of atoms
from 0 to 0.3 ps
after the incidence of Ar

Zn, originally in the 3rd layer
(Ga-Zn-O layer), reaches the
vcinity of the 6th layer
Ga-Zn-O layer)

trajectories of atoms
from 0 to 0.3 ps
after the incidence of O

Zn, originally in the 3rd layer
(Ga-Zn-O layer), does not
reach the 5th layer (In-O layer)

CAAC-OS film

Target

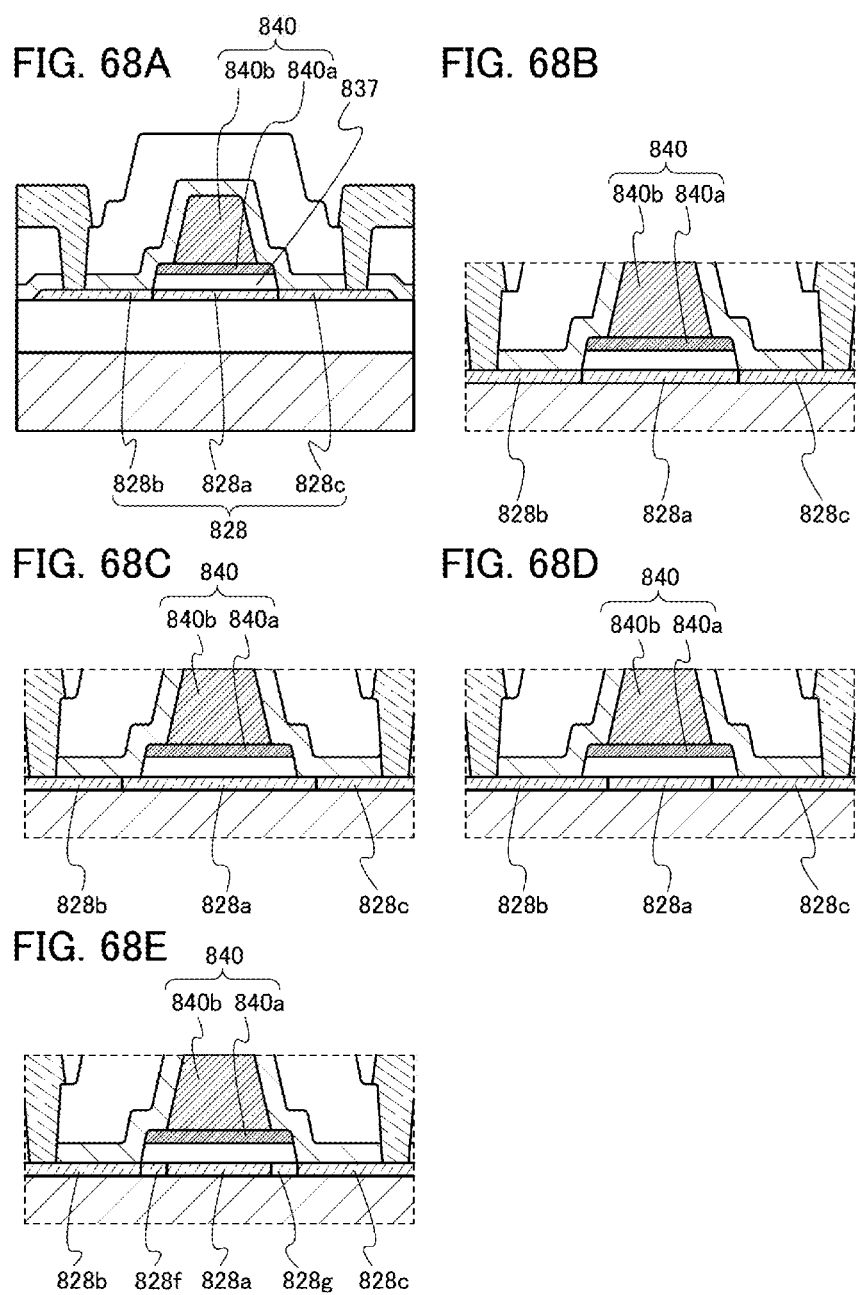

IMAGING DEVICE

TECHNICAL FIELD

One embodiment of the present invention relates to an imaging device including an oxide semiconductor.

Note that one embodiment of the present invention is not limited to the above technical field. The technical field of one embodiment of the invention disclosed in this specification and the like relates to an object, a method, and a manufacturing method. In addition, one embodiment of the present invention relates to a process, a machine, manufacture, and a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

BACKGROUND ART

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films applicable to the transistors, silicon-based semiconductor materials have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

Patent Document 3 discloses that a transistor including an oxide semiconductor and having an extremely low off-state current is used in at least part of a pixel circuit and a transistor including a silicon semiconductor with which a complementary metal oxide semiconductor (CMOS) circuit can be formed is used in a peripheral circuit, whereby an imaging device with high speed operation and low power consumption can be manufactured.

REFERENCE

Patent Documents

[Patent Document 1] Japanese Published Patent Application No. 2007-123861

[Patent Document 2] Japanese Published Patent Application No. 2007-096055

[Patent Document 3] Japanese Published Patent Application No. 2011-119711

DISCLOSURE OF INVENTION

In recent years, silver salt films have been replaced with imaging devices including semiconductor elements in many imaging units. Since use in various environments is assumed, imaging devices are required to have the capability of taking high quality image even in a low illuminance environment and in the case of taking an image of a moving subject. Furthermore, an imaging device which satisfies the requirement and can be formed at a lower cost is expected.

Therefore, an object of one embodiment of the present invention is to provide an imaging device capable of taking an image under a low illuminance condition. Another object is to provide an imaging device with a wide dynamic range. Another object of one embodiment of the present invention is to provide an imaging device with high resolution. Another object of one embodiment of the present invention is to provide a highly integrated imaging device. Another object of one embodiment of the present invention is to provide an imaging device which can be used in a wide temperature range. Another object is to provide an imaging device that is suitable for high-speed operation. Another object of one embodiment of the present invention is to provide an imaging device with low power consumption. Another object of one embodiment of the present invention is to provide an imaging device with a high aperture ratio. Another object of one embodiment of the present invention is to provide an imaging device formed at low cost. Another object of one embodiment of the present invention is to provide an imaging device with high reliability. Another object of one embodiment of the present invention is to provide a novel imaging device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device including a pixel circuit including a transistor formed using an oxide semiconductor, a photoelectric conversion element formed using silicon, and a peripheral circuit including a transistor formed using an oxide semiconductor and a transistor formed using silicon.

One embodiment of the present invention is an imaging device including a first circuit including a first transistor and a second transistor, and a second circuit including a third transistor and a photodiode. The first transistor and the third transistor are each an n-channel transistor including an oxide semiconductor layer as an active layer, and the second transistor is a p-channel transistor including an active region in a silicon substrate. The photodiode is provided in the silicon substrate. A region in which the first transistor and the second transistor overlap each other with an insulating layer positioned between the first transistor and the second transistor is provided, and a region in which the third transistor and the photodiode overlap each other with the insulating layer positioned between the third transistor and the photodiode is provided. The second transistor is provided on a first surface of the silicon substrate. The photodiode has a light-receiving surface that is opposite to the first surface of the silicon substrate.

Another embodiment of the present invention is an imaging device including a first circuit including a first transistor and a second transistor, and a second circuit including a third transistor, a fourth transistor, a fifth transistor, a sixth transistor, and a photodiode. The first transistor and the third to sixth transistors are each an n-channel transistor including an oxide semiconductor layer as an active layer, and the second transistor is a p-channel transistor including an active region in a silicon substrate. One of a source and a drain of the first transistor is electrically connected to one of a source and a drain of the second transistor, and a gate of the first transistor is electrically connected to a gate of the second transistor. One of a source and a drain of the third transistor is electrically connected to one of an anode and a cathode of the photodiode, the other of the source and the drain of the third transistor is electrically connected to one of a source and a drain of the fourth transistor, and the other of the source and the drain of the third transistor is electrically connected to a gate of the fifth transistor. One of a source and a drain of the fifth transistor is electrically connected to one of a source and a drain of the sixth transistor. The photodiode is provided in the silicon substrate. A region in which the first transistor and the second transistor overlap each other with an insulating layer positioned between the first transistor and the second transistor is provided. A region in which the third to sixth transistors and the photodiode overlap each other with the insulating layer positioned between the third to sixth transistor and the photodiode is provided. The second transistor is provided on a first surface of the silicon substrate. The photodiode has a light-receiving surface that is opposite to the first surface of the silicon substrate.

The oxide semiconductor layer preferably includes In, Zn, and M (M is Al, Ti, Ga, Y, Zr, La, Ce, Nd, or Hf).

Furthermore, the plane orientation of a crystal in the first surface of the silicon substrate is preferably (110).

According to one embodiment of the present invention, an imaging device capable of taking images under low illuminance can be provided. An imaging device with a wide dynamic range can be provided. An imaging device with high resolution can be provided. A highly integrated imaging device can be provided. An imaging device which can be used in a wide temperature range can be provided. An imaging device that is suitable for high-speed operation can be provided. An imaging device with low power consumption can be provided. An imaging device with a high aperture ratio can be provided. An imaging device which is formed at low cost can be provided. An imaging device with high reliability can be provided. A novel imaging device can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF DRAWINGS

FIGS. 6A to 6C are timing charts showing the operation of a pixel circuit.

FIG. 11 illustrates a configuration of a pixel circuit.

FIGS. 16A and 16B are timing charts illustrating the operations in a global shutter system and a rolling shutter system, respectively.

FIGS. 50A and 50B show an initial state and a final state, respectively.

FIGS. 52A and 52B show an initial state and a final state, respectively.

FIGS. 62A and 62B illustrate a structure of $InGaZnO_4$ and others after an atom collides.

FIGS. 68A to 68E are each a cross-sectional view illustrating a transistor.

BEST MODE FOR CARRYING OUT THE INVENTION

Figure 1A:
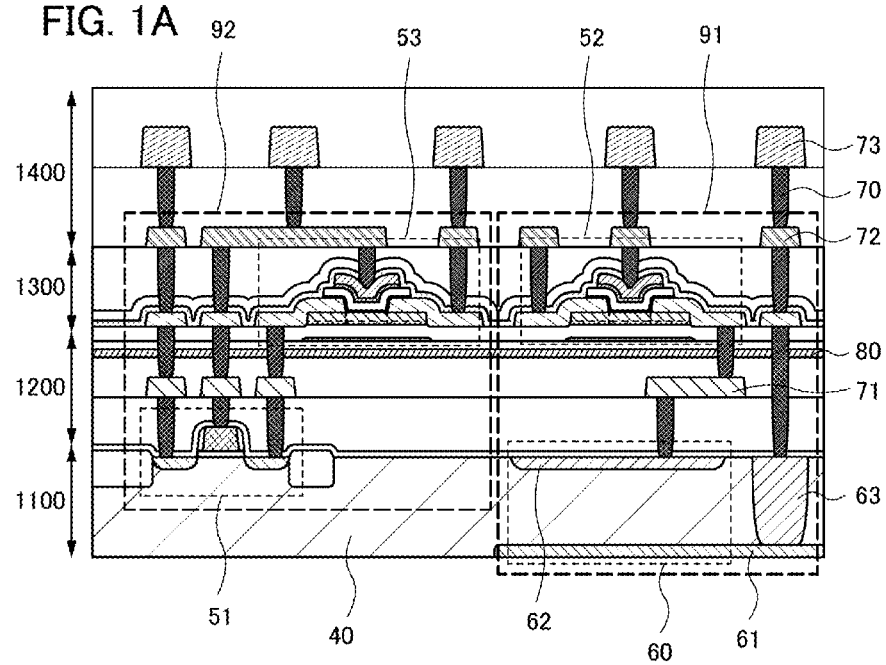
FIGS. 1A to 1C are a cross-sectional view and circuit diagrams illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a line, an electrode, a terminal, a conductive film, and a layer). Accordingly, another element may be interposed between elements having a connection relation shown in drawings and texts, without limiting to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, and a gamma correction circuit; a potential level converter circuit such as a power supply circuit (e.g., a DC-DC converter, a step-up DC-DC converter, and a step-down DC-DC converter) or a level shifter circuit for changing the potential level of a signal; a voltage source; a current source; a switching circuit; an amplifier circuit such as a circuit that can increase signal amplitude, the amount of current, and the like, an operational amplifier, a differential amplifier circuit, a source follower circuit, or a buffer circuit; a signal generator circuit; a memory circuit; and a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit positioned therebetween), the case where X and Y are functionally connected (i.e., the case where X and Y are functionally connected with another circuit positioned therebetween), and the case where X and Y are directly connected (i.e., the case where X and Y are connected without another element or another circuit positioned therebetween) are included therein. That is, the explicit expression "X and Y are electrically connected" is the same as the explicit simple expression "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that, for example, the case where a source (a first terminal) of a transistor is electrically connected to X through (or not through) Z1 and a drain (a second terminal) of the transistor is electrically connected to Y through (or not through) Z2, or the case where a source (a first terminal) of a transistor is directly connected to part of Z1 and another part of Z1 is directly connected to X while a drain (a second terminal) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that in this specification and the like, a transistor can be formed using any of a variety of substrates, for example. The type of a substrate is not limited to a certain type. As the substrate, a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), and acrylic can be used, for example. For an attachment film, polypropylene, polyester, polyvinyl fluoride, polyvinyl chloride, and the like can be used, for example. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film such as a polyimide film formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

Embodiment 1

In this embodiment, an imaging device that is one embodiment of the present invention is described with reference to drawings.

FIG. 1A is a cross-sectional view illustrating the structure of the imaging device of one embodiment of the present invention. The imaging device in FIG. 1A includes a transistor 51 including an active region in a silicon substrate 40, transistors 52 and 53 each including an oxide semiconductor layer as an active layer, and a photodiode 60 provided in the silicon substrate 40. The transistors and the photodiode 60 are electrically connected to contact plugs 70 and wiring layers 71. In addition, an anode 61 of the photodiode 60 is electrically connected to the contact plug 70 through a low-resistance region 63.

The imaging device has a stacked-layer structure and includes a first layer 1100 including the transistor 51 provided on the silicon substrate 40 and the photodiode 60 provided in the silicon substrate 40, a second layer 1200 which is in contact with the first layer 1100 and includes the wiring layers 71, a third layer 1300 which is in contact with the second layer 1200 and includes the transistors 52 and 53, and a fourth layer 1400 which is in contact with the third layer 1300 and includes wiring layers 72 and wiring layers 73. Note that the silicon substrate 40 is not limited to a bulk silicon substrate and may be an SOI substrate. Furthermore, the silicon substrate 40 can be replaced with a substrate made of germanium, silicon germanium, silicon carbide, gallium arsenide, aluminum gallium arsenide, indium phosphide, gallium nitride, or an organic semiconductor.

An insulating layer 80 is provided between the first layer 1100 including the transistor 51 and the photodiode 60 and the third layer 1300 including the transistors 52 and 53 although there is no limitation on its specific position.

Hydrogen in an insulating layer provided in the vicinity of the active region of the transistor 51 terminates dangling bonds of silicon; accordingly, the reliability of the transistor 51 can be improved. Meanwhile, hydrogen in an insulating layer provided in the vicinity of the oxide semiconductor layers, which are the active layers, of the transistor 52, the transistor 53, and the like provided in an upper portion becomes a factor of generating carriers in the oxide semiconductor layer; thus, the reliability of the transistor 52, the transistor 53, and the like might be decreased. Therefore, in the case where the transistor using an oxide semiconductor is provided over the transistor using a silicon-based semiconductor material, it is preferable that the insulating layer 80 having a function of preventing diffusion of hydrogen be provided between the transistors. The insulating layer 80 makes hydrogen remain in the lower portion, thereby improving the reliability of the transistor 51. In addition, since the insulating layer 80 prevents diffusion of hydrogen from the lower portion to the upper portion, the reliability of the transistors 52 and 53 also can be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The transistor 52 and the photodiode 60 form a circuit 91, and the transistor 51 and the transistor 53 form a circuit 92. The circuit 91 can function as a pixel circuit, and the circuit 92 can function as a driver circuit for driving the circuit 91.

Figure 1B:
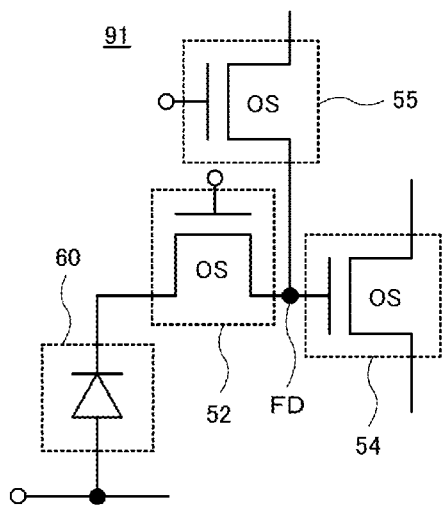

The circuit 91 can have a configuration shown in a circuit diagram of FIG. 1B. One of a source and a drain of the transistor 52 is electrically connected to a cathode 62 of the photodiode 60; and the other of the source and the drain of the transistor 52, a gate of a transistor 54 (not illustrated in FIG. 1A), one of a source and a drain of a transistor 55 (not illustrated in FIG. 1A) are electrically connected to a charge storage portion (FD).

Here, the transistor 52 can serve as a transfer transistor for controlling the potential of the charge storage portion (FD) in response to output of the photodiode 60. The transistor 54 can serve as an amplifying transistor configured to output a signal corresponding to the potential of the charge storage portion (FD). The transistor 55 can serve as a reset transistor for initializing the potential of the charge storage portion (FD).

Figure 1C:
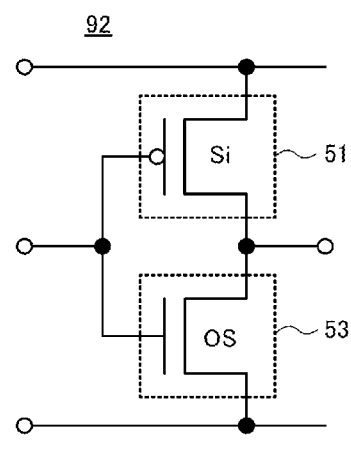

The circuit 92 may include a CMOS inverter shown in a circuit diagram of FIG. 1C, for example. A gate of the transistor 51 is electrically connected to a gate of the transistor 53. One of a source and a drain of one transistor is electrically connected to one of a source and a drain of the other transistor. The other of the source and the drain of the one transistor is electrically connected to a wiring and the other of the source and the drain of the other transistor is electrically connected to another wiring. In other words, the transistor including the active region in the silicon substrate and the transistor including the oxide semiconductor layer as the active layer form the CMOS circuit. Note that in FIGS. 1B and 1C, a transistor whose active layer is preferably formed using an oxide semiconductor is denoted by a symbol "OS", and a transistor that preferably includes an active region in the silicon substrate is denoted by a symbol "Si".

In the imaging device, the transistor 51 including the active region in the silicon substrate 40 is a p-channel transistor, and the transistors 52 to 55 each including the oxide semiconductor layer as the active layer are n-channel transistors.

All the transistors included in the circuit 91 are formed in the third layer 1300, in which a structure making electrical connection therebetween can be simplified, resulting in a simplified manufacturing process.

Extremely low off-state current characteristics of the transistor including an oxide semiconductor can widen the dynamic range of imaging. In the circuit shown in FIG. 1B, an increase in the intensity of light entering the photodiode 60 reduces the potential of the charge storage portion (FD). Since the transistor including an oxide semiconductor has an extremely small off-state current, a current corresponding to the gate potential can be accurately output even when the gate potential is extremely low. Thus, it is possible to widen the detection range of illuminance, i.e., the dynamic range.

Since a period during which charge can be retained in the charge storage portion (FD) can be extremely long owing to the low off-state current characteristics of the transistors 52 and 55, a global shutter system can be used without a complicated circuit configuration and operation method, and thus, an image with little distortion can be easily obtained even in the case of a moving object. Furthermore, for the same reason, exposure time (a period for conducting charge accumulation operation) can be long; thus, the imaging device is suitable for imaging even in a low illuminance environment.

In addition, the transistor including an oxide semiconductor has lower temperature dependence of change in electrical characteristics than the transistor including silicon, and thus can be used at an extremely wide range of temperatures. Therefore, an imaging device and a semiconductor device which include transistors formed using an oxide semiconductor are suitable for use in automobiles, aircrafts, and spacecrafts.

In the circuit 91, the photodiode 60 provided in the first layer 1100 and the transistor 52 provided in the third layer 1300 can be formed to overlap each other; thus, the integration degree of pixels can be increased. In other words, the resolution of the imaging device can be increased. Furthermore, since no transistor is formed in the occupation area of the circuit 91 in the silicon substrate, the area of the photodiode can be large, and thus an image with little noise can be obtained.

Formation of the circuit 92 does not require a process for forming an n-channel transistor including an active region in the silicon substrate 40; therefore, steps of forming a p-type well, an n-type impurity region, and the like can be omitted and the number of steps can be drastically reduced. Moreover, the n-channel transistor needed for the CMOS circuit can be formed at the same time as the transistors included in the circuit 91.

In the imaging device in FIGS. 1A to 1C, a surface of the silicon substrate 40 opposite to a surface where the transistor 51 is formed includes a light-receiving surface of the photodiode 60. Therefore, an optical path can be secured without being influenced by the transistors or wirings, and therefore, a pixel with a high aperture ratio can be formed. Note that the light-receiving surface can be the same as the surface where the transistor 51 is formed.

Figure 2A:
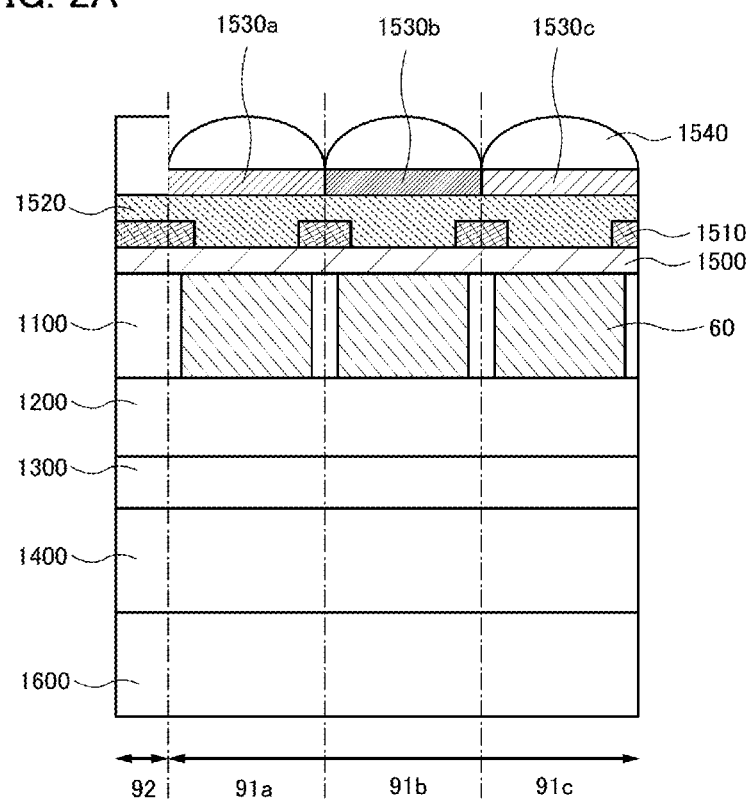
FIGS. 2A and 2B are cross-sectional views of imaging devices.

FIG. 2A is a cross-sectional view of an example of a mode in which a color filter and the like are added to the imaging device in FIG. 1A, illustrating three pixel regions (circuits 91a, 91b, and 91c) in the circuit 91 and part of the circuit 92. An insulating layer 1500 is formed over the photodiode 60 provided in the first layer 1100. As the insulating layer 1500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 1510 is formed over the insulating layer 1500. The light-blocking layer 1510 has a function of inhibiting color mixing of light passing through the color filter. Furthermore, the light-blocking layer 1510 over the circuit 92 also has a function of inhibiting a change in characteristics of the transistor including the active region in the silicon substrate 40 due to light irradiation. The light-blocking layer 1510 can be formed of a metal layer of aluminum, tungsten, or the like, or a stack including the metal layer and a dielectric film functioning as an anti-reflection film.

An organic resin layer 1520 is formed as a planarization film over the insulating layer 1500 and the light-blocking layer 1510. A color filter 1530a, a color filter 1530b, and a color filter 1530c are formed over the circuit 91a, the circuit 91b, and the circuit 91c to be paired up with the circuit 91a, the circuit 91b, and the circuit 91c, respectively. The color filter 1530a, the color filter 1530b, and the color filter 1530c have colors of R (red), G (green), and B (blue), whereby a color image can be obtained.

A microlens array 1540 is provided over the color filters 1530a, 1530b, and 1530c so that light penetrating a lens goes through the color filter positioned therebelow to reach the photodiode.

A supporting substrate 1600 is provided in contact with the fourth layer 1400. As the supporting substrate 1600, a hard substrate such as a semiconductor substrate (e.g., a silicon substrate), a glass substrate, a metal substrate, or a ceramic substrate can be used. Note that an inorganic insulating layer or an organic resin layer may be between the fourth layer 1400 and the supporting substrate 1600.

The circuits 91 and 92 may be connected to a power supply circuit, a controlling circuit, or the like provided on the outside with the wiring layer 72 or the wiring layer 73 in the fourth layer.

Figure 2B:
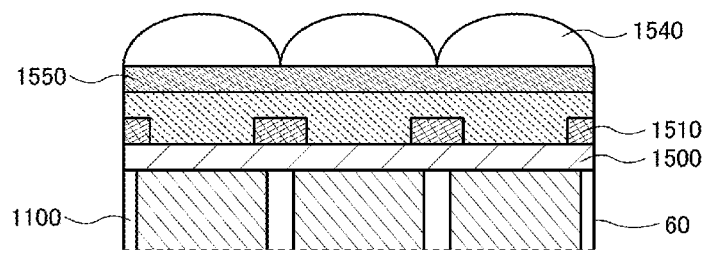

In the structure of the imaging device, when an optical conversion layer 1550 (see FIG. 2B) is used instead of the color filters 1530a, 1530b, and 1530c, the imaging device can take images in various wavelength regions.

For example, when a filter which blocks light having a wavelength shorter than or equal to that of visible light is used as the optical conversion layer 1550, an infrared imaging device can be obtained. When a filter which blocks light having a wavelength shorter than or equal to that of near infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained.

Furthermore, when a scintillator is used as the optical conversion layer 1550, an imaging device which takes an image visualizing the intensity of radiation, such as a medical X-ray imaging device, can be obtained. Radiation such as X-rays passes through a subject to enter a scintillator, and then is converted into light (fluorescence) such as visible light or ultraviolet light owing to a phenomenon known as photoluminescence. Then, the photodiode 60 detects the light to obtain image data.

A scintillator is formed of a substance that, when irradiated with radial rays such as X-rays or gamma-rays, absorbs energy of the radial rays to emit visible light or ultraviolet light or a material containing the substance. For example, materials such as $Gd_2O_2S:Tb$, $Gd_2O_2S:Pr$, $Gd_2O_2S:Eu$, BaF-Cl:Eu, NaI, CsI, $CaF_2$, $BaF_2$, $CeF_3$, LiF, LiI, and ZnO and a resin or ceramics in which any of the materials is dispersed are known.

Figure 3:
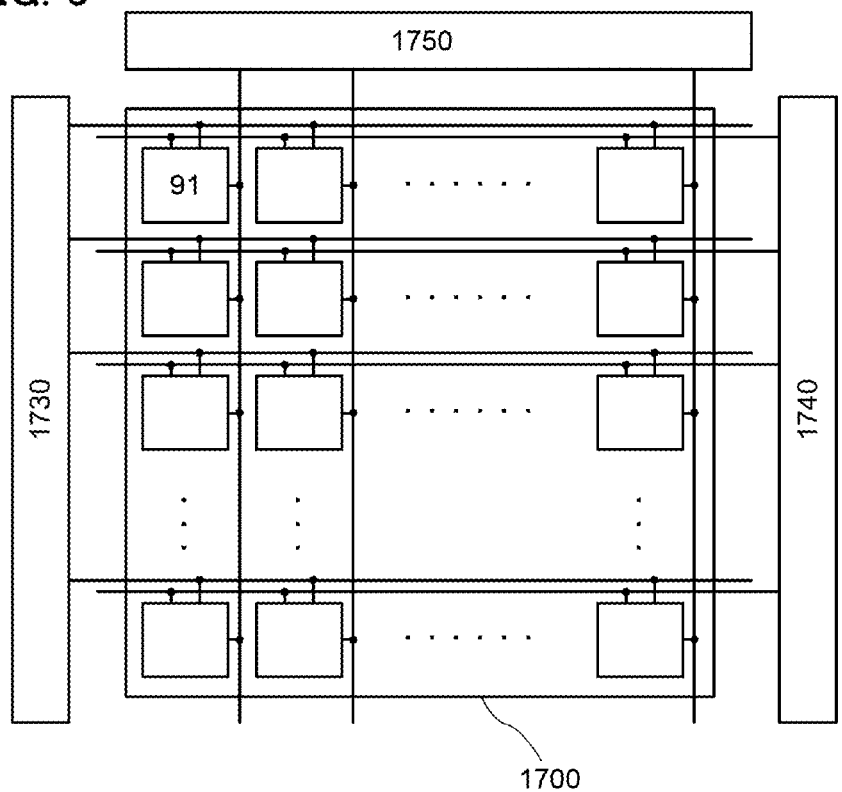
FIG. 3 illustrates the structure of an imaging device.

FIG. 3 is a schematic view illustrating the configuration of the imaging device. A circuit 1730 and a circuit 1740 are provided on the sides of a pixel matrix 1700 including the circuit 91. The circuit 1730 can function as a reset terminal driver circuit, for example. In this case, the circuit 1730 is electrically connected to the transistor 55 in FIG. 1B. The circuit 1740 can serve as a transfer terminal driver circuit, for example. In this case, the circuit 1740 is electrically connected to the transistor 52 in FIG. 1B. Note that although the circuit 1730 and the circuit 1740 are positioned at the facing sides of the pixel matrix 1700 in FIG. 3, the circuit 1730 and the circuit 1740 may be positioned on one side of the pixel matrix 1700.

In addition, a circuit 1750 is provided on another side of the pixel matrix 1700 where neither the circuit 1730 nor the circuit 1740 is provided. The circuit 1750 can serve as a vertical output line driver circuit, for example. In this case, the circuit 1750 is electrically connected to the transistor 54 in FIG. 1B.

Figure 4A:
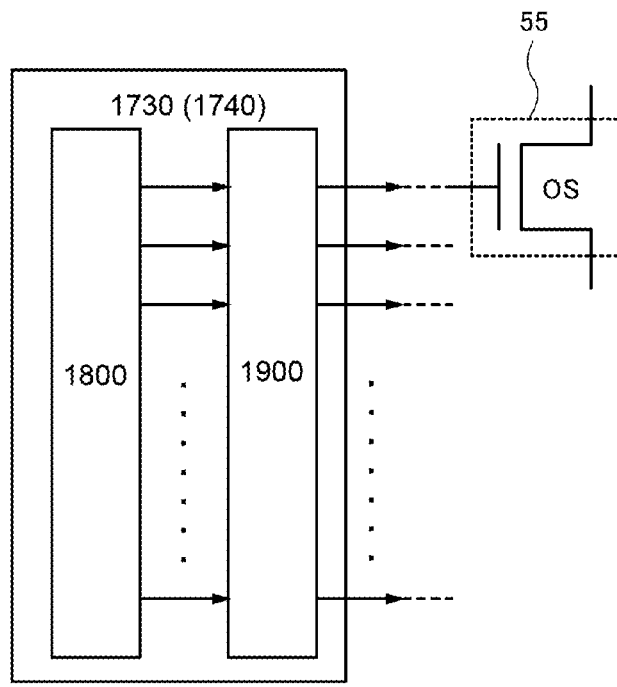
FIGS. 4A and 4B illustrate the structure of driver circuits of an imaging device.

The reset terminal driver circuit and the transfer terminal driver circuit are each a driver circuit that outputs signals having binary values of high level and low level, and their operations can be conducted with a combination of a shift register 1800 and a buffer circuit 1900 as illustrated in FIG. 4A.

Figure 4B:
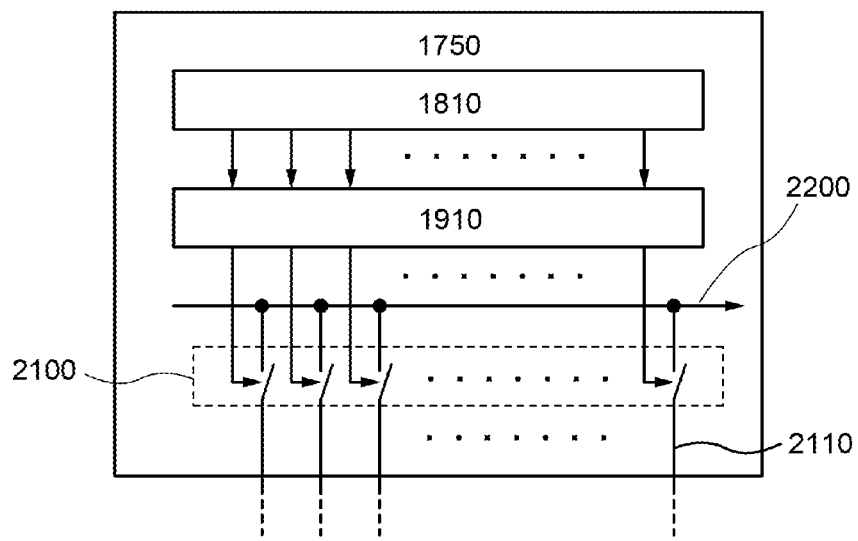

The vertical output line driver circuit can include a shift register 1810, a buffer circuit 1910, and analog switches 2100, as illustrated in FIG. 4B. Vertical output lines 2110 are selected with the analog switches 2100, and the potentials of the selected output lines are output to an image output line 2200. The analog switches 2100 are sequentially selected by the shift register 1810 and the buffer circuit 1910.

In one embodiment of the present invention, one or more of the circuit 1730, the circuit 1740, and the circuit 1750 include the circuit 92. That is, one or more of the shift register 1800, the buffer circuit 1900, the shift register 1810, the buffer circuit 1910, and the analog switches 2100 include a CMOS circuit including a p-channel transistor including an active region in a silicon substrate and an n-channel transistor including an oxide semiconductor layer as an active layer.

This embodiment can be implemented in an appropriate combination with any of the structures described in the other embodiments.

Embodiment 2

In this embodiment, the circuit 91 described in Embodiment 1 is described.

Figure 5A:
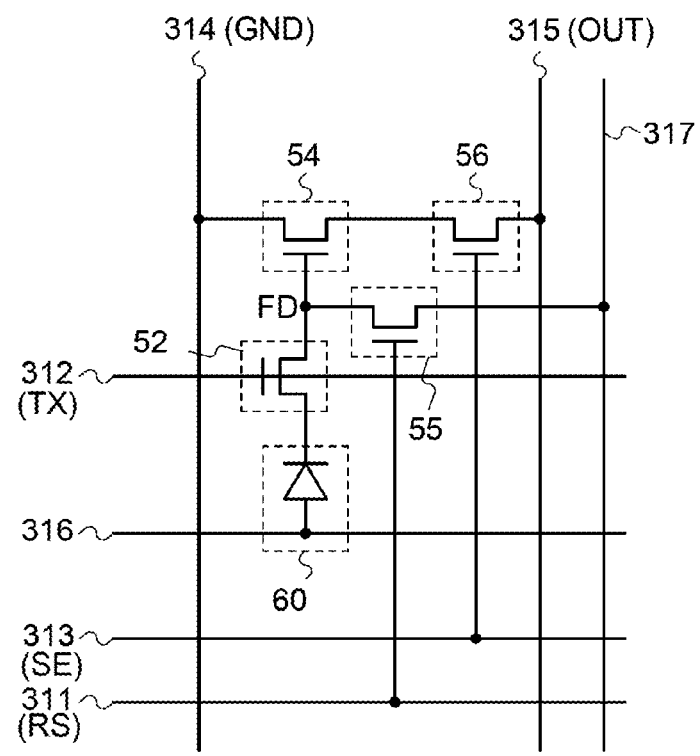
FIGS. 5A and 5B each illustrate a configuration of a pixel circuit.

FIG. 5A shows details of connections between the circuit 91 in FIG. 1B and a variety of wirings. The circuit in FIG. 5A includes the photodiode 60, the transistor 52, the transistor 54, and the transistor 55.

The anode of the photodiode 60 is electrically connected to a wiring 316; the cathode of the photodiode 60 is electrically connected to one of the source and the drain of the transistor 52; the other of the source and the drain of the transistor 52 is electrically connected to the charge storage portion (FD); a gate of the transistor 52 is electrically connected to a wiring 312 (TX); one of a source and a drain of the transistor 54 is electrically connected to a wiring 314 (GND); the other of the source and the drain of the transistor 54 is electrically connected to one of a source and a drain of a transistor 56; the gate of the transistor 54 is electrically connected to the charge storage portion (FD); one of the source and the drain of the transistor 55 is electrically connected to the charge storage portion (FD); the other of the source and the drain of the transistor 55 is electrically connected to a wiring 317; a gate of the transistor 55 is electrically connected to a wiring 311 (RS); the other of the source and the drain of the transistor 56 is electrically connected to a wiring 315 (OUT); and a gate of the transistor 56 is electrically connected to a wiring 313 (SE).

A potential such as GND, VSS, or VDD may be supplied to the wiring 314. Here, a potential or a voltage has a relative value. Therefore, the potential GND is not necessarily 0 V.

The photodiode 60 is a light-receiving element and generates current corresponding to the amount of light incident on the pixel circuit. The transistor 52 controls supply of charge from the photodiode 60 to the charge storage portion (FD) performed by the photodiode 60. The transistor 54 outputs a signal which corresponds to the potential of the charge storage portion (FD). The transistor 55 executes an operation of resetting the potential of the charge storage portion (FD). The transistor 56 executes an operation of controlling selection of the pixel circuit at the time of reading.

Note that the charge storage portion (FD) is a charge retention node and retains charge that is changed depending on the amount of light received by the photodiode 60.

Note that the transistor 54 and the transistor 56 only need to be connected in series between the wiring 315 and the wiring 314. Hence, the wiring 314, the transistor 54, the transistor 56, and the wiring 315 may be arranged in order, or the wiring 314, the transistor 56, the transistor 54, and the wiring 315 may be arranged in order.

The wiring 311 (RS) is a signal line for controlling the transistor 55. The wiring 312 (TX) is a signal line for controlling the transistor 52. The wiring 313 (SE) is a signal line for controlling the transistor 56. The wiring 314 (GND) is a signal line for supplying a reference potential (e.g., GND). The wiring 315 (OUT) is a signal line for reading a signal output from the transistor 54. The wiring 316 is a signal line for outputting charge from the charge storage portion (FD) through the photodiode 60 and is a low-potential line in the circuit in FIG. 5A. The wiring 317 is a signal line for resetting the potential of the charge storage portion (FD) and is a high-potential line in the circuit in FIG. 5A.

Figure 5B:
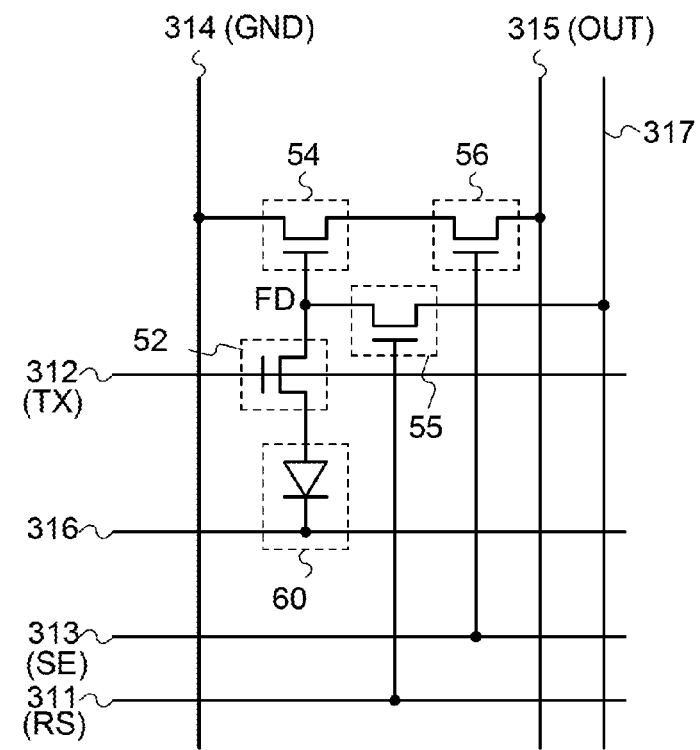

The circuit 91 may have a configuration illustrated in FIG. 5B. The circuit illustrated in FIG. 5B includes the same components as those in the circuit in FIG. 5A but is different from the circuit in that the anode of the photodiode 60 is electrically connected to one of the source and the drain of the transistor 52 and the cathode of the photodiode 60 is electrically connected to the wiring 316.

Next, a structure of each component illustrated in FIGS. 5A and 5B is described.

An element formed using a silicon substrate with a pn junction or a pin junction can be used as the photodiode 60, for example.

Although a silicon semiconductor such as amorphous silicon, microcrystalline silicon, polycrystalline silicon, or single crystal silicon can be used to form the transistor 52, the transistor 54, the transistor 55, and the transistor 56, an oxide semiconductor is preferably used to form the transistors. A transistor in which a channel formation region is formed of an oxide semiconductor has an extremely low off-state current.

In particular, when the transistors 52 and 55 connected to the charge storage portion (FD) has a high leakage current, charge accumulated in the charge storage portion (FD) cannot be retained for a sufficiently long time. The use of an oxide semiconductor for the transistors 52 and 55 prevents unwanted output of charge from the charge storage portion (FD).

Unwanted output of charge also occurs in the wiring 314 or the wiring 315 when the transistor 54 and the transistor 56 have a large leakage current; thus, transistors in which a channel formation region is formed of an oxide semiconductor are preferably used as these transistors.

An example of the operation of the circuit in FIG. 5A is described using a timing chart shown in FIG. 6A.

In FIG. 6A, a potential of each wiring is denoted as a signal which varies between two levels for simplicity. Note that because each potential is an analog signal, the potential can, in practice, have various levels in accordance with situations without limitation on two levels. In the drawing, a signal 701 corresponds to the potential of the wiring 311 (RS); a signal 702, the potential of the wiring 312 (TX); a signal 703, the potential of the wiring 313 (SE); a signal 704, the potential of the charge storage portion (FD); and a signal 705, the potential of the wiring 315 (OUT). Note that the potential of the wiring 316 is always at low level, and the potential of the wiring 317 is always at high level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (high level), and reset operation is started. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photodiode 60, whereby the potential of the charge storage portion (FD) (signal 704) starts to decrease due to a reverse current. Since irradiation of the photodiode 60 with light increases the reverse current, the rate of decrease in the potential of the charge storage portion (FD) (signal 704) changes depending on the amount of the light irradiation. In other words, channel resistance between the source and the drain of the transistor 54 changes depending on the amount of light emitted to the photodiode 60.

At time C, the potential of the wiring 312 (signal 702) is set to low level to terminate the accumulation operation, so that the potential of the charge storage portion (FD) (signal 704) becomes constant. Here, the potential is determined by the amount of electrical charge generated by the photodiode 60 during the accumulation operation. That is, the potential changes depending on the amount of light emitted to the photodiode 60. Furthermore, since the transistor 52 and the transistor 55 are each a transistor which includes a channel formation region formed of an oxide semiconductor layer and which has an extremely small off-state current, the potential of the charge storage portion (FD) can be kept constant until a subsequent selection operation (read operation) is performed.

Note that when the potential of the wiring 312 (signal 702) is set at low level, the potential of the charge storage portion (FD) might change owing to parasitic capacitance between the wiring 312 and the charge storage portion (FD). In the case where this potential change is large, the amount of electrical charge generated by the photodiode 60 during the accumulation operation cannot be obtained accurately. Examples of effective measures to reduce the amount of change in the potential include reducing the capacitance between the gate and the source (or between the gate and the drain) of the transistor 52, increasing the gate capacitance of the transistor 54, and providing a storage capacitor to connect the charge storage portion (FD). Note that in this embodiment, the change in the potential can be ignored by the adoption of these measures.

At time D, the potential of the wiring 313 (signal 703) is set at high level to turn on the transistor 56, whereby selection operation starts and the wiring 314 and the wiring 315 are electrically connected to each other through the transistor 54 and the transistor 56. Also, the potential of the wiring 315 (signal 705) starts to decrease. Note that precharge of the wiring 315 is terminated before the time D. Here, the rate at which the potential of the wiring 315 (signal 705) decreases depends on the current between the source and the drain of the transistor 54. That is, the potential of the wiring 315 (signal 705) changes depending on the amount of light emitted to the photodiode 60 during the accumulation operation.

At time E, the potential of the wiring 313 (signal 703) is set at low level to turn off the transistor 56, so that the selection operation is terminated and the potential of the wiring 315 (signal 705) becomes a constant value. Here, the constant value changes depending on the amount of light emitted to the photodiode 60. Therefore, the amount of light emitted to the photodiode 60 during the accumulation operation can be determined by measuring the potential of the wiring 315.

Specifically, when the photodiode 60 is irradiated with light with high intensity, the potential of the charge storage portion (FD), that is, the gate voltage of the transistor 54 is low. Therefore, current flowing between the source and the drain of the transistor 54 becomes small; as a result, the potential of the wiring 315 (signal 705) is gradually lowered. Thus, a relatively high potential can be read from the wiring 315.

In contrast, when the photodiode 60 is irradiated with light with low intensity, the potential of the charge storage portion (FD), that is, the gate voltage of the transistor 54 is high. Therefore, the current flowing between the source and the drain of the transistor 54 becomes large; thus, the potential of the wiring 315 (signal 705) rapidly decreases. Thus, a relatively low potential can be read from the wiring 315.

Next, an example of the operation of the circuit in FIG. 5B is described with reference to a timing chart in FIG. 6B. Note that the wiring 316 is always at high level, and the potential of the wiring 317 is always at low level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (low level), and reset operation is started. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photodiode 60, whereby the potential of the charge storage portion (FD) (signal 704) starts to increase due to a reverse current.

The description of the timing chart of FIG. 6A can be referred to for operations at and after the time C. The amount of light emitted to the photodiode 60 during the accumulation operation can be determined by measuring the potential of the wiring 315 at time E.

Figure 7A:
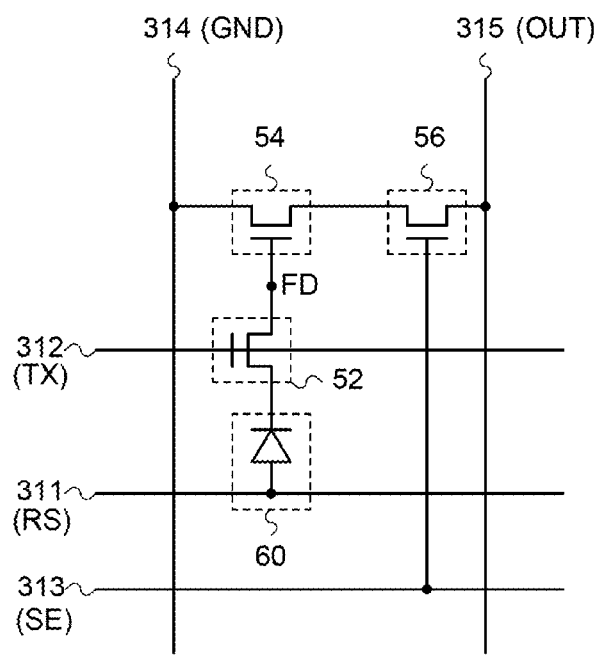
FIGS. 7A and 7B each illustrate a configuration of a pixel circuit.
Figure 7B:
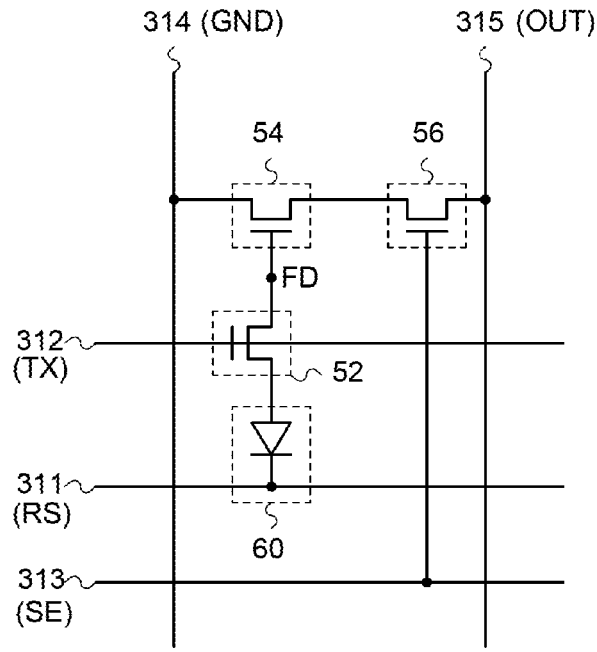

The circuit 91 may have any of configurations illustrated in FIGS. 7A and 7B.

The configuration of a circuit in FIG. 7A is different from that of the circuit in FIG. 5A in that the transistor 55, the wiring 316, and the wiring 317 are not provided, and the wiring 311 (RS) is electrically connected to the anode of the photodiode 60. The other structures are the same as those in the circuit FIG. 5A.

The circuit in FIG. 7B includes the same components as those in the circuit in FIG. 7A but is different from the circuit in that the anode of the photodiode 60 is electrically connected to one of the source and the drain of the transistor 52 and the cathode of the photodiode 60 is electrically connected to the wiring 311 (RS).

Like the circuit in FIG. 5A, the circuit in FIG. 7A can be operated in accordance with the timing chart shown in FIG. 6A.

At time A, the potential of the wiring 311 (signal 701) is set at high level and the potential of the wiring 312 (signal 702) is set at high level, whereby a forward bias is applied to the photodiode 60 and the potential of the charge storage portion (FD) (signal 704) is set at high level. In other words, the potential of the charge storage portion (FD) is initialized to the potential of the wiring 311 (RS) (high level) and brought into a reset state. The above is the start of the reset operation. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photodiode 60, whereby the potential of the charge storage portion (FD) (signal 704) starts to decrease due to a reverse current.

The description of the circuit configuration of FIG. 5A can be referred to for operations at and after time C. The amount of light emitted to the photodiode 60 during the accumulation operation can be determined by measuring the potential of the wiring 315 at time E.

The circuit in FIG. 7B can be operated in accordance with the timing chart shown in FIG. 6C.

At time A, the potential of the wiring 311 (signal 701) is set at low level and the potential of the wiring 312 (signal 702) is set at high level, whereby a forward bias is applied to the photodiode 60 and the potential of the charge storage portion (FD) (signal 704) is set at low level to be in a reset state. The above is the start of the reset operation. Note that the potential of the wiring 315 (signal 705) is precharged to high level.

At time B, the potential of the wiring 311 (signal 701) is set at high level, whereby the reset operation is terminated to start accumulation operation. Here, a reverse bias is applied to the photodiode 60, whereby the potential of the charge storage portion (FD) (signal 704) starts to increase due to a reverse current.

The description of the circuit configuration of FIG. 5A can be referred to for operations at and after time C. The amount of light emitted to the photodiode 60 during the accumulation operation can be determined by measuring the potential of the wiring 315 at time E.

Figure 8A:
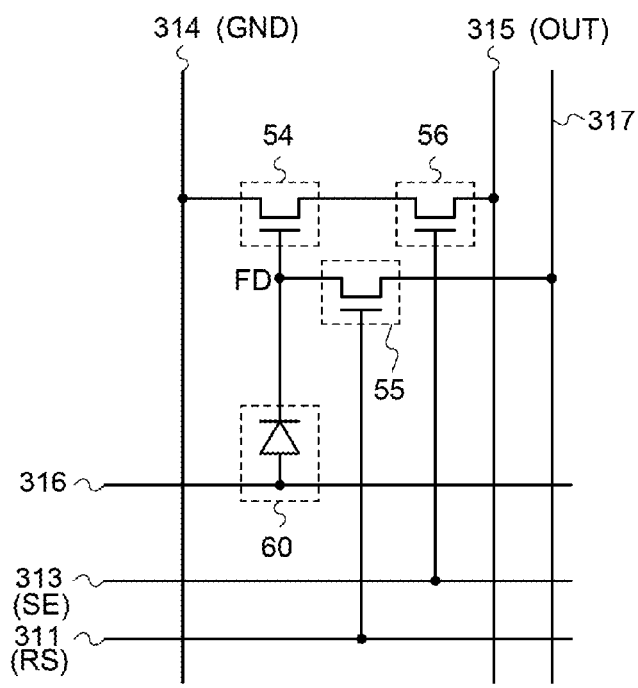
FIGS. 8A and 8B each illustrate a configuration of a pixel circuit.
Figure 8B:
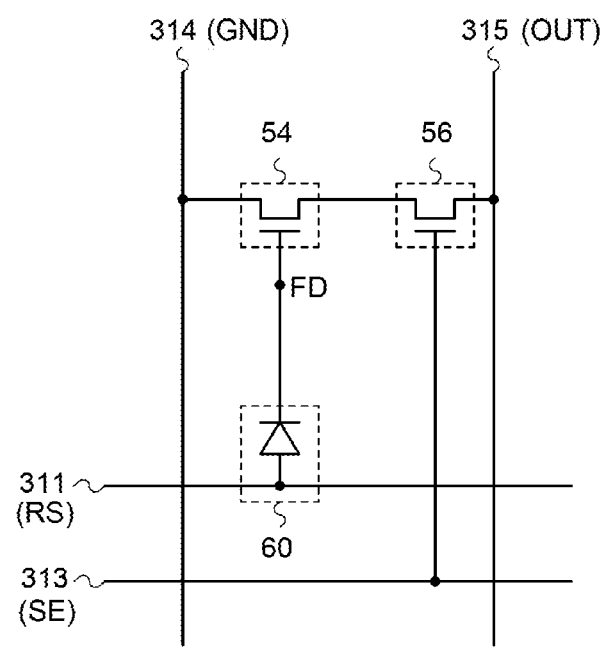

Note that FIGS. 5A and 5B and FIGS. 7A and 7B each show the example in which the transistor 52 is provided; however, one embodiment of the present invention is not limited thereto. As shown in FIGS. 8A and 8B, the transistor 52 may be omitted.

Figure 9A:
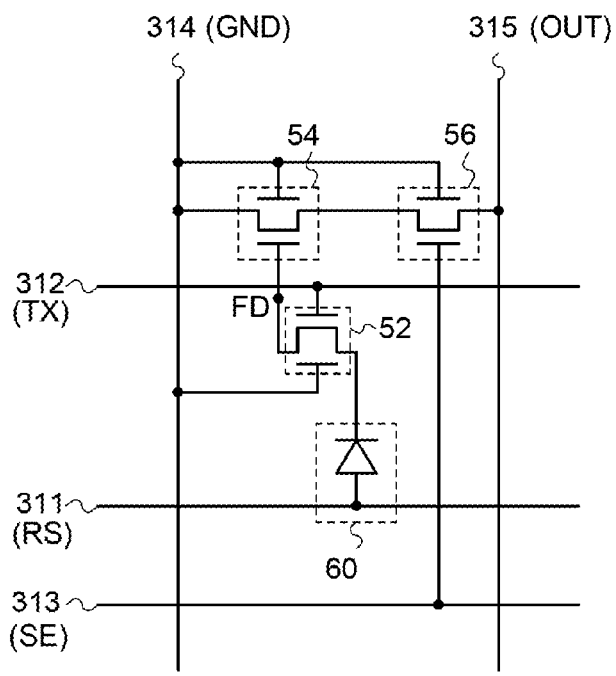
FIGS. 9A and 9B each illustrate a configuration of a pixel circuit.
Figure 9B:
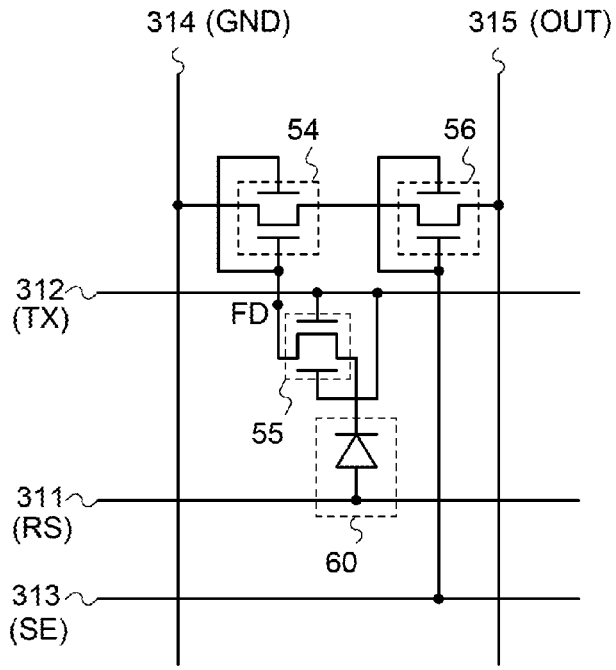

The transistor 52, the transistor 54, and the transistor 56 in the circuit 91 may each have a back gate as illustrated in FIGS. 9A and 9B. FIG. 9A illustrates a configuration of applying a constant potential to the back gates, which enables control of the threshold voltages. FIG. 9B illustrates a configuration in which the back gates are supplied with the same potential as their respective front gates, which enables an increase in on-state current. Although the back gates are electrically connected to the wiring 314 (GND) in FIG. 9A, they may be electrically connected to a different wiring to which a constant potential is supplied. Furthermore, although FIGS. 9A and 9B each illustrate an example in which back gates are provided in the transistors of the circuit in FIG. 7A, the circuits in FIGS. 5A and 5B, FIG. 7B, and FIGS. 8A and 8B may have a similar configuration. Moreover, a configuration of applying the same potential to a front gate and a back gate, a configuration of applying a constant potential to a back gate, and a configuration without a back gate may be arbitrarily combined as necessary for the transistors in one circuit.

Figure 10A:
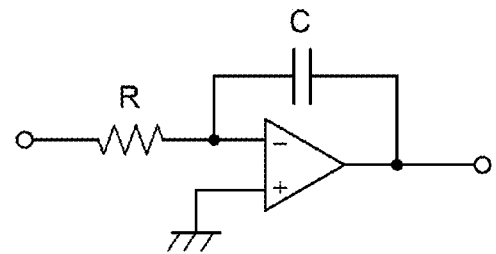
FIGS. 10A to 10C each illustrate the structure of an integrator circuit.
Figure 10B:
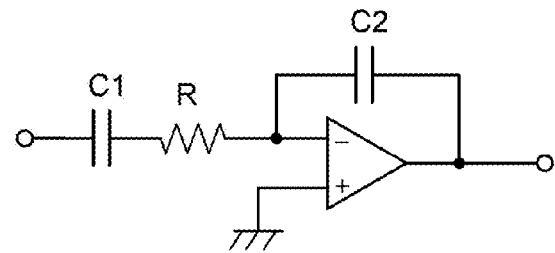
Figure 10C:
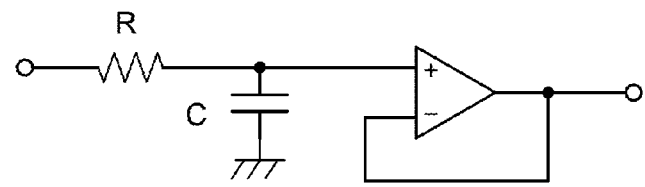

Note that in the circuit example, an integrator circuit illustrated in FIG. 10A, 10B, or 10C may be connected to the wiring 315 (OUT). The circuit enables an S/N ratio of a reading signal to be increased, which makes it possible to sense weaker light, that is, to increase the sensitivity of the imaging device.

FIG. 10A illustrates an integrator circuit using an operational amplifier circuit (also referred to as an op-amp). An inverting input terminal of the operational amplifier circuit is connected to the wiring 315 (OUT) through a resistor R. A non-inverting input terminal of the operational amplifier circuit is grounded. An output terminal of the operational amplifier circuit is connected to the inverting input terminal of the operational amplifier circuit through a capacitor C.

FIG. 10B illustrates an integrator circuit including an operational amplifier circuit having a structure different from that in FIG. 10A. The inverting input terminal of the operational amplifier circuit is connected to the wiring 315 through a resistor R and a capacitor C1. The non-inverting input terminal of the operational amplifier circuit is grounded. The output terminal of the operational amplifier circuit is connected to the inverting input terminal of the operational amplifier circuit through a capacitor C2.

FIG. 10C illustrates an integrator circuit using an operational amplifier circuit having a structure different from those in FIGS. 10A and 10B. The non-inverting input terminal of the operational amplifier circuit is connected to the wiring 315 (OUT) through the resistor R. The output terminal of the operational amplifier circuit is connected to the inverting input terminal of the operational amplifier circuit. The resistor R and the capacitor C constitute a CR integrator circuit. The operational amplifier circuit is a unity gain buffer.

This embodiment can be implemented in an appropriate combination with any of the structures described in the other embodiments.

Embodiment 3

In this embodiment, a circuit configuration in which a transistor for initializing the potential of the charge storage portion (FD), a transistor for outputting a signal corresponding to the potential of the charge storage portion (FD), and various wirings (signal lines) are shared between pixels (of plural circuits 91) is described.

In a pixel circuit shown in FIG. 11, as in the circuit shown in FIG. 5A, the transistor 52 (functioning as a transfer transistor), the transistor 54 (functioning as an amplifying transistor), the transistor 55 (functioning as a reset transistor), the transistor 56 (functioning as a selection transistor), and the photodiode 60 are provided in each pixel. Furthermore, a basic configuration is as follows: the wiring 311 (functioning a reset switch line), the wiring 312 (functioning as a transfer switch line), the wiring 313 (functioning as a selection switch line), the wiring 314 (functioning as a high-potential line), and the wiring 315 (functioning as an output line) are electrically connected to the pixel circuit.

The wiring 314 corresponds to GND and the wiring 317 corresponds to a high-potential line in the circuit shown in FIG. 5A; however, in the pixel circuit in FIG. 11, since the wiring 314 corresponds to a high-potential line (e.g., VDD) and the other of the source and the drain of the transistor 56 is connected to the wiring 314, the wiring 317 is not provided. Furthermore, the wiring 315 (OUT) is reset to low potential.

The wiring 314, the wiring 315, and the wiring 316 can be shared between a pixel circuit in a first line and a pixel circuit in a second line, and in addition, the wiring 311 can be shared between the pixel circuits depending on an operation mode.

Figure 12:
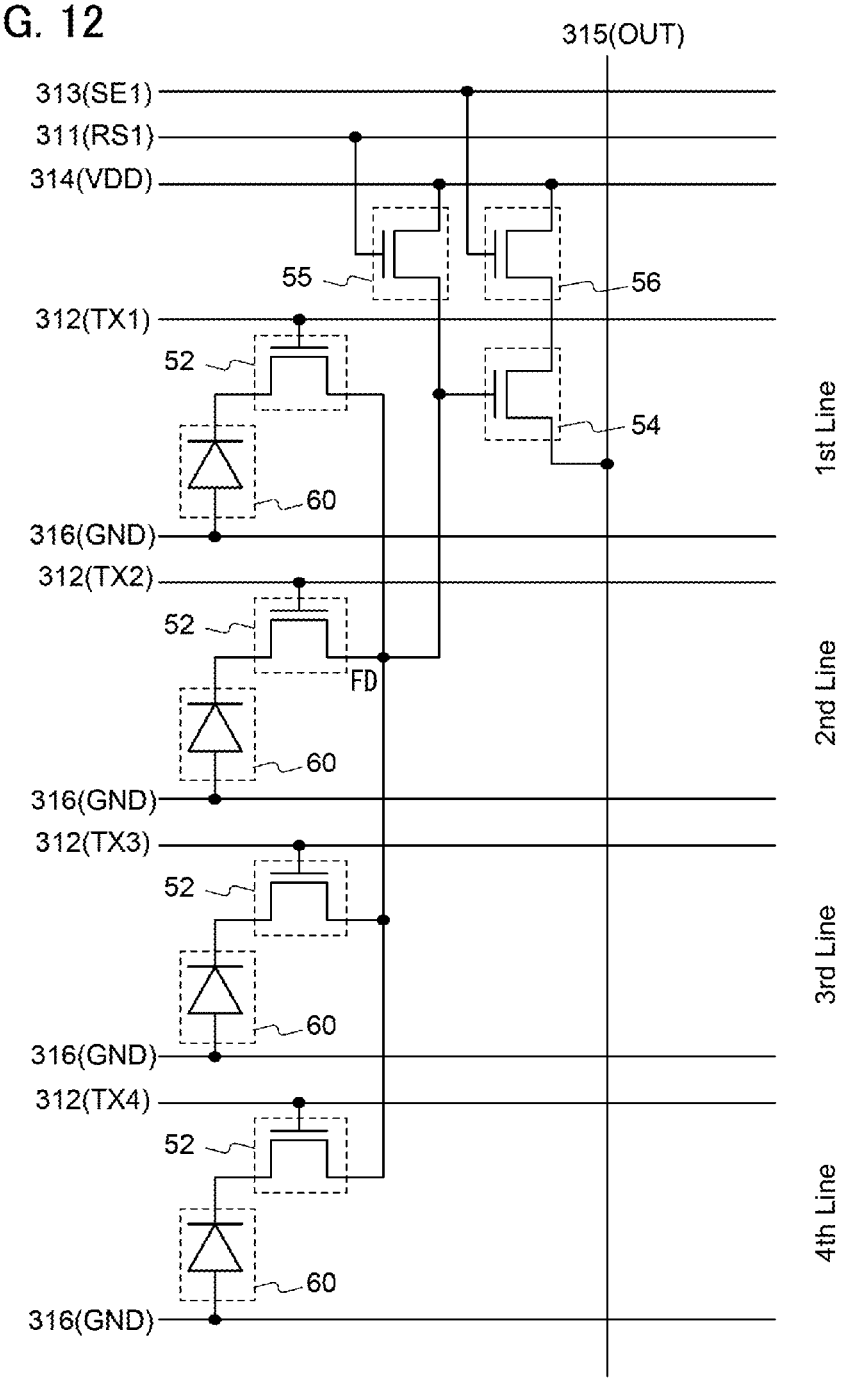
FIG. 12 illustrates a configuration of a pixel circuit.

FIG. 12 shows a longitudinal-sharing-type configuration of four pixels, in which the transistor 54, the transistor 55, the transistor 56, and the wiring 311 are shared between the longitudinally adjacent four pixels. A reduction in the numbers of transistors and wirings can miniaturize the circuit due to reduction in the area of a pixel, and can improve an yield in the production. The other of the source and the drain of the transistor 52 in each of the longitudinally adjacent four pixels, one of the source and the drain of the transistor 55, and the gate of the transistor 54 are electrically connected to the charge storage portion (FD). The transistors 52 of all the pixels are sequentially operated, and accumulation operation and reading operation are repeated, whereby data can be obtained from all the pixels.

Figure 13:
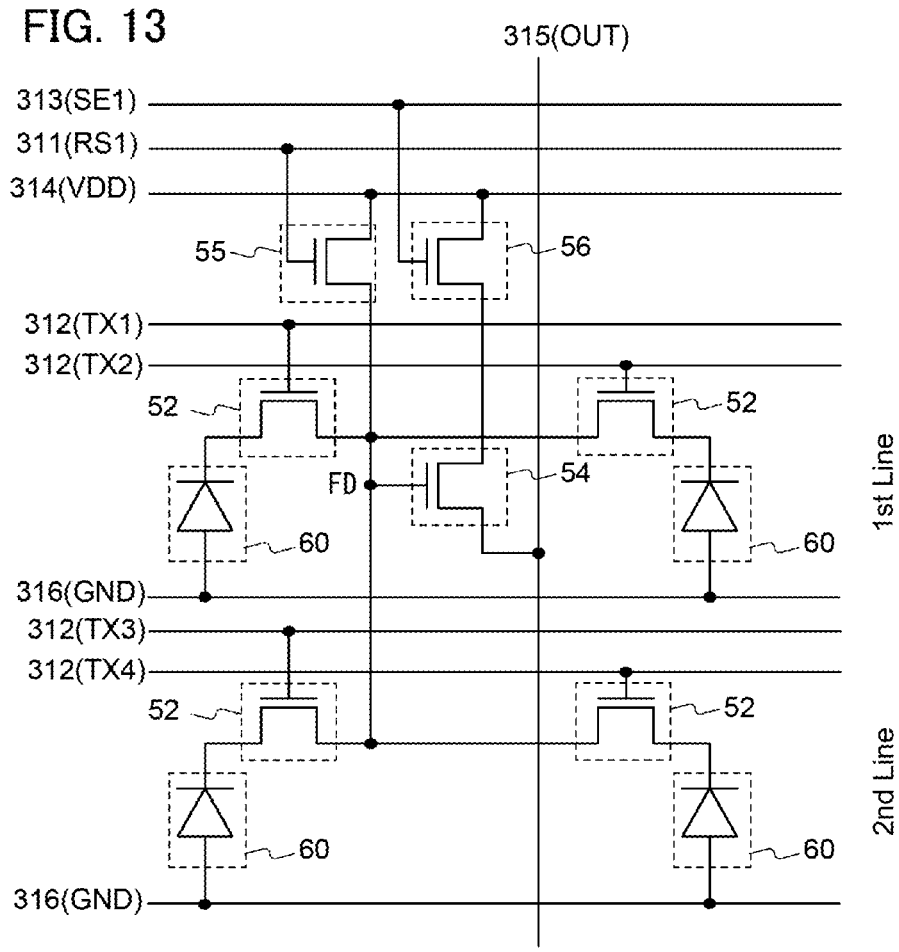
FIG. 13 illustrates a configuration of a pixel circuit.

FIG. 13 shows a lateral-longitudinal-sharing-type configuration of four pixels, in which the transistor 54, the transistor 55, the transistor 56, and the wiring 311 are shared between the laterally and longitudinally adjacent four pixels. In a manner similar to that of the configuration of longitudinally arranged four pixels, a reduction in the numbers of transistors and wirings can miniaturize the circuit due to reduction in the area of a pixel, and can improve an yield in the production. The other of the source and the drain of the transistor 52 in each of the laterally and longitudinally adjacent four pixels, one of the source and the drain of the transistor 55, and the gate of the transistor 54 are electrically connected to the charge storage portion (FD). The transistors 52 of all the pixels are sequentially operated, and accumulation operation and reading operation are repeated, whereby data can be obtained from all the pixels.

Figure 14:
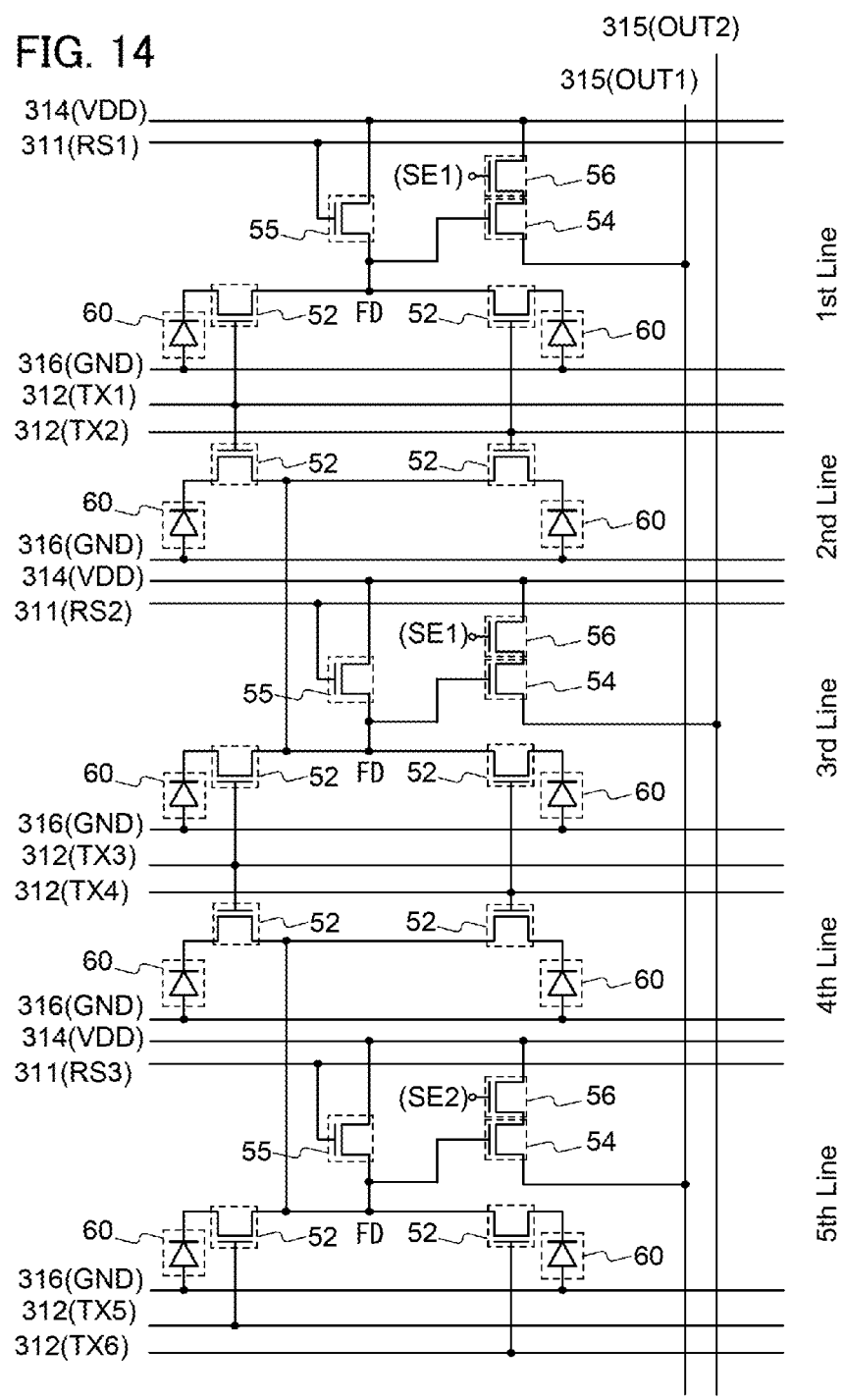
FIG. 14 illustrates a configuration of a pixel circuit.

FIG. 14 shows a transfer-switch-line sharing configuration, in which the transistor 54, the transistor 55, the transistor 56, the wiring 311, and the wiring 312 are shared between four pixels that are adjacent to each other longitudinally and laterally. This configuration corresponds to the configuration of four pixels arranged longitudinally and laterally in which the transfer switch line (wiring 312) is shared between the four pixels. The other of the source and the drain of the transistor 52 in each of the four pixels that are adjacent to each other longitudinally and laterally (in the first row, two pixels that are adjacent to each other laterally), one of the source and the drain of the transistor 55, and the gate of the transistor 54 are electrically connected to the charge storage portion (FD). In the circuit configuration, the transfer switch line (wiring 312) is shared between two transfer transistors (transistors 52) positioned longitudinally, so that transistors which operate in a lateral direction and a longitudinal direction concurrently are provided.

Note that although different from the configurations in which the transistors and the signal line(s) are shared between the pixels, a configuration of a pixel circuit including a plurality of photodiodes may be employed.

Figure 15:
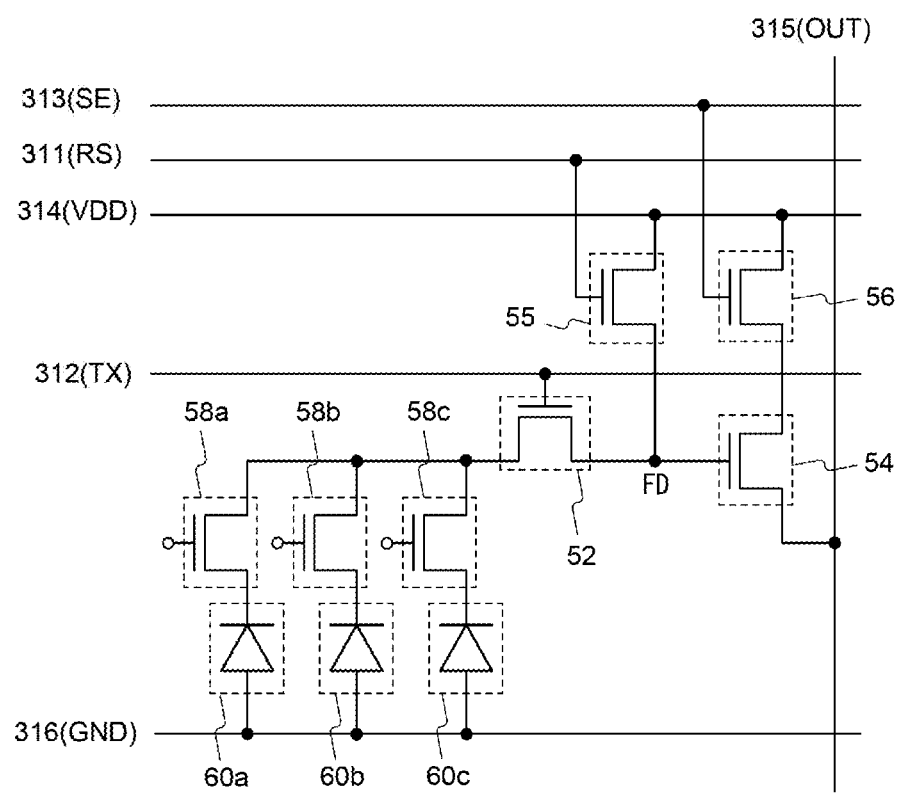
FIG. 15 illustrates a configuration of a pixel circuit.

For example, as shown in a circuit in FIG. 15, photodiodes 60a, 60b, and 60c, transistors 58a, 58b, and 58c, and the like are provided between the wiring 316 and the one of the source and the drain of the transistor 52. The transistors 58a, 58b, and 58c each function as a switch for selecting a photodiode which is connected to the transistor. Note that there is no limitation on the numbers of the photodiodes and the transistors functioning as switches.

For example, as the photodiodes 60a, 60b, and 60c, photodiodes which differ in sensitivity to illuminance can be used and those suited to imaging under each of environments from low illuminance to high illuminance are selected. For example, as a photodiode for high illuminance, a photodiode which is combined with a dimming filter so that output for illuminance has linearity can be used. Note that a plurality of photodiodes may be operated at the same time.

Alternatively, as the photodiodes 60a, 60b, and 60c, photodiodes which differ in sensitivity to a wavelength can be used and those suited to imaging in each of wavelengths from ultraviolet rays to far infrared rays are selected. For example, with a combination of a filter which transmits light having a target wavelength range and a photodiode, imaging utilizing ultraviolet light, imaging utilizing visible light, imaging utilizing infrared light, and the like can be separately performed.

This embodiment can be implemented in an appropriate combination with any of the structures described in the other embodiments.

Embodiment 4

In this embodiment, an example of a driving method of a pixel circuit is described.

As described in Embodiment 2, the operation of the pixel circuit is repetition of the reset operation, the accumulation operation, and the selection operation. As imaging modes in which the whole pixel matrix is controlled, a global shutter system and a rolling shutter system are known.

FIG. 16A shows a timing chart in a global shutter system. FIG. 16A shows operations of an imaging device in which a plurality of pixel circuits illustrated in FIG. 5A are arranged in a matrix. Specifically, FIG. 16A show operations of the pixel circuits from the first row to the n-th row (n is a natural number of three or more). The following description for operation can be applied to any of the circuits in FIG. 5B, FIGS. 7A and 7B, and FIGS. 8A and 8B.

In FIG. 16A, a signal 501, a signal 502, and a signal 503 are input to the wirings 311 (RS) connected to the pixel circuits in the first row, the second row, and the n-th row, respectively. A signal 504, a signal 505, and a signal 506 are input to the wirings 312 (TX) connected to the pixel circuits in the first row, the second row, and the n-th row, respectively. A signal 507, a signal 508, and a signal 509 are input to the wirings 313 (SE) connected to the pixel circuits in the first row, the second row, and the n-th row, respectively.

A period 510 is a period required for one imaging. In a period 511, the pixel circuits in each row perform the reset operation at the same time. In a period 520, the pixel circuits in each row perform the accumulation operation at the same time. Note that the selection operation is sequentially performed in the pixel circuits for each row. For example, in a period 531, the selection operation is performed in the pixel circuits in the first row. As described above, in the global shutter system, the reset operation is performed in all the pixel circuits substantially at the same time, the accumulation operation is performed in all the pixel circuits substantially at the same time, and then the read operation is sequentially performed for each row.

That is, in the global shutter system, since the accumulation operation is performed in all the pixel circuits substantially at the same time, imaging is simultaneously performed in the pixel circuits in all the rows. Therefore, an image with little distortion can be obtained even in the case of a moving object.

On the other hand, FIG. 16B is a timing chart of the case where a rolling shutter system is used. The description of FIG. 16A can be referred to for the signals 501 to 509. A period 610 is the time taken for one imaging. A period 611, a period 612, and a period 613 are reset periods in the first row, the second row, and the n-th row, respectively. A period 621, a period 622, and a period 623 are accumulation operation periods in the first row, the second row, and the n-th row, respectively. In a period 631, the selection operation is performed in the pixel circuits in the first row. As described above, in the rolling shutter system, the accumulation operation is not performed at the same time in all the pixel circuits but is sequentially performed for each row; thus, imaging is not simultaneously performed in the pixel circuits in all the rows. Therefore, the timing of imaging in the first row is different from that of imaging in the last row, and thus an image with large distortion is obtained in the case of a moving object.

To perform the global shutter system, even after the accumulation operation, the potential of the charge storage portion (FD) in each pixel circuit needs to be kept for a long time until the read operation is performed. As described above, when a transistor including a channel formation region formed of an oxide semiconductor and having an extremely small off-state current is used as the transistor 52 and the like, the potential of the charge storage portion (FD) can be kept for a long time. In the case where a transistor including a channel formation region formed of silicon or the like is used as the transistor 301 and so on, the potential of the charge storage portion (FD) cannot be kept for a long time because of a high off-state current, which makes it difficult to use the global shutter system.

The use of transistors including a channel formation region formed of an oxide semiconductor in the pixel circuits makes it easy to perform the global shutter system.

This embodiment can be implemented in an appropriate combination with any of the structures described in the other embodiments.

Embodiment 5

In this embodiment, a transistor including an oxide semiconductor that can be used in one embodiment of the present invention is described with reference to drawings.

Figure 17A:
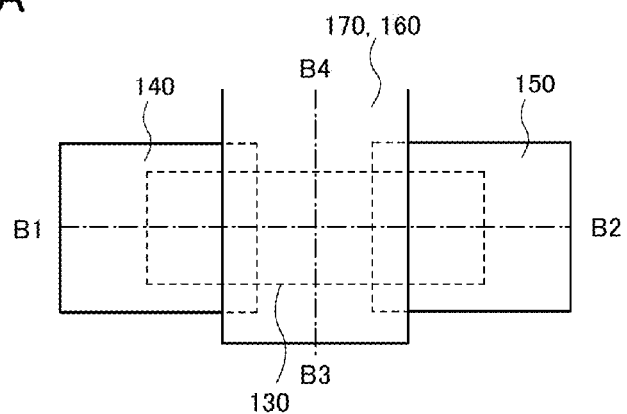
FIGS. 17A and 17B are a top view and a cross-sectional view illustrating a transistor.
Figure 17B:
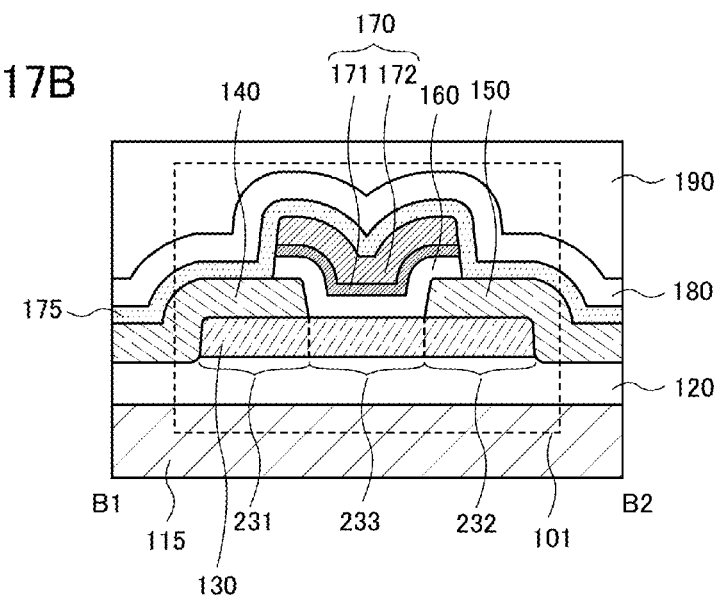
Figure 23A:
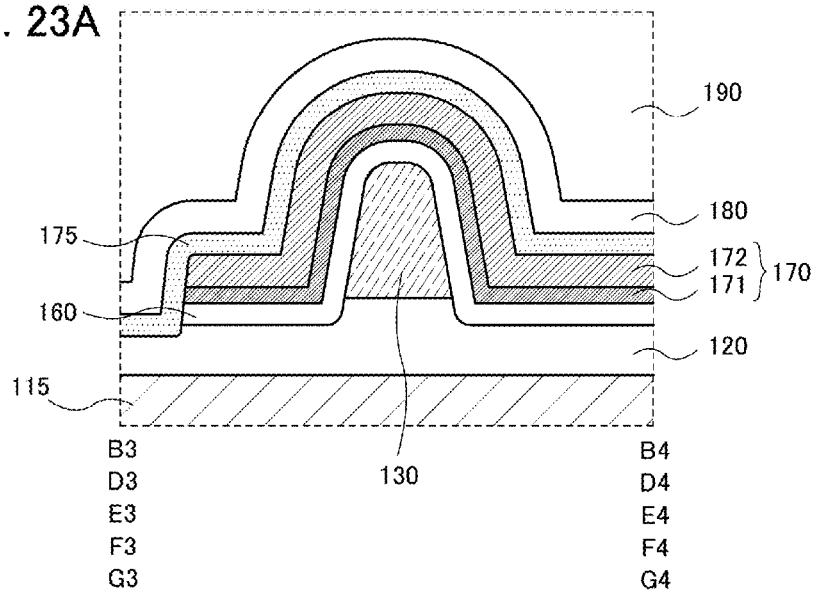
FIGS. 23A and 23B each illustrate a cross section of a transistor in the channel width direction.

FIGS. 17A and 17B are a top view and a cross-sectional view illustrating a transistor 101 of one embodiment of the present invention. FIG. 17A is a top view, and a cross section in the direction of a dashed-dotted line B1-B2 in FIG. 17A is illustrated in FIG. 17B. A cross section in the direction of a dashed-dotted line B3-B4 in FIG. 17A is illustrated in FIG. 23A. In the drawings, some components are enlarged, reduced in size, or omitted for easy understanding. The direction of the dashed-dotted line B1-B2 may be referred to as a channel length direction, and the direction of the dashed-dotted line B3-B4 may be referred to as a channel width direction.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The transistor 101 may also include, for example, an insulating layer 190 (planarization film) in contact with the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 17B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, for example, the resistance of the region 231 and the region 232 can be reduced.

Specifically, since the oxide semiconductor layer 130 is in contact with the conductive layer 140 and the conductive layer 150, oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the region 231 and the region 232 to n-type regions with low resistance.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 18A:
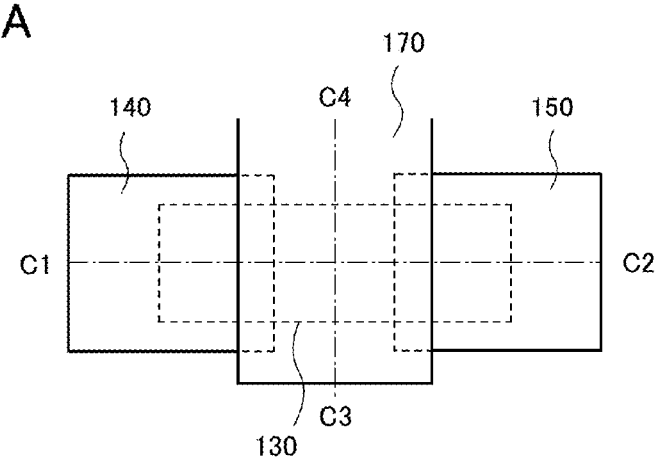
FIGS. 18A and 18B are a top view and a cross-sectional view illustrating a transistor.
Figure 18B:
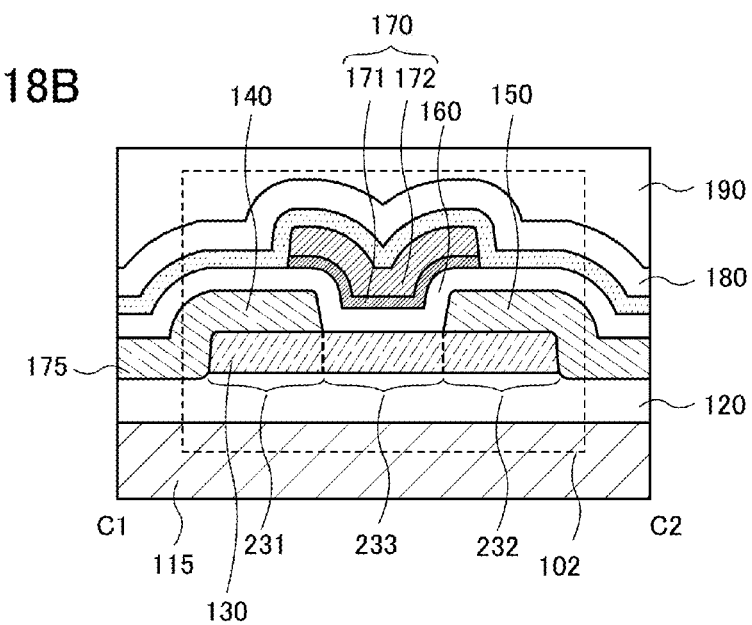
Figure 23B:
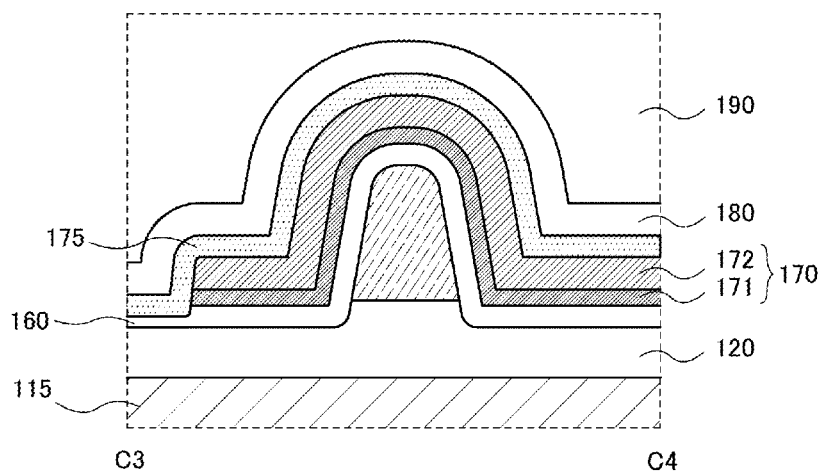
Figure 24A:
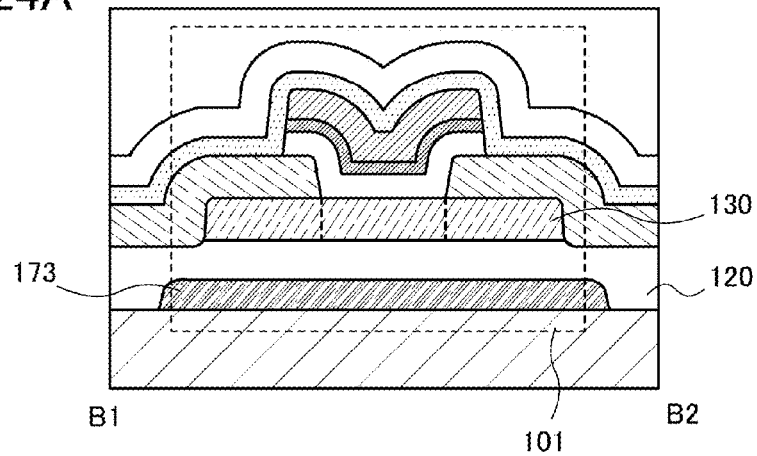
FIGS. 24A to 24C each illustrate a cross section of a transistor in the channel length direction.
Figure 24B:
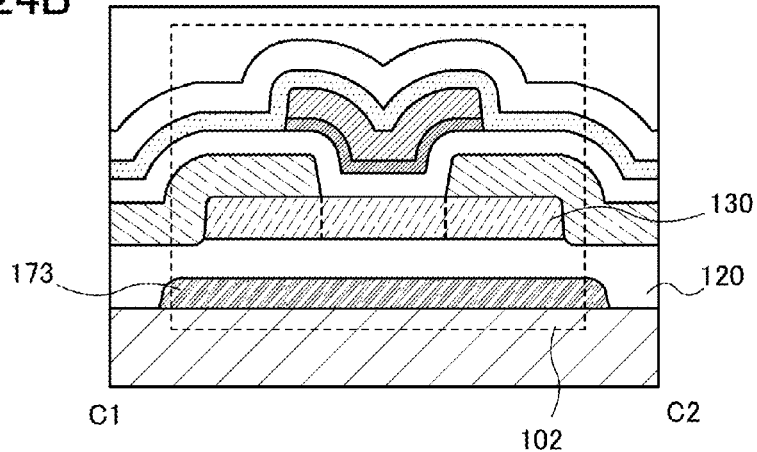
Figure 24C:
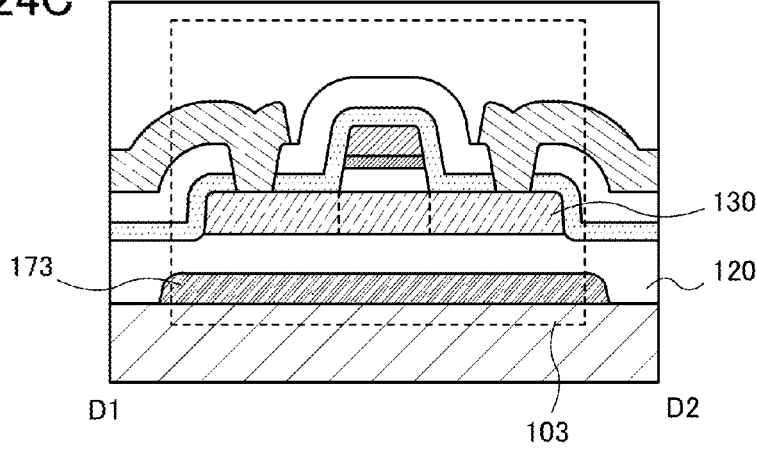
Figure 25A:
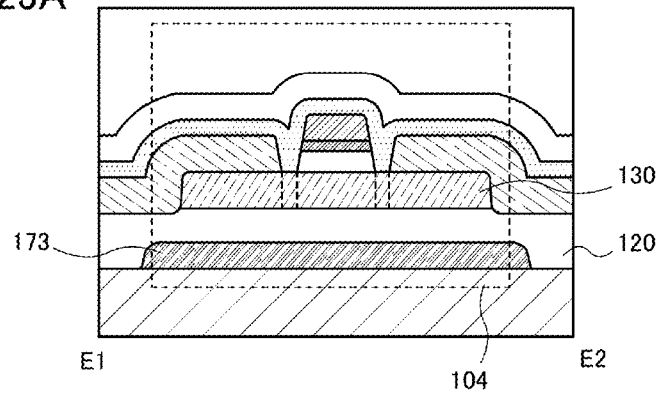
FIGS. 25A to 25C each illustrate a cross section of a transistor in the channel length direction.
Figure 25B:
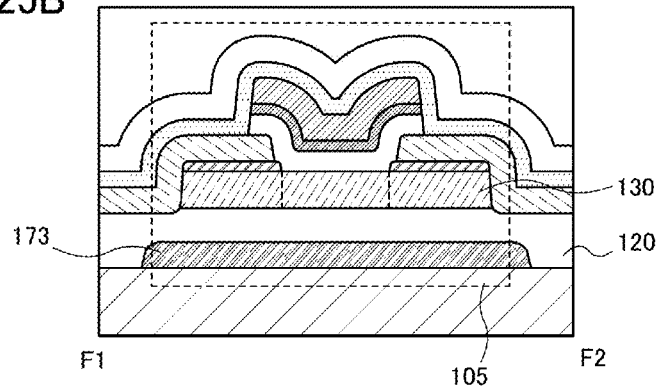
Figure 25C:
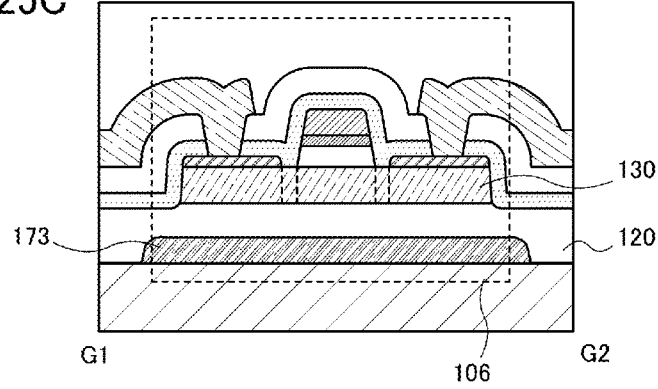

The transistor of one embodiment of the present invention may have a structure illustrated in FIGS. 18A and 18B. FIG. 18A is a top view of a transistor 102. A cross section in the direction of a dashed-dotted line C1-C2 in FIG. 18A is illustrated in FIG. 18B. A cross section in the direction of a dashed-dotted line C3-C4 in FIG. 18A is illustrated in FIG. 23B. In the drawings, some components are enlarged, reduced in size, or omitted for easy understanding. The direction of the dashed-dotted line C1-C2 may be referred to as a channel length direction, and the direction of the dashed-dotted line C3-C4 may be referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layer 140 and the conductive layer 150 are covered with the insulating layer 160 and accordingly the resistance between the conductive layer 170 and the conductive layers 140 and 150 is high; therefore, the transistor 102 has a feature of low gate leakage current.

The transistor 101 and the transistor 102 each have a top-gate structure including a region where the conductive layer 170 overlaps each of the conductive layers 140 and 150. To reduce parasitic capacitance, the width of the region in the channel length direction is preferably greater than or equal to 3 nm and less than 300 nm. Meanwhile, since an offset region is not formed in the oxide semiconductor layer 130, a transistor with high on-state current can be easily be formed.

Figure 19A:
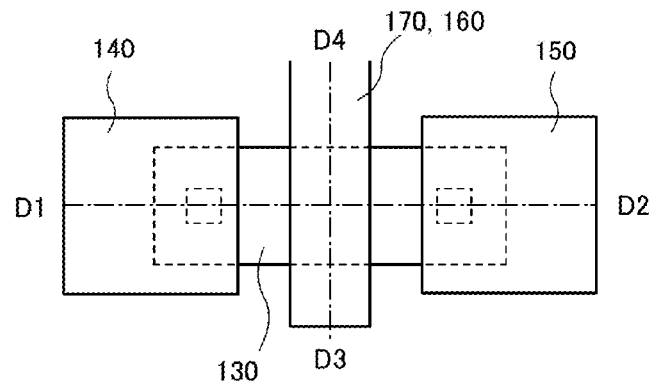
FIGS. 19A and 19B are a top view and a cross-sectional view illustrating a transistor.
Figure 19B:
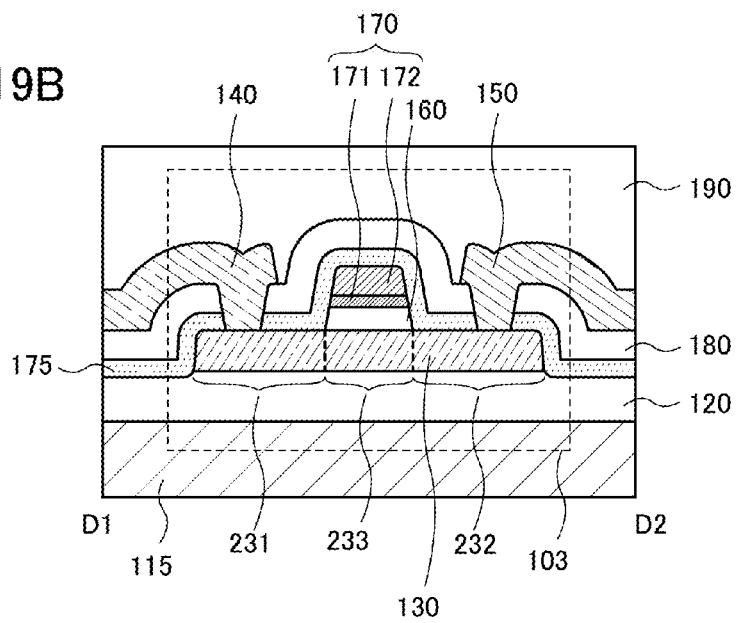

The transistor of one embodiment of the present invention may have a structure illustrated in FIGS. 19A and 19B. FIG. 19A is a top view of a transistor 103. A cross section in the direction of a dashed-dotted line D1-D2 in FIG. 19A is illustrated in FIG. 19B. A cross section in the direction of a dashed-dotted line D3-D4 in FIG. 19A is illustrated in FIG. 23A. In the drawings, some components are enlarged, reduced in size, or omitted for easy understanding. The direction of the dashed-dotted line D1-D2 may be referred to as a channel length direction, and the direction of the dashed-dotted line D3-D4 may be referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. The transistor 103 may also include, for example, the insulating layer 190 (planarization film) in contact with the insulating layer 180, the conductive layer 140, and the conductive layer 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 19B can function as a source region, a drain region, and a channel formation region, respectively. The region 231 and the region 232 are in contact with the insulating layer 175. When an insulating material containing hydrogen is used for the insulating layer 175, for example, the resistance of the region 231 and the region 232 can be reduced.

Specifically, interaction between oxygen vacancy generated in the region 231 and the region 232 by the steps up to the formation of the insulating layer 175 and hydrogen that diffuses into the region 231 and the region 232 from the insulating layer 175 changes the region 231 and the region 232 to n-type regions with low resistance. As the insulating material containing hydrogen, for example, a silicon nitride film, an aluminum nitride film, or the like can be used.

Figure 20A:
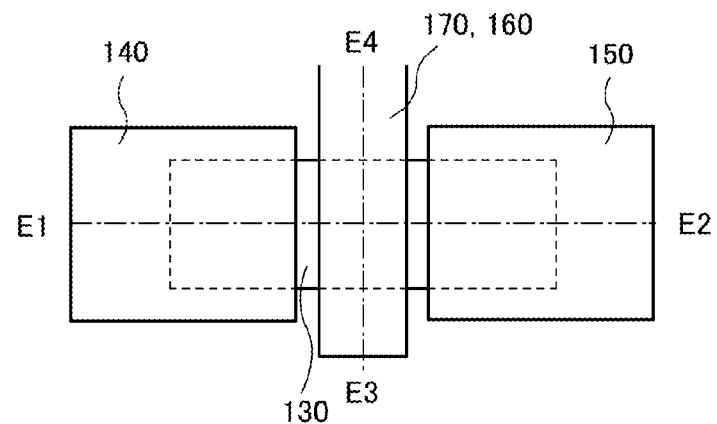
FIGS. 20A and 20B are a top view and a cross-sectional view illustrating a transistor.
Figure 20B:
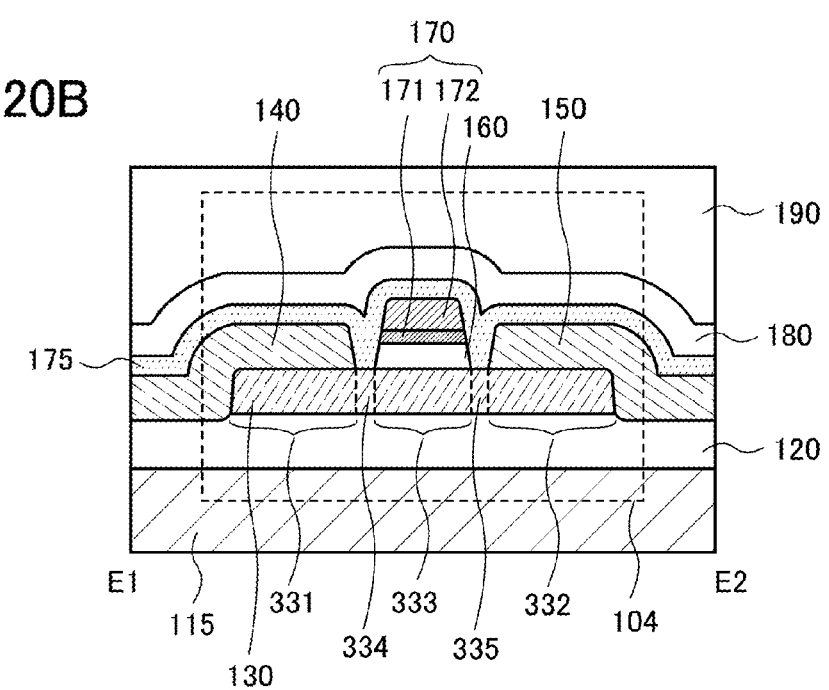

The transistor of one embodiment of the present invention may have a structure illustrated in FIGS. 20A and 20B. FIG. 20A is a top view of a transistor 104. A cross section in the direction of a dashed-dotted line E1-E2 in FIG. 20A is illustrated in FIG. 20B. A cross section in the direction of a dashed-dotted line E3-E4 in FIG. 20A is illustrated in FIG. 23A. In the drawings, some components are enlarged, reduced in size, or omitted for easy understanding. The direction of the dashed-dotted line E1-E2 may be referred to as a channel length direction, and the direction of the dashed-dotted line E3-E4 may be referred to as a channel width direction.

The transistor 104 has the same structure as the transistor 103 except that the conductive layer 140 and the conductive layer 150 in contact with the oxide semiconductor layer 130 cover end portions thereof.

In FIG. 20B, a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. The resistance of the region 334 and the region 335 can be reduced in a manner similar to that of the region 231 and the region 232 in the transistor 103. In the case where the width of the region 334 and the region 335 in the channel length direction is less than or equal to 100 nm, preferably less than or equal to 50 nm, a gate electric field contributes to preventing a significant decrease in on-state current; therefore, a reduction in resistance of the region 334 and the region 335 as described above is not necessarily performed.

The transistor 103 and the transistor 104 each have a self-aligned structure not including a region where the conductive layer 170 overlaps each of the conductive layers 140 and 150. A transistor with a self-aligned structure, which has extremely small parasitic capacitance between a gate electrode layer and source and drain electrode layers, is suitable for applications that require high-speed operation.

Figure 21A:
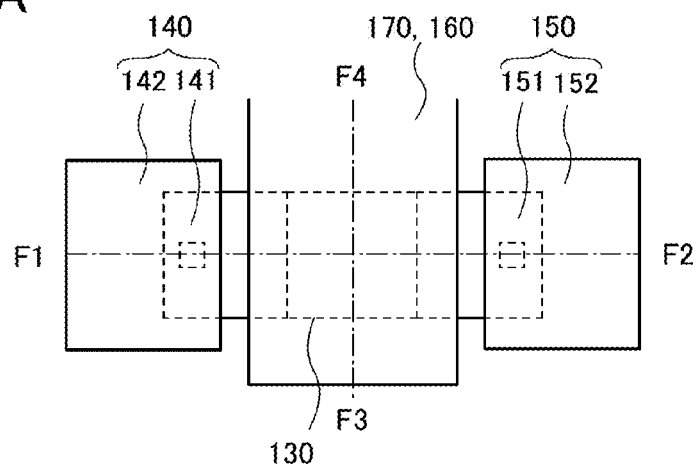
FIGS. 21A and 21B are a top view and a cross-sectional view illustrating a transistor.
Figure 21B:
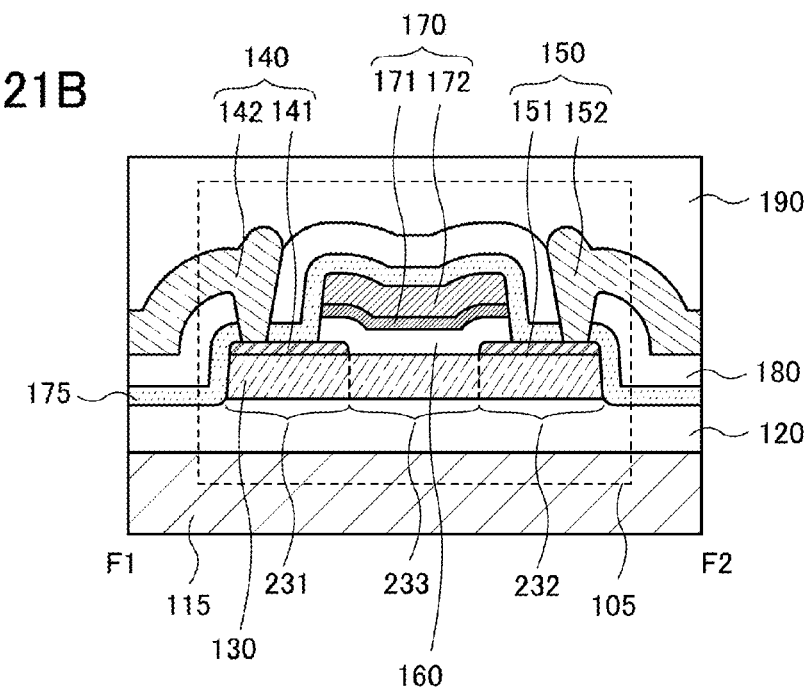

The transistor of one embodiment of the present invention may have a structure illustrated in FIGS. 21A and 21B. FIG. 21A is a top view of a transistor 105. A cross section in the direction of a dashed-dotted line F1-F2 in FIG. 21A is illustrated in FIG. 21B. A cross section in the direction of a dashed-dotted line F3-F4 in FIG. 21A is illustrated in FIG. 23A. In the drawings, some components are enlarged, reduced in size, or omitted for easy understanding. The direction of the dashed-dotted line F1-F2 may be referred to as a channel length direction, and the direction of the dashed-dotted line F3-F4 may be referred to as a channel width direction.

The transistor 105 includes the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. The transistor 105 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 105 has the same structure as the transistor 101 except that the conductive layer 141 and the conductive layer 151 are provided and that the conductive layer 142 and the conductive layer 152 electrically connected to the conductive layer 141 and the conductive layer 151, respectively, through the openings provided in the insulating layer 175 and the insulating layer 180 are provided. The conductive layer 140 (the conductive layer 141 and the conductive layer 142) can function as a source electrode layer, and the conductive layer 150 (the conductive layer 151 and the conductive layer 152) can function as a drain electrode layer.

Figure 22A:
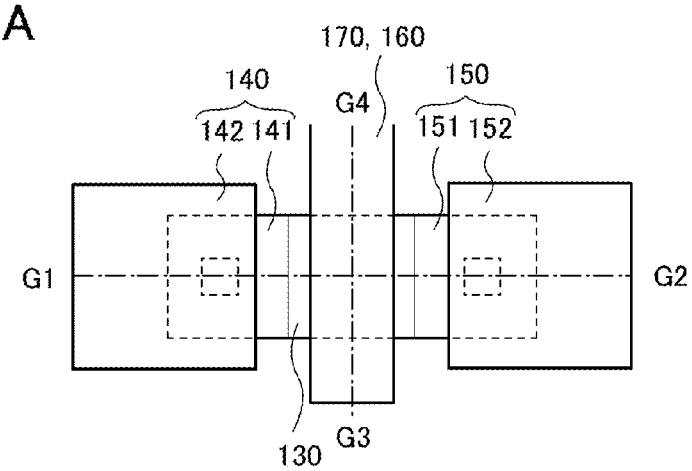
FIGS. 22A and 22B are a top view and a cross-sectional view illustrating a transistor.
Figure 22B:
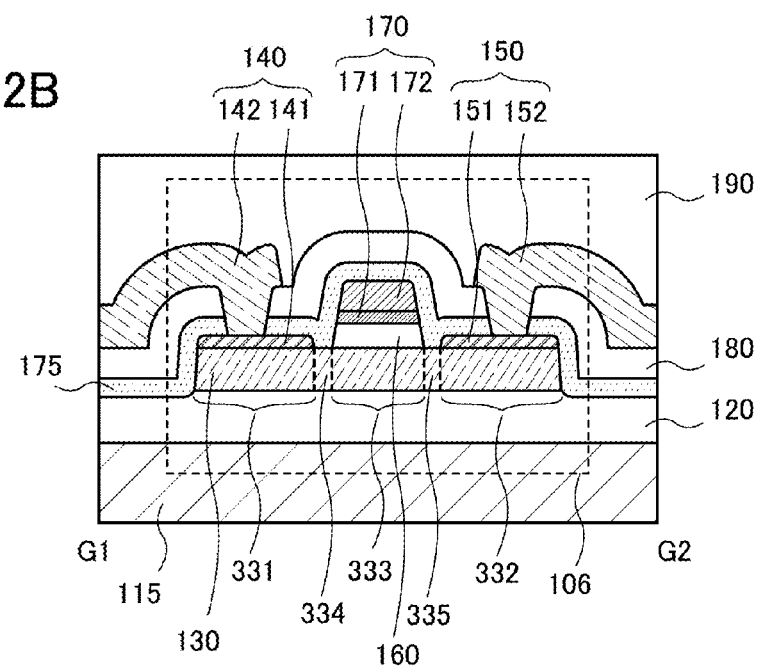

The transistor of one embodiment of the present invention may have a structure illustrated in FIGS. 22A and 22B. FIG. 22A is a top view of a transistor 106. A cross section in the direction of a dashed-dotted line G1-G2 in FIG. 22A is illustrated in FIG. 22B. A cross section in the direction of a dashed-dotted line G3-G4 in FIG. 22A is illustrated in FIG. 23A. In the drawings, some components are enlarged, reduced in size, or omitted for easy understanding. The direction of the dashed-dotted line G1-G2 may be referred to as a channel length direction, and the direction of the dashed-dotted line G3-G4 may be referred to as a channel width direction.

The transistor 106 includes the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 106 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a drain electrode layer.

In the structures of the transistor 105 and the transistor 106, the conductive layer 140 and the conductive layer 150 are not in contact with the insulating layer 120. These structures make the insulating layer 120 less likely to be deprived of oxygen by the conductive layer 140 and the conductive layer 150 and facilitate oxygen supply from the insulating layer 120 to the oxide semiconductor layer 130.

Note that an impurity for forming oxygen vacancy to increase conductivity may be added to the region 231 and the region 232 in the transistor 103 and the region 334 and the region 335 in the transistor 104 and the transistor 106. As an impurity for forming oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby oxygen vacancy is formed. Interaction between oxygen vacancy in the oxide semiconductor layer and hydrogen that remains in the oxide semiconductor layer or is added to the oxide semiconductor layer in a later step can increase the conductivity of the oxide semiconductor layer.

When hydrogen is added to an oxide semiconductor in which oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor.

The oxide conductor is a degenerate semiconductor and it is suggested that the conduction band edge equals to or substantially equals to the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 26A:
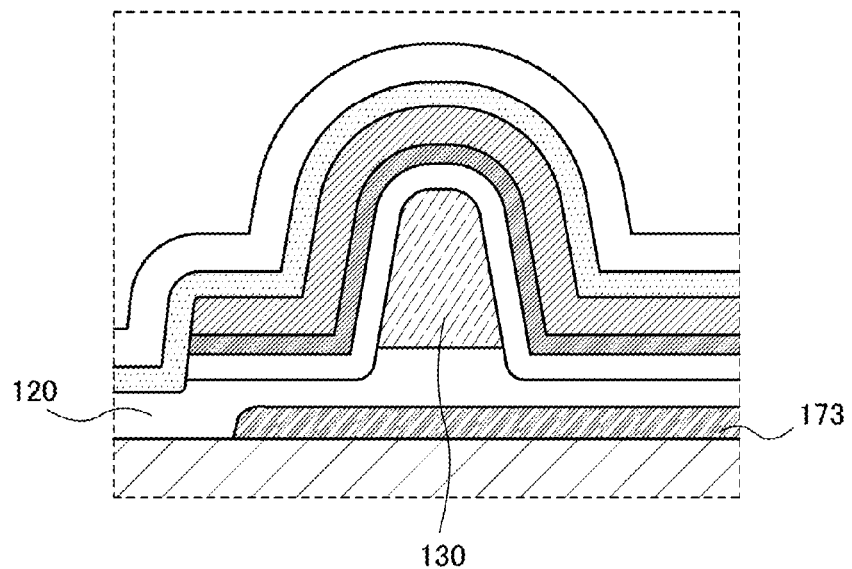
FIGS. 26A and 26B each illustrate a cross section of a transistor in the channel width direction.
Figure 26B:
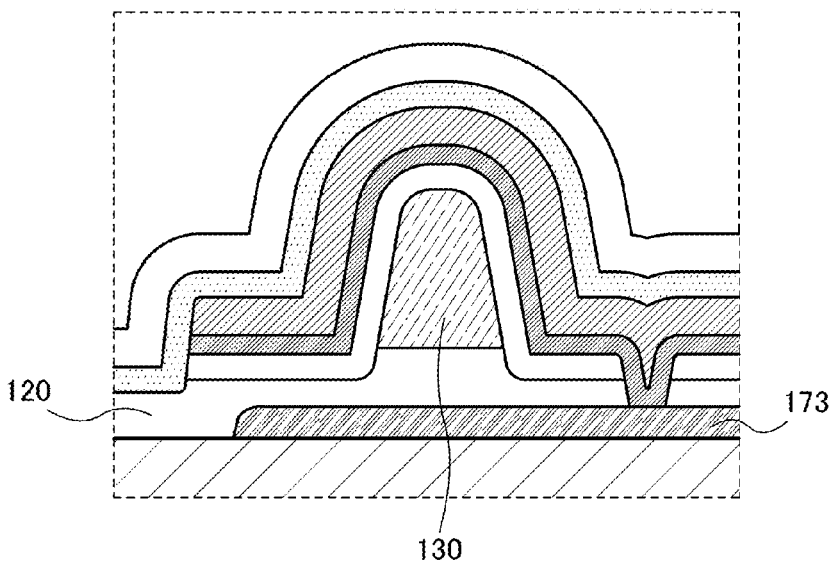

The transistor of one embodiment of the present invention may include a conductive layer 173 between the oxide semiconductor layer 130 and the substrate 115 as illustrated in the cross-sectional views in the channel length direction in FIGS. 24A to 24C and FIGS. 25A to 25C and the cross-sectional views in the channel width direction in FIGS. 26A and 26B. When the conductive layer is used as a second gate electrode layer (back gate), the on-state current can be further increased or the threshold voltage can be controlled. In the cross-sectional views in FIGS. 24A to 24C and FIGS. 25A to 25C, the width of the conductive layer 173 may be shorter than that of the oxide semiconductor layer 130. Moreover, the width of the conductive layer 173 may be shorter than that of the conductive layer 170.

In order to increase the on-state current, for example, the conductive layer 170 and the conductive layer 173 are set to have the same potential, and the transistor is driven as a double-gate transistor. Further, to control the threshold voltage, a fixed potential, which is different from a potential of the conductive layer 170, is supplied to the conductive layer 173. To set the conductive layer 170 and the conductive layer 173 at the same potential, for example, as shown in FIG. 26B, the conductive layer 170 and the conductive layer 173 may be electrically connected to each other through a contact hole.

The transistors 101 to 106 shown in FIGS. 17A and 17B, FIGS. 18A and 18B, FIGS. 19A and 19B, FIGS. 20A and 20B, FIGS. 21A and 21B, and FIGS. 22A and 22B are examples in which the oxide semiconductor layer 130 is a single layer; alternatively, the oxide semiconductor layer 130 may be a stacked layer. The oxide semiconductor layer 130 in the transistors 101 to 106 can be replaced with the oxide semiconductor layer 130 shown in FIGS. 27A to 27C or FIGS. 28A to 28C.

Figure 27A:
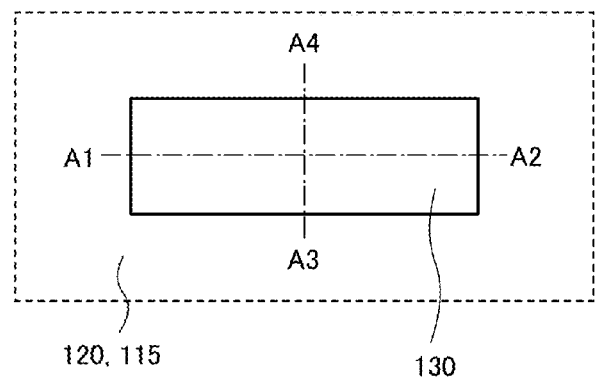
FIGS. 27A to 27C are a top view and cross-sectional views illustrating a semiconductor layer.
Figure 27B:
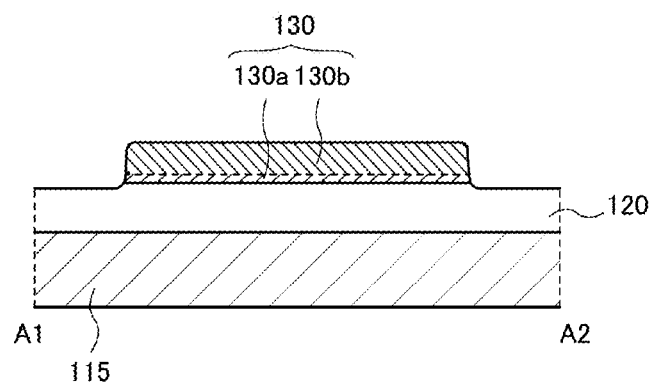
Figure 27C:
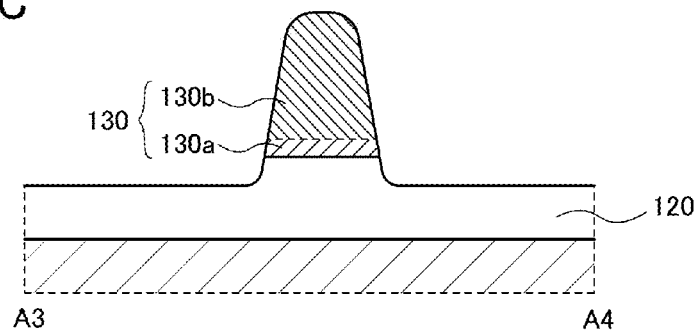

FIGS. 27A to 27C are a top view and cross-sectional views of the oxide semiconductor layer 130 with a two-layer structure. FIG. 27A is the top view. FIG. 27B illustrates a cross section in the direction of a dashed-dotted line A1-A2 in FIG. 27A. FIG. 27C illustrates a cross section in the direction of a dashed-dotted line A3-A4 in FIG. 27A. In the drawings, some components are enlarged, reduced in size, or omitted for easy understanding.

Figure 28A:
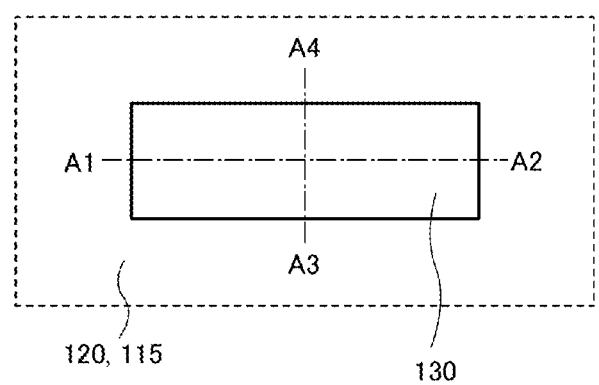
FIGS. 28A to 28C are a top view and cross-sectional views illustrating a semiconductor layer.
Figure 28B:
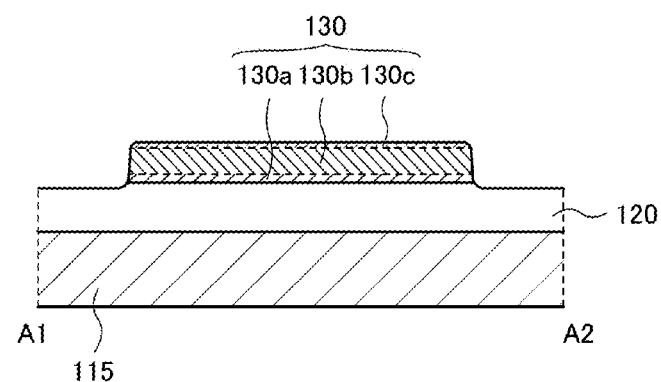
Figure 28C:
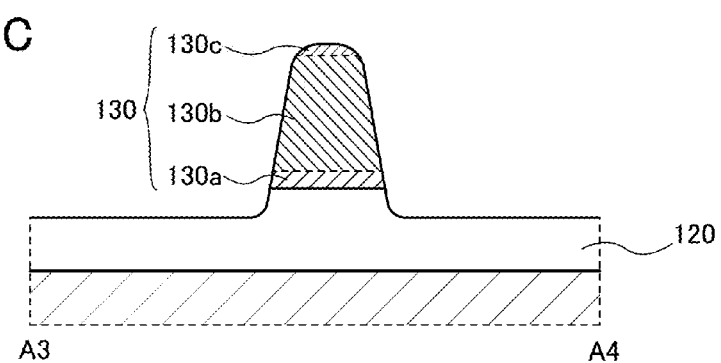

FIGS. 28A to 28C are a top view and cross-sectional views of the oxide semiconductor layer 130 with a three-layer structure. FIG. 28A is the top view. FIG. 28B illustrates a cross section in the direction of a dashed-dotted line A1-A2 in FIG. 28A. FIG. 28C illustrates a cross section in the direction of a dashed-dotted line A3-A4 in FIG. 28A. In the drawings, some components are enlarged, reduced in size, or omitted for easy understanding.

Oxide semiconductor layers with different compositions, for example, can be used as an oxide semiconductor layer 130a, an oxide semiconductor layer 130b, and an oxide semiconductor layer 130c.

Figure 29A:
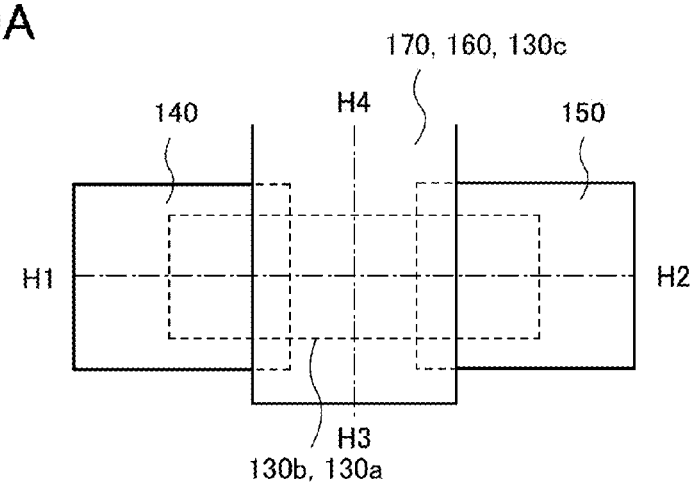
FIGS. 29A and 29B are a top view and a cross-sectional view illustrating a transistor.
Figure 29B:
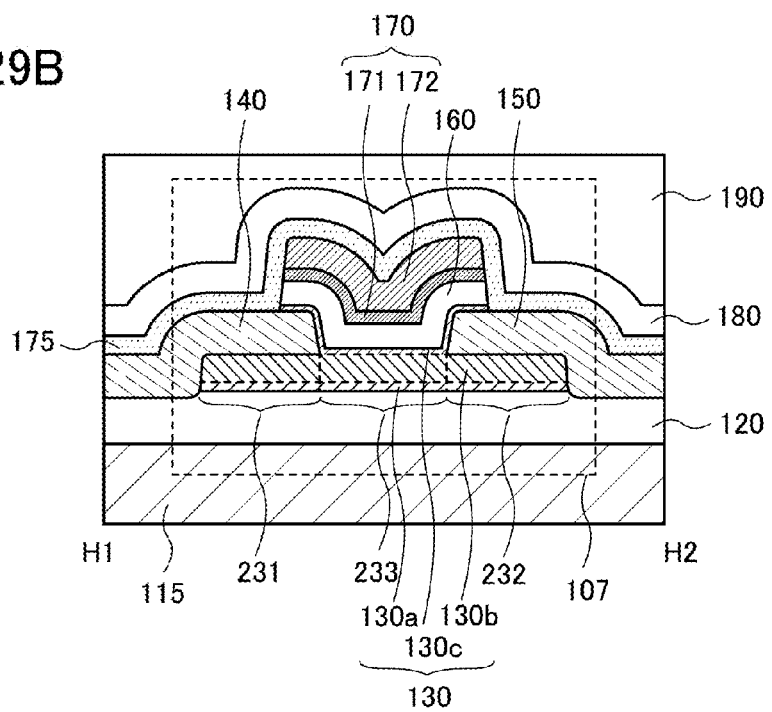
Figure 35A:
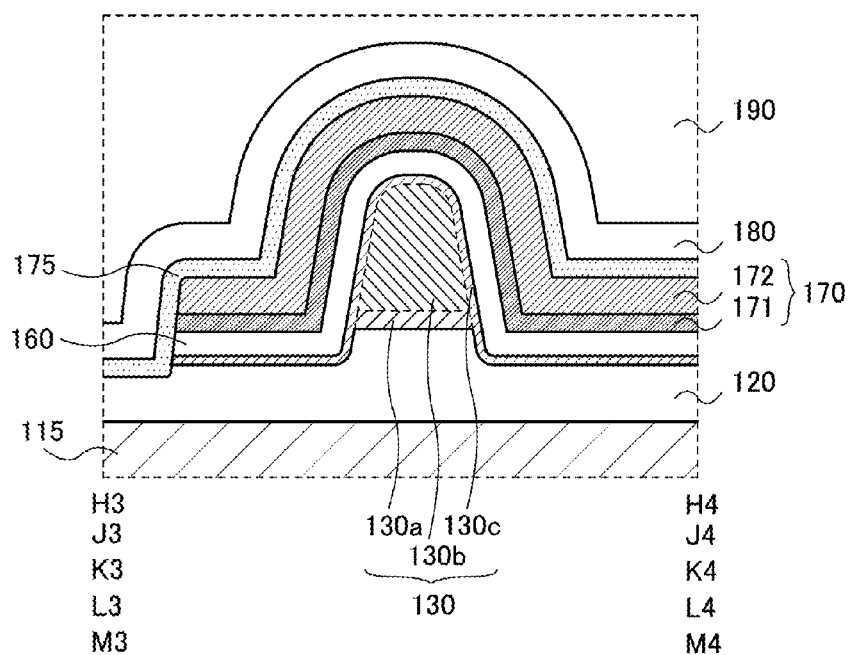
FIGS. 35A and 35B each illustrate a cross section of a transistor in the channel width direction.

The transistor of one embodiment of the present invention may have a structure illustrated in FIGS. 29A and 29B. FIG. 29A is a top view of a transistor 107. A cross section in the direction of a dashed-dotted line H1-H2 in FIG. 29A is illustrated in FIG. 29B. A cross section in the direction of a dashed-dotted line H3-H4 in FIG. 29A is illustrated in FIG. 35A. In the drawings, some components are enlarged, reduced in size, or omitted for easy understanding. The direction of the dashed-dotted line H1-H2 may be referred to as a channel length direction, and the direction of the dashed-dotted line H3-H4 may be referred to as a channel width direction.

The transistor 107 includes the insulating layer 120 in contact with the substrate 115; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. The transistor 107 may also include, for example, the insulating layer 190 (planarization film) in contact with the insulating layer 180 as necessary.

The transistor 107 has the same structure as the transistor 101 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 30A:
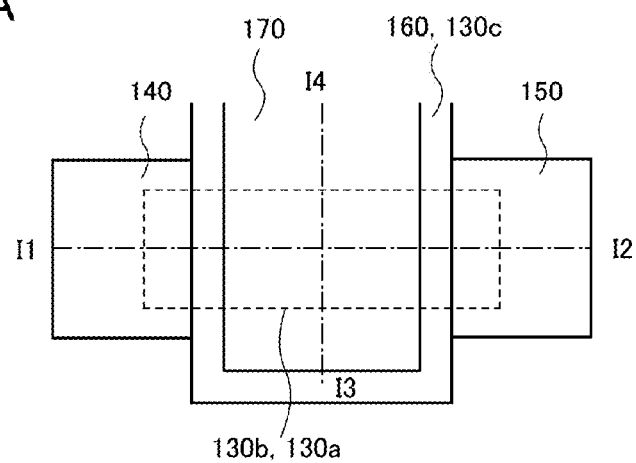
FIGS. 30A and 30B are a top view and a cross-sectional view illustrating a transistor.
Figure 30B:
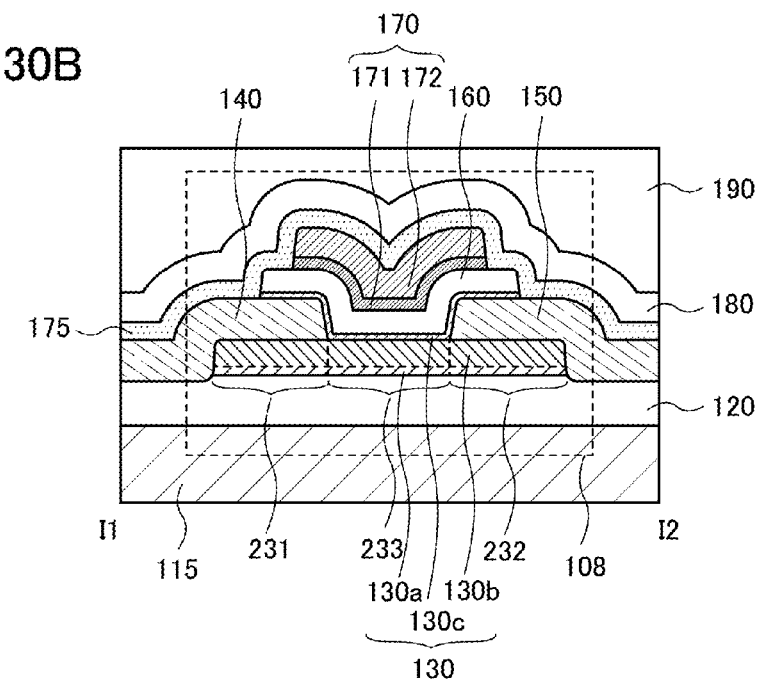
Figure 35B:
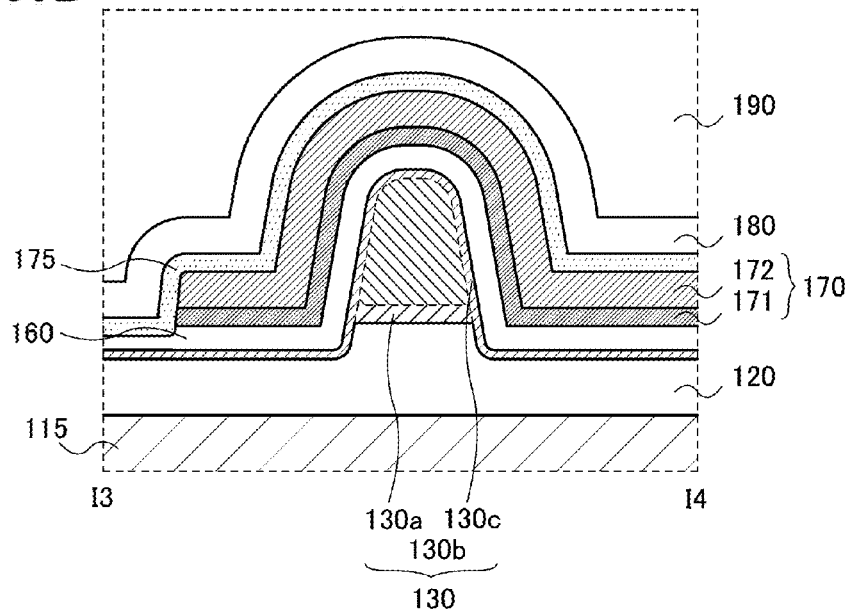
Figure 36A:
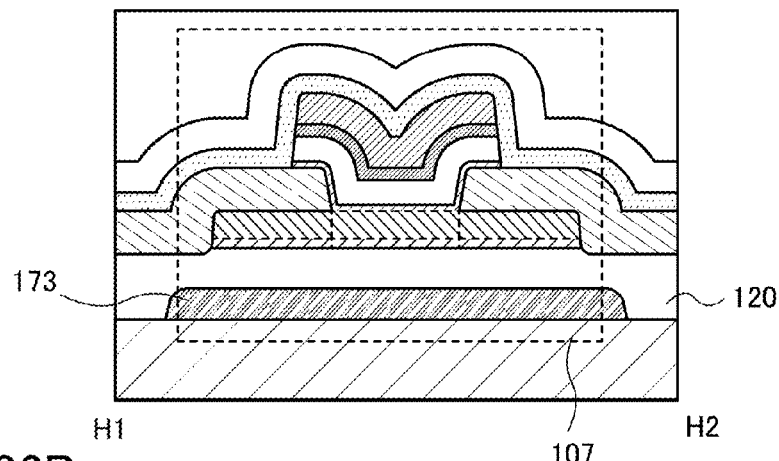
FIGS. 36A to 36C each illustrate a cross section of a transistor in the channel length direction.
Figure 36B:
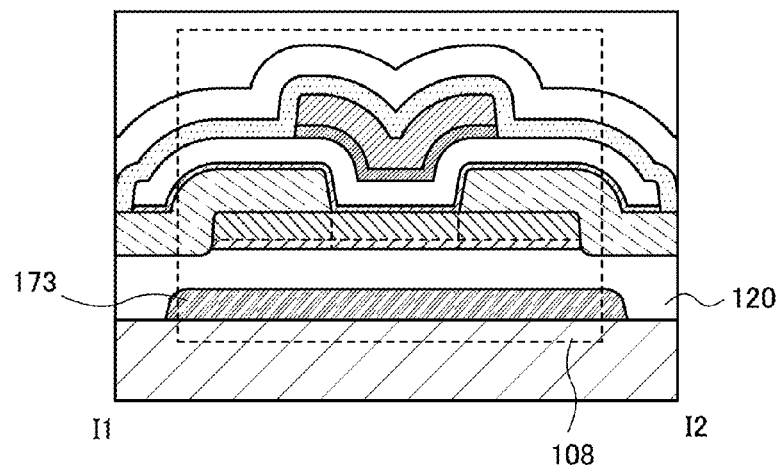
Figure 36C:
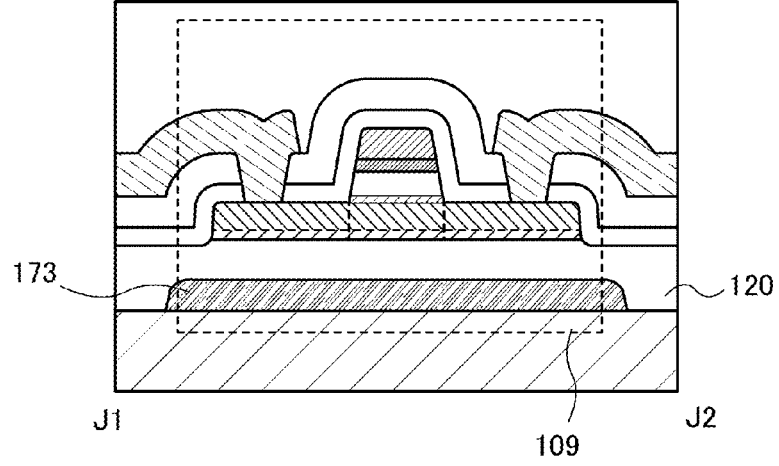
Figure 37A:
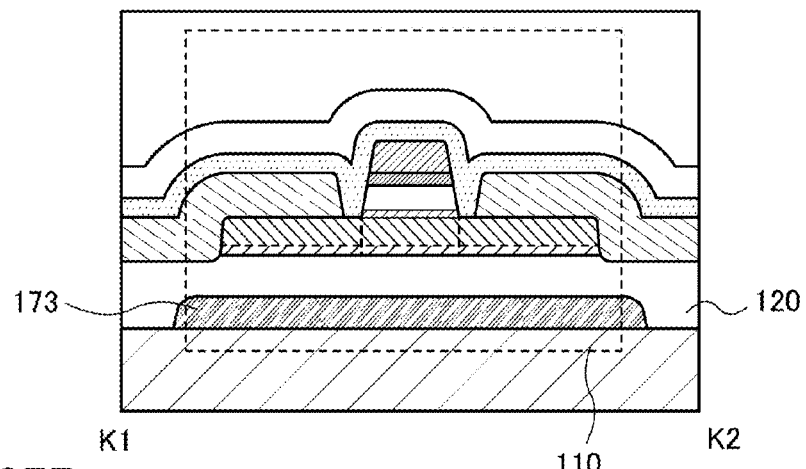
FIGS. 37A to 37C each illustrate a cross section of a transistor in the channel length direction.
Figure 37B:
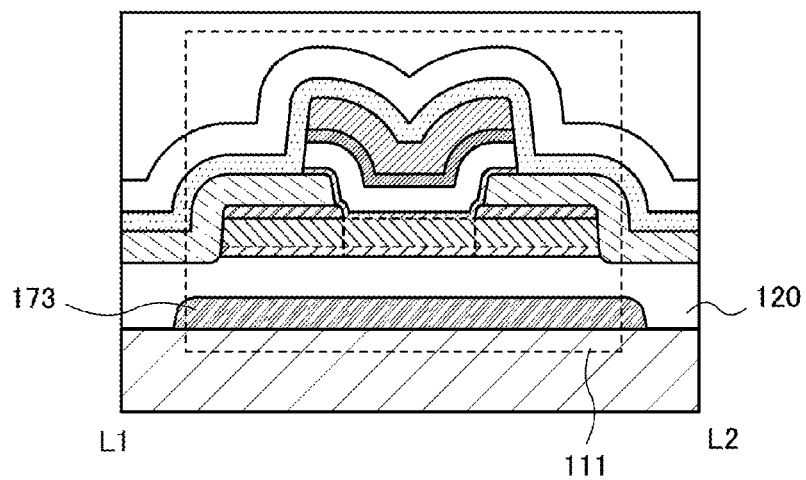
Figure 37C:
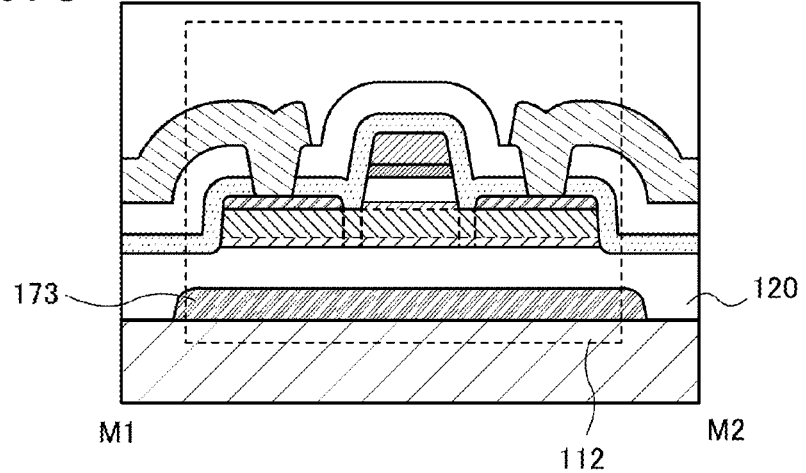

The transistor of one embodiment of the present invention may have a structure illustrated in FIGS. 30A and 30B. FIG. 30A is a top view of a transistor 108. A cross section in the direction of a dashed-dotted line I1-I2 in FIG. 30A is illustrated in FIG. 30B. A cross section in the direction of a dashed-dotted line I3-I4 in FIG. 30A is illustrated in FIG. 35B. In the drawings, some components are enlarged, reduced in size, or omitted for easy understanding. The direction of the dashed-dotted line I1-I2 may be referred to as a channel length direction, and the direction of the dashed-dotted line I3-I4 may be referred to as a channel width direction.

The transistor 108 is different from the transistor 107 in that end portions of the insulating layer 160 and the oxide semiconductor layer 130c are not aligned with the end portion of the conductive layer 170.

Figure 31A:
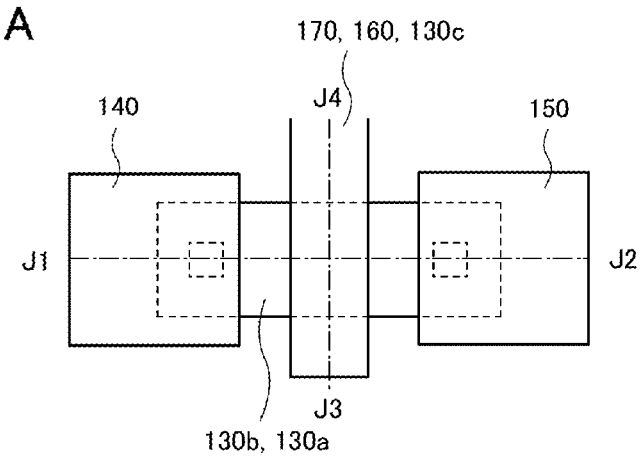
FIGS. 31A and 31B are a top view and a cross-sectional view illustrating a transistor.
Figure 31B:
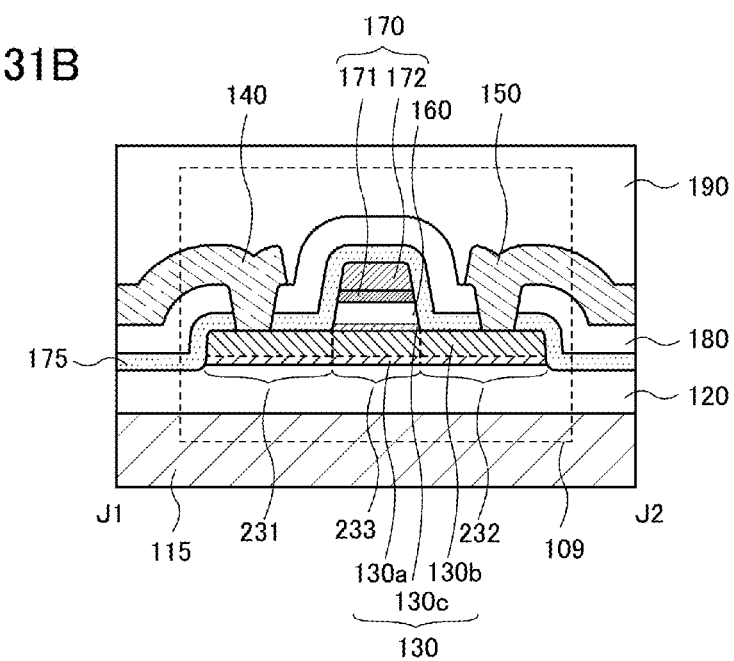

The transistor of one embodiment of the present invention may have a structure illustrated in FIGS. 31A and 31B. FIG. 31A is a top view of a transistor 109. A cross section in the direction of a dashed-dotted line J1-J2 in FIG. 31A is illustrated in FIG. 31B. A cross section in the direction of a dashed-dotted line J3-J4 in FIG. 31A is illustrated in FIG. 35A. In the drawings, some components are enlarged, reduced in size, or omitted for easy understanding. The direction of the dashed-dotted line J1-J2 may be referred to as a channel length direction, and the direction of the dashed-dotted line J3-J4 may be referred to as a channel width direction.

The transistor 109 includes the insulating layer 120 in contact with the substrate 115; a stack of the oxide semiconductor layer 130a and the oxide semiconductor layer 130b, in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. The transistor 109 may also include, for example, the insulating layer 190 (planarization film) in contact with the insulating layer 180, the conductive layer 140, and the conductive layer 150 as necessary.

The transistor 109 has the same structure as the transistor 103 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 32A:
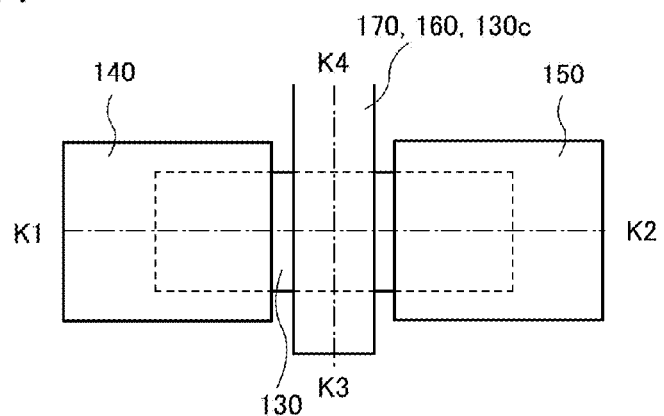
FIGS. 32A and 32B are a top view and a cross-sectional view illustrating a transistor.
Figure 32B:
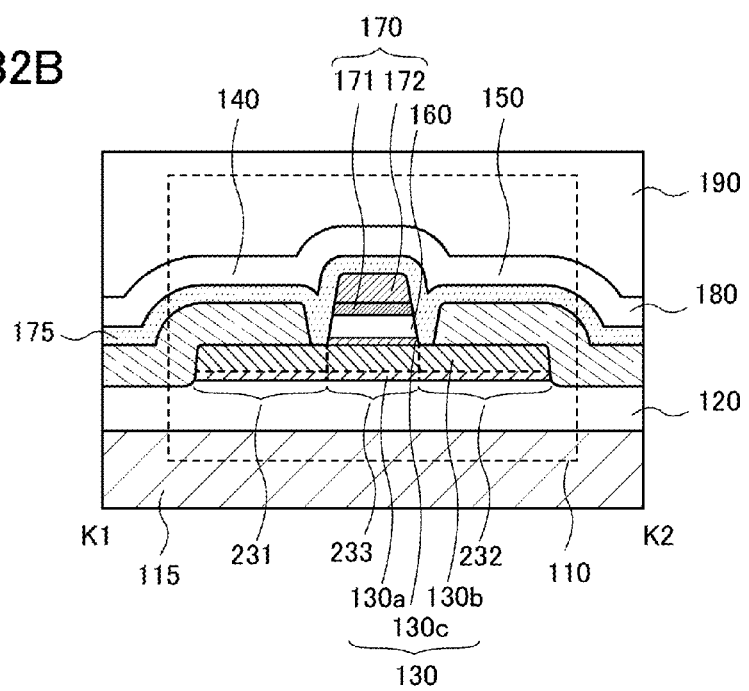

The transistor of one embodiment of the present invention may have a structure illustrated in FIGS. 32A and 32B. FIG. 32A is a top view of a transistor 110. A cross section in the direction of a dashed-dotted line K1-K2 in FIG. 32A is illustrated in FIG. 32B. A cross section in the direction of a dashed-dotted line K3-K4 in FIG. 32A is illustrated in FIG. 35A. In the drawings, some components are enlarged, reduced in size, or omitted for easy understanding. The direction of the dashed-dotted line K1-K2 may be referred to as a channel length direction, and the direction of the dashed-dotted line K3-K4 may be referred to as a channel width direction.

The transistor 110 has the same structure as the transistor 104 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 33A:
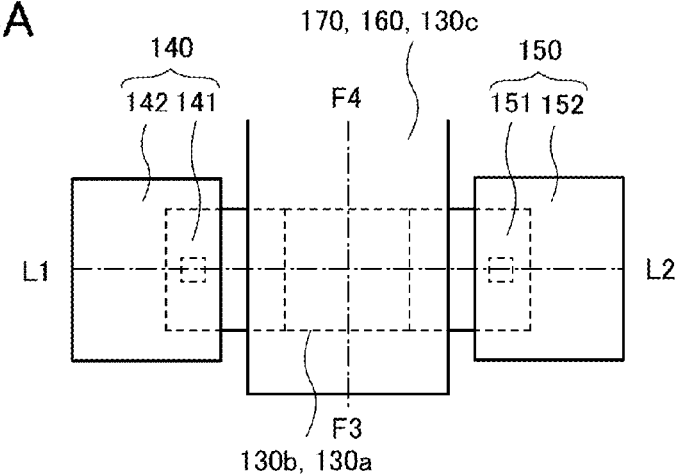
FIGS. 33A and 33B are a top view and a cross-sectional view illustrating a transistor.
Figure 33B:
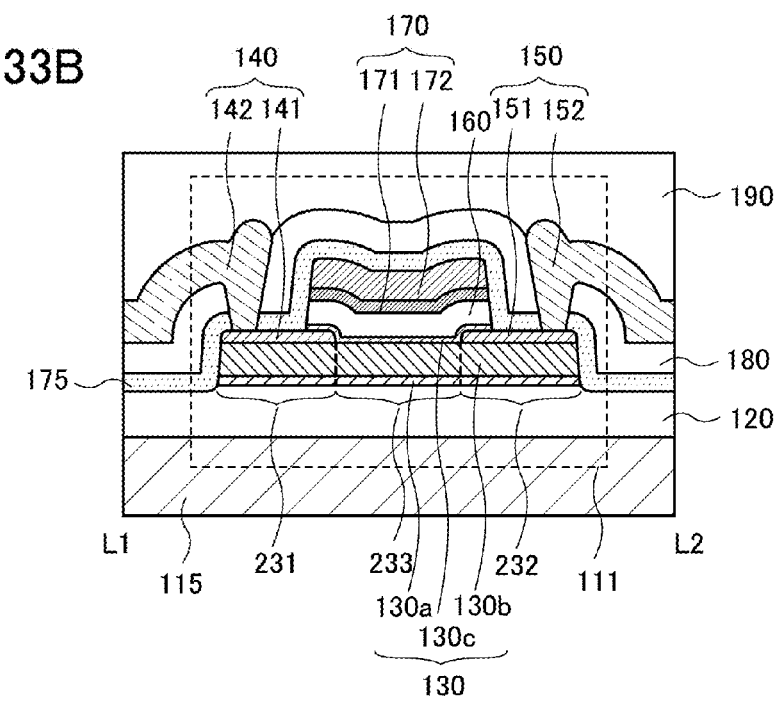

The transistor of one embodiment of the present invention may have a structure illustrated in FIGS. 33A and 33B. FIG. 33A is a top view of a transistor 111. A cross section in the direction of a dashed-dotted line L1-L2 in FIG. 33A is illustrated in FIG. 33B. A cross section in the direction of a dashed-dotted line L3-L4 in FIG. 33A is illustrated in FIG. 35A. In the drawings, some components are enlarged, reduced in size, or omitted for easy understanding. The direction of the dashed-dotted line L1-L2 may be referred to as a channel length direction, and the direction of the dashed-dotted line L3-L4 may be referred to as a channel width direction.

The transistor 111 includes the insulating layer 120 in contact with the substrate 115; a stack of the oxide semiconductor layer 130a and the oxide semiconductor layer 130b, in contact with the insulating layer 120; the conductive layer 141 and the conductive layer 151 electrically connected to the stack; the oxide semiconductor layer 130c in contact with the stack, the conductive layer 141, and the conductive layer 151; the insulating layer 160 in contact with the oxide semiconductor layer 130c; the conductive layer 170 in contact with the insulating layer 160; the insulating layer 175 in contact with the stack, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 111 may also include, for example, the insulating layer 190 (planarization film) in contact with the insulating layer 180, the conductive layer 142, and the conductive layer 152 as necessary.

The transistor 111 has the same structure as the transistor 105 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 141 and 151.

Figure 34A:
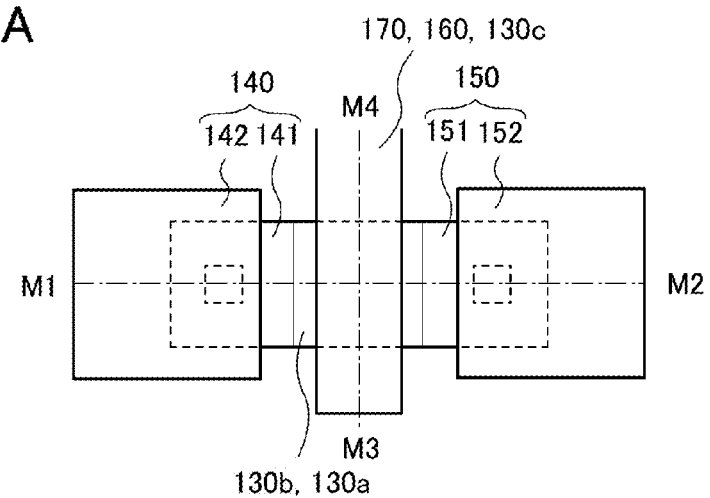
FIGS. 34A and 34B are a top view and a cross-sectional view illustrating a transistor.
Figure 34B:
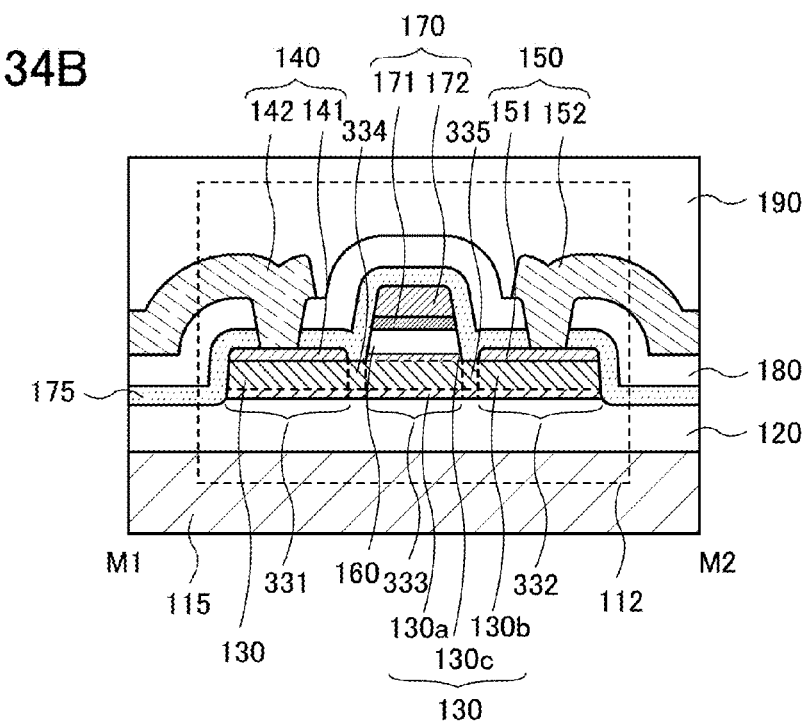

The transistor of one embodiment of the present invention may have a structure illustrated in FIGS. 34A and 34B. FIG. 34A is a top view of a transistor 112. A cross section in the direction of a dashed-dotted line M1-M2 in FIG. 34A is illustrated in FIG. 34B. A cross section in the direction of a dashed-dotted line M3-M4 in FIG. 34A is illustrated in FIG. 35A. In the drawings, some components are enlarged, reduced in size, or omitted for easy understanding. The direction of the dashed-dotted line M1-M2 may be referred to as a channel length direction, and the direction of the dashed-dotted line M3-M4 may be referred to as a channel width direction.

The transistor 112 has the same structure as the transistor 106 except that the oxide semiconductor layer 130 includes two layers (the oxide semiconductor layer 130a and the oxide semiconductor layer 130b) in the region 331, the region 332, the region 334, and the region 335 and that the oxide semiconductor layer 130 includes three layers (the oxide semiconductor layer 130a, the oxide semiconductor layer 130b, and the oxide semiconductor layer 130c) in the region 333.

Figure 38A:
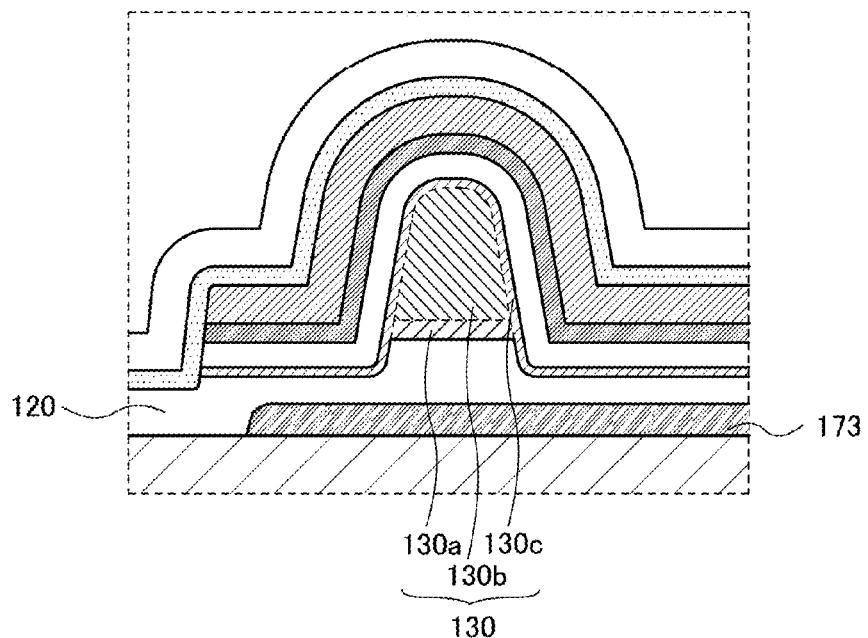
FIGS. 38A and 38B each illustrate a cross section of a transistor in the channel width direction.
Figure 38B:
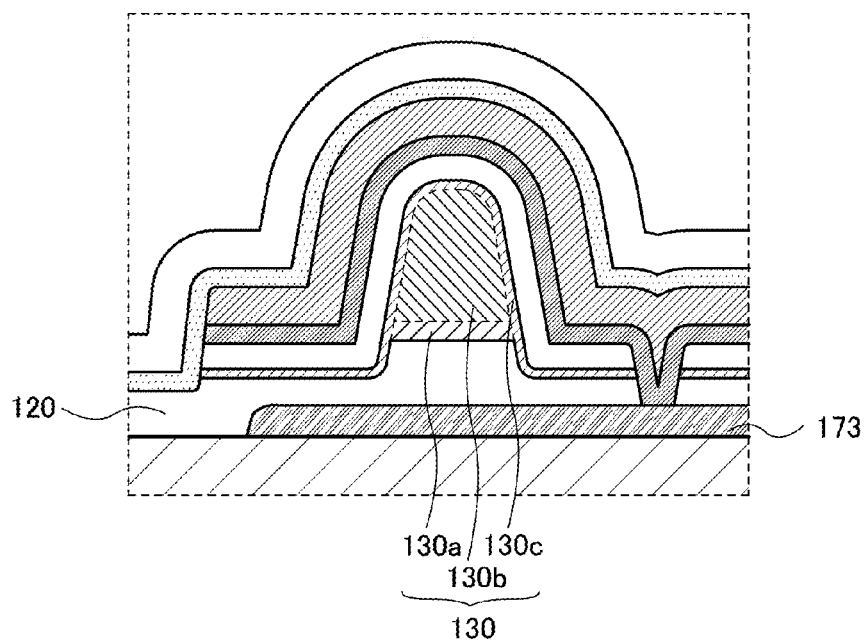

The transistor of one embodiment of the present invention may include the conductive layer 173 between the oxide semiconductor layer 130 and the substrate 115 as illustrated in the cross-sectional views in the channel length direction in FIGS. 36A to 36C and FIGS. 37A to 37C and the cross-sectional views in the channel width direction in FIGS. 38A and 38B. When the conductive layer is used as a second gate electrode layer (back gate), the on-state current can be further increased or the threshold voltage can be controlled. In the cross-sectional views in FIGS. 36A to 36C and FIGS. 37A to 37C, the width of the conductive layer 173 may be shorter than that of the oxide semiconductor layer 130. Moreover, the width of the conductive layer 173 may be shorter than that of the conductive layer 170.

Figure 39A:
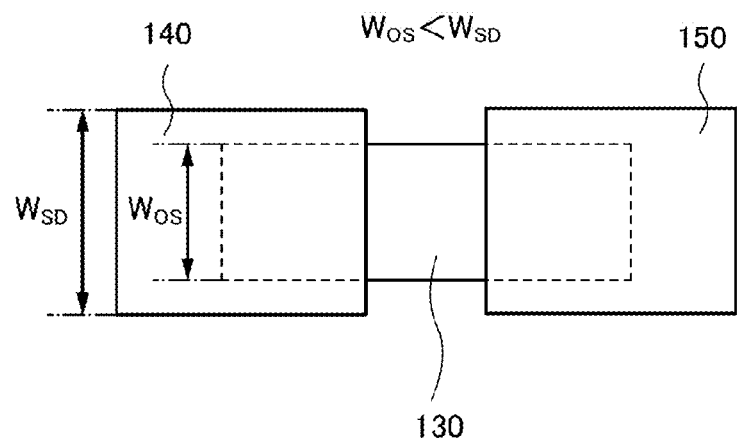
FIGS. 39A and 39B are each a top view illustrating a transistor.
Figure 39B:
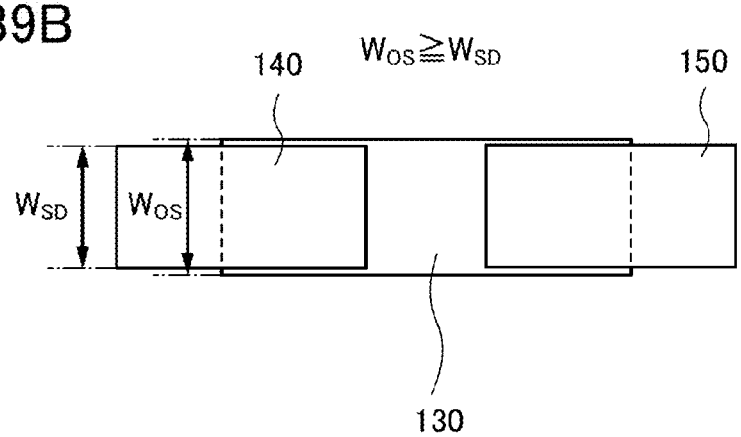

Furthermore, as shown in the top views in FIGS. 39A and 39B (showing only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor of one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layer 130b and the oxide semiconductor layer 130c and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

This embodiment can be combined as appropriate with any of the other embodiments in this specification.

Embodiment 6

In this embodiment, components of the transistors described in Embodiment 5 are described in detail.

The substrate 115 includes a silicon substrate provided with a transistor and a photodiode; and an insulating layer, a wiring, and a contact plug which are provided over the silicon substrate. The substrate 115 corresponds to the first layer 1100 and the second layer 1200 in FIG. 1A. Note that only p-channel transistors are formed using the silicon substrate; accordingly, a silicon substrate with n$^-$-type conductivity is preferably used. It is also possible to use an SOI substrate including an n$^-$-type or i-type silicon layer. A surface of the silicon substrate where the transistor is formed preferably has a (110) plane orientation. Forming a p-channel transistor with the (110) plane can increase the mobility.

The insulating layer 120 can have a function of supplying oxygen to the oxide semiconductor layer 130 as well as a function of preventing diffusion of impurities from the substrate 115. For this reason, the insulating layer 120 is preferably an insulating film containing oxygen and further preferably, the insulating layer 120 is an insulating film containing oxygen in excess of that that in the stoichiometric composition. For example, the insulating film 120 is preferably a film in which the amount of released oxygen when converted into oxygen atoms is $1.0 \times 10^{19}$ atoms/cm$^3$ or more in thermal desorption spectroscopy (TDS) analysis performed such that the surface temperature is higher than or equal to 100° C. and lower than or equal to 700° C., preferably higher than or equal to 100° C. and lower than or equal to 500° C. In the case where the substrate 115 is provided with another device, the insulating layer 120 also has a function as an interlayer insulating film. In that case, the insulating film 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, and the like, a nitride insulating film including silicon nitride, silicon nitride oxide, aluminum nitride, aluminum nitride oxide, or the like, or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b is used.

In the case where the oxide semiconductor layer 130 has a two-layer structure, a stack in which a layer corresponding to the oxide semiconductor layer 130b and a layer corresponding to the oxide semiconductor layer 130c are stacked in this order from the insulating layer 120 side is used. In such a case, the oxide semiconductor layer 130b and the oxide semiconductor layer 130c can be replaced with each other.

In the case where the oxide semiconductor layer 130 has a stacked-layer structure of four or more layers, for example, a structure in which another oxide semiconductor layer is stacked over the three-layer stack of the oxide semiconductor layer 130 described in this embodiment or a structure in which another oxide semiconductor layer is inserted in any one of the interfaces in the three-layer stack can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between the conduction band minimum and the valence band maximum (an energy gap) from an energy difference between the vacuum level and the valence band maximum (an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Further, since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, fluctuations in electrical characteristics of the transistor, such as a threshold voltage, can be reduced. Further, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface between the oxide semiconductor layer 130b and the gate insulating film (insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, an atomic ratio of any of the above metal elements in the oxide semiconductor layer 130a and the oxide semiconductor layer 130c is 1.5 times or more, preferably 2 times or more, further preferably 3 times or more as much as that in the oxide semiconductor layer 130b. Any of the above metal elements is strongly bonded to oxygen and thus has a function of suppressing generation of oxygen vacancy in the oxide semiconductor layer 130a and the oxide semiconductor layer 130c. That is, oxygen vacancy is less likely to be generated in the oxide semiconductor layer 130a and the oxide semiconductor layer 130c than in the oxide semiconductor layer 130b.

An oxide semiconductor that can be used for each of the oxide semiconductor layers 130a, 130b, and 130c preferably contains at least indium (In) or zinc (Zn). Both In and Zn are preferably contained. In order to reduce fluctuations in electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. In the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a and the oxide semiconductor layer 130c.

Note that in order that a transistor in which an oxide semiconductor layer serves as a channel have stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the concentration of hydrogen at a certain depth of the oxide semiconductor layer or in a region of the oxide semiconductor layer is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Further, the concentration of nitrogen at a certain depth of the oxide semiconductor layer or in a region of the oxide semiconductor layer is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the concentration of carbon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

A transistor in which a highly purified oxide semiconductor film is used for a channel formation region as described above has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be formed in the oxide semiconductor layer 130b; thus, the transistor can have a high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (particularly, a well structure having a U shape in which the conduction band minimums are continuous (U-shape well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an atomic ratio of In to Ga and Zn of 1:3:2, 1:3:3, 1:3:4, 1:3:6, 1:4:5, 1:6:4, and 1:9:6 can be used for an In—Ga—Zn oxide of the oxide semiconductor layer 130a and the oxide semiconductor layer 130c, and an In—Ga—Zn oxide whose atomic ratio of In to Ga and Zn is 1:1:1, 2:1:3, 5:5:6, or 3:1:2 can be used for the oxide semiconductor layer 130b. In each of the oxide semiconductor layers 130a, 130b, and 130c, the proportion of each atom in the atomic ratio varies within a range of ±20% as an error.

The oxide semiconductor layer 130b of the oxide semiconductor layer 130 serves as a well, so that a channel is formed in the oxide semiconductor layer 130b in a transistor including the oxide semiconductor layer 130. Note that since the conduction band minimums are continuous, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

Thus, to reduce fluctuations in the threshold voltage of the transistor, energy differences of at least certain values between the conduction band minimum of the oxide semiconductor layer 130b and the conduction band minimum of each of the oxide semiconductor layer 130a and the oxide semiconductor layer 130c are necessary. Each of the energy differences is preferably greater than or equal to 0.1 eV, further preferably greater than or equal to 0.15 eV.

The oxide semiconductor layer 130a, the oxide semiconductor layer 130b, and the oxide semiconductor layer 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, Sc, and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. Note that in the transistors 105, 106, 111, and 112, for example, it is possible to use W for the conductive layer 141 and the conductive layer 151 and use a stack of Ti and Al for the conductive layer 142 and the conductive layer 152.

The above materials are capable of extracting oxygen from an oxide semiconductor film. Therefore, in a region of the oxide semiconductor film that is in contact with any of the above materials, oxygen is released from the oxide semiconductor film and oxygen vacancy is formed. Hydrogen slightly contained in the layer and the oxygen vacancy are bonded to each other, whereby the region is markedly changed to an n-type region. Accordingly, the n-type region can serve as a source or a drain of the transistor.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain lanthanum (La), nitrogen, or zirconium (Zr) as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide having a crystal structure is formed might have interface states due to defects. The interface states might function as trap centers. Therefore, in the case where the hafnium oxide is provided close to the channel region of the transistor, the electrical characteristics of the transistor might deteriorate owing to the interface states. In order to reduce the adverse effect of the interface state, in some cases, it is preferable to separate the channel region of the transistor and the hafnium oxide from each other by providing another film therebetween. The film has a buffer function. The film having a buffer function may be included in the insulating layer 160 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

Meanwhile, charge is trapped by the interface states (trap centers) of the hafnium oxide having a crystal structure, whereby the threshold voltage of the transistor may be controlled. In order to make the electric charge exist stably, for example, a semiconductor or an insulator having a larger energy gap than hafnium oxide may be provided between the channel region and the hafnium oxide. Alternatively, a semiconductor or an insulator having smaller electron affinity than the hafnium oxide is provided. The film having a buffer function may be formed using a semiconductor or an insulator having higher ionization energy than hafnium oxide. Use of such a semiconductor or an insulator inhibits discharge of the charge trapped by the interface states, so that the charge can be retained for a long time.

Examples of such an insulator include silicon oxide and silicon oxynitride. In order to make the interface state in the insulating layer 160 trap an electric charge, an electron may be transferred from the oxide semiconductor layer 130 toward the gate electrode layer (conductive layer 170). As a specific example, the potential of the gate electrode layer (conductive layer 170) is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the insulating layer 160 or the like shifts in the positive direction. The amount of electrons to be trapped (the amount of change in threshold voltage) can be controlled by adjusting a voltage of the gate electrode layer (conductive layer 170) or time in which the voltage is applied. Note that a location in which charge is trapped is not necessarily limited to the inside of the insulating layer 160 as long as charge can be trapped therein. A stacked-layer film having a similar structure may be used for another insulating layer.

The insulating layer 120 and the insulating layer 160 in contact with the oxide semiconductor layer 130 may include a region with a low density of states of nitrogen oxide. As the oxide insulating layer with a low density of states of a nitrogen oxide, a silicon oxynitride film that releases less nitrogen oxide, and an aluminum oxynitride film that releases less nitrogen oxide can be used.

Note that a silicon oxynitride film that releases less nitrogen oxide is a film of which the amount of released ammonia is larger than the amount of released nitrogen oxide in TDS analysis; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, using an insulating film containing hydrogen as the insulating layer 175 allows the oxide semiconductor layer to be partly changed to n-type. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. Further, oxygen contained in the aluminum oxide film can be diffused into the oxide semiconductor layer.

Further, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancy formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In the transistors 107 to 112 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in the side surface direction in addition to the perpendicular direction. In other words, a gate electric field is applied to the entire channel formation layer and an effective channel width is increased, leading to a further increase in the on-state current.

Furthermore, in the transistor of one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor of one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, since the threshold voltage of the transistor becomes stable, long-term reliability of the semiconductor device can be improved. In addition, the transistor of one embodiment of the present invention is suitable for a highly integrated semiconductor device because deterioration of electrical characteristics due to miniaturization is reduced.

This embodiment can be combined with any of the other embodiments in this specification as appropriate.

Embodiment 7

In this embodiment, methods for manufacturing the transistors 102 and 107 described in Embodiment 5 are described.

First, an example of a method for manufacturing a silicon transistor included in the substrate 115 is described. An $n^-$-type single crystal silicon substrate is used as a silicon substrate, and an element formation region isolated with an insulating layer (also referred to as a field oxide film) is formed in the surface. The element formation region can be formed by local oxidation of silicon (LOCOS), shallow trench isolation (STI), or the like.

Here, the substrate is not limited to the single crystal silicon substrate. A silicon on insulator (SOI) substrate or the like can be used as well.

Next, a gate insulating film is formed so as to cover the element formation region. For example, a silicon oxide film is formed by oxidation of a surface of the element formation region by heat treatment. Furthermore, after the silicon oxide film is formed, a surface of the silicon oxide film may be nitrided by nitriding treatment.

Next, a conductive film is formed so as to cover the gate insulating film. The conductive film can be formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as a main component. Alternatively, a metal nitride film obtained by nitridation of any of these elements can be used. Alternatively, a semiconductor material typified by polycrystalline silicon doped with an impurity element such as phosphorus can be used.

Then, the conductive film is selectively etched, whereby a gate electrode layer is formed over the gate insulating film.

Next, an insulating film such as a silicon oxide film or a silicon nitride film is formed to cover the gate electrode layer and etch back is performed, whereby sidewalls are formed on side surfaces of the gate electrode layer.

Next, a resist mask is selectively formed so as to cover regions except the element formation region, and an impurity element is added with the use of the resist mask and the gate electrode layer as masks, whereby $p^+$-type impurity regions are formed. Here, in order to form a p-channel transistor, an impurity element imparting p-type conductivity such as boron (B) or gallium (Ga) can be used as the impurity element.

Then, in order to form a photodiode, a resist mask is selectively formed. Here, in order to form a cathode of the photodiode over a surface of the single crystal silicon substrate which is the same as a surface where the transistor is formed, an $n^+$-type shallow impurity region is formed by introduction of phosphorus (P) or arsenic (As) that are impurity elements imparting n-type conductivity. Furthermore, a $p^+$-type deep impurity region may be formed in order to electrically connect an anode of the photodiode and a wiring. Note that the anode (the $p^+$-type shallow impurity region) of the photodiode is formed over a surface of the single crystal silicon substrate opposite to the surface where the cathode of the photodiode is formed in a later step; therefore, description thereof is omitted in this embodiment.

Through the above steps, a p-channel transistor including an active region in the silicon substrate is completed. Note that a passivation film such as a silicon nitride film is preferably formed over the transistor.

Next, an interlayer insulating film is formed using a silicon oxide film or the like over the silicon substrate where the transistor is formed, and contact plugs and wirings are formed. In addition, as described in Embodiment 1, an insulating layer made of aluminum oxide or the like for preventing diffusion of hydrogen is formed. The substrate 115 includes the silicon substrate where the transistor and the photodiode are formed, and the interlayer insulating layer, the wirings, the contact plugs and the like formed over the silicon substrate.

A method for manufacturing the transistor 102 is described with reference to FIGS. 40A to 40C and FIGS. 41A to 41C. A cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

The case where the oxide semiconductor layer 130 has a three-layer structure of the oxide semiconductor layer 130*a*, the oxide semiconductor layer 130*b*, and the oxide semiconductor layer 130*c* is described as an example. In the case where the oxide semiconductor layer 130 has a two-layer structure, the oxide semiconductor layer 130*a* and the oxide semiconductor layer 130*b* are used. In the case where the oxide semiconductor layer 130 has a single-layer structure, the oxide semiconductor layer 130*b* is used.

First, the insulating layer 120 is formed over the substrate 115. Embodiment 3 can be referred to for description of the kinds of the substrate 115 and a material used for the insulating layer 120. The insulating layer 120 can be formed by a sputtering method, a chemical vapor deposition (CVD) method, a molecular beam epitaxy (MBE) method, or the like.

Oxygen may be added to the insulating layer 120 by an ion implantation method, an ion doping method, a plasma immersion ion implantation method, plasma treatment, or the like. Adding oxygen enables the insulating layer 120 to supply oxygen much easily to the oxide semiconductor layer 130.

In the case where a surface of the substrate 115 is made of an insulator and there is no influence of impurity diffusion to the oxide semiconductor layer 130 to be formed later, the insulating layer 120 is not necessarily provided.

Figure 40A:
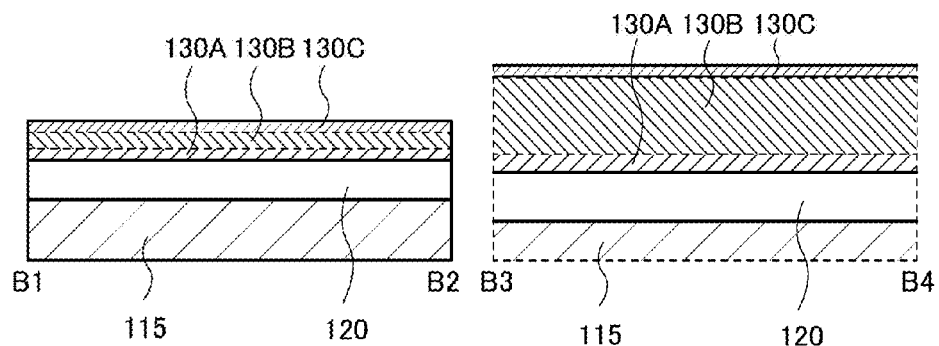
FIGS. 40A to 40C illustrate a method for manufacturing a transistor.

Next, an oxide semiconductor film 130A to be the oxide semiconductor layer 130*a*, an oxide semiconductor film 130B to be the oxide semiconductor layer 130*b*, and an oxide semiconductor film 130C to be the oxide semiconductor layer 130*c* are formed over the insulating layer 120 by a sputtering method, a CVD method, an MBE method, or the like (see FIG. 40A).

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 3 can be used. For example, an In—Ga—Zn oxide whose atomic ratio of In to Ga and Zn is 1:3:6, 1:3:4, 1:3:3, or 1:3:2 can be used for the oxide semiconductor film 130A, an In—Ga—Zn oxide whose atomic ratio of In to Ga and Zn is 1:1:1, 3:1:2, or 5:5:6 can be used for the oxide semiconductor film 130B, and an In—Ga—Zn oxide whose atomic ratio of In to Ga and Zn is 1:3:6, 1:3:4, 1:3:3, and 1:3:2 can be used for the oxide semiconductor film 130C. For the oxide semiconductor film 130A and the oxide semiconductor film 130C, an oxide semiconductor like gallium oxide may be used. In each of the oxide semiconductor films 130A, 130B, and 130C, the proportion of each atom in the atomic ratio varies within a range of ±20% as an error. In the case where a sputtering method is used for deposition, the above material can be used as a target.

Note that as described in detail in Embodiment 3, a material that has an electron affinity higher than that of the oxide semiconductor film 130A and that of the oxide semiconductor film 130C is used for the oxide semiconductor film 130B.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130*a*, the oxide semiconductor layer 130*b*, and the oxide semiconductor layer 130*c* described later.

Next, a first conductive layer is formed over the oxide semiconductor film 130A. The first conductive layer can be formed by the following method, for example.

First, a first conductive film is formed over the oxide semiconductor film 130A. As the first conductive film, a single layer or a stacked layer can be formed using a material selected from Al, Cr, Cu, Ta, Ti, Mo, W, Ni, Mn, Nd, and Sc and alloys of any of these metal materials.

Next, a negative resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography.

Then, the first conductive film is selectively etched using the first resist mask and the first resist mask is subjected to ashing; thus, the conductive layer is formed.

Figure 40B:
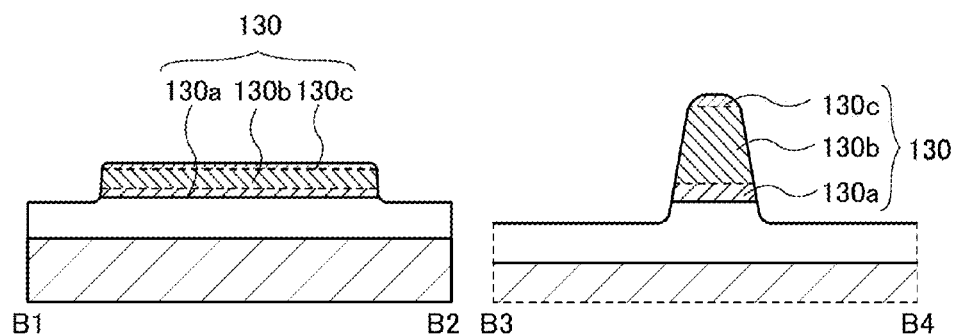
Figure 40C:
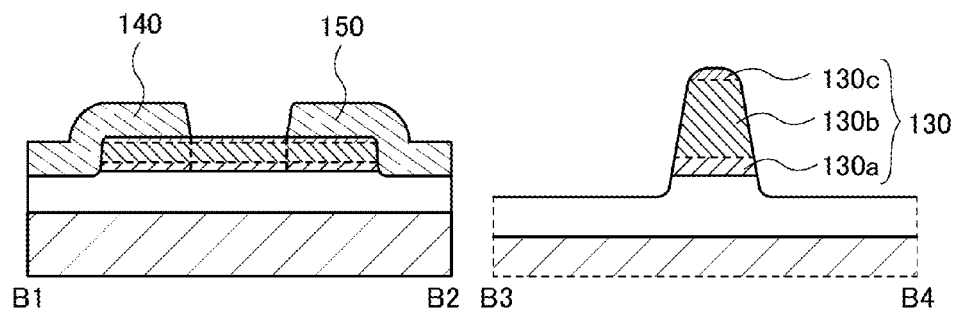

Next, the oxide semiconductor film 130A, the oxide semiconductor film 130B, and the oxide semiconductor film 130C are selectively etched using the conductive layer as a hard mask and the conductive layer is removed; thus, the oxide semiconductor layer 130 including a stack of the oxide semiconductor layer 130a, the oxide semiconductor layer 130b, and the oxide semiconductor layer 130c is formed (see FIG. 40B). It is also possible to form the oxide semiconductor layer 130 using the first resist mask, without forming the conductive layer. Here, oxygen ions may be implanted into the oxide semiconductor layer 130.

Next, a second conductive film is formed to cover the oxide semiconductor layer 130. The second conductive film can be formed using a material that can be used for the conductive layer 140 and the conductive layer 150 described in Embodiment 6. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 40C).

Next, an insulating film 160A serving as a gate insulating film is formed over the oxide semiconductor layer 130, the conductive layer 140, and the conductive layer 150. The insulating film 160A can be formed using a material that can be used for the insulating layer 160 described in Embodiment 6. A sputtering method, a CVD method, an MBE method, or the like can be used for the formation of the insulating film 160A.

After that, second heat treatment may be performed. The second heat treatment can be performed in a condition similar to that of the first heat treatment. The second heat treatment enables oxygen implanted into the oxide semiconductor layer 130 to diffuse into the entire oxide semiconductor layer 130. Note that it is possible to obtain this effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 3. A sputtering method, a CVD method, an MBE method, or the like can be used for the formation of the third conductive film 171A and the fourth conductive film 172A.

Figure 41A:
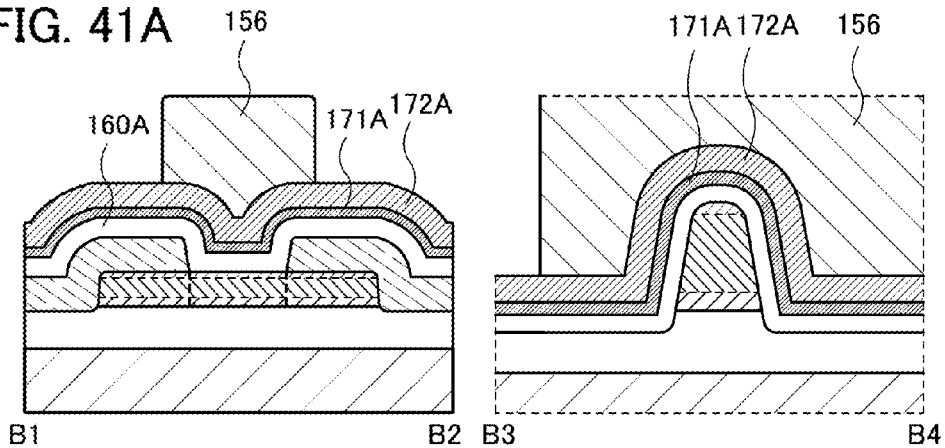
FIGS. 41A to 41C illustrate a method for manufacturing a transistor.
Figure 41B:
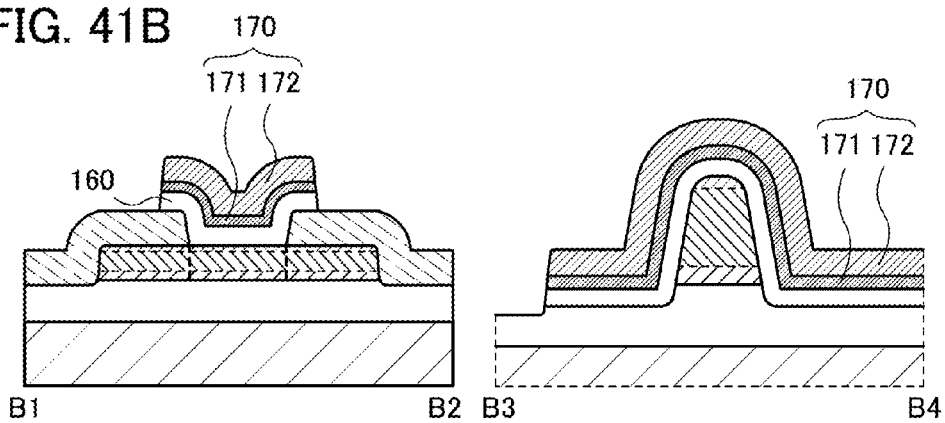

Next, a third resist mask 156 is formed over the fourth conductive film 172A (see FIG. 41A). The third conductive film 171A, the fourth conductive film 172A, and the insulating film 160A are selectively etched using the resist mask, whereby the conductive layer 170 including the conductive layer 171 and the conductive layer 172 and the insulating layer 160 are formed (see FIG. 41B). Note that if the insulating film 160A is not etched, the transistor 102 can be manufactured.

After that, the insulating layer 175 is formed over the oxide semiconductor layer 130, the conductive layer 140, the conductive layer 150, the insulating layer 160, and the conductive layer 170. Embodiment 6 can be referred to for description of a material used for the insulating layer 175. In the transistor 101, an aluminum oxide film is preferably used. The insulating layer 175 can be formed by a sputtering method, a CVD method, an MBE method, or the like.

Figure 41C:
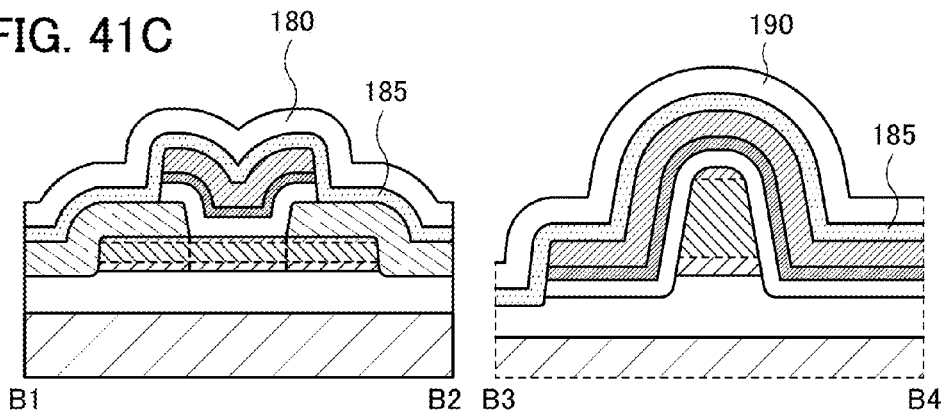

Next, the insulating layer 180 is formed over the insulating layer 175 (see FIG. 41C). Embodiment 3 can be referred to for description of a material used for the insulating layer 180. The insulating layer 180 can be formed by a sputtering method, a CVD method, an MBE method, or the like.

Oxygen may be added to the insulating layer 175 and/or the insulating layer 180 by an ion implantation method, an ion doping method, a plasma immersion ion implantation method, plasma treatment, or the like. Adding oxygen enables the insulating layer 175 and/or the insulating layer 180 to supply oxygen much easily to the oxide semiconductor layer 130.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancy in the oxide semiconductor layer 130 can be reduced.

Next, a method for manufacturing the transistor 107 is described. Note that detailed description of steps similar to those for manufacturing the transistor 102 described above is omitted.

Figure 42A:
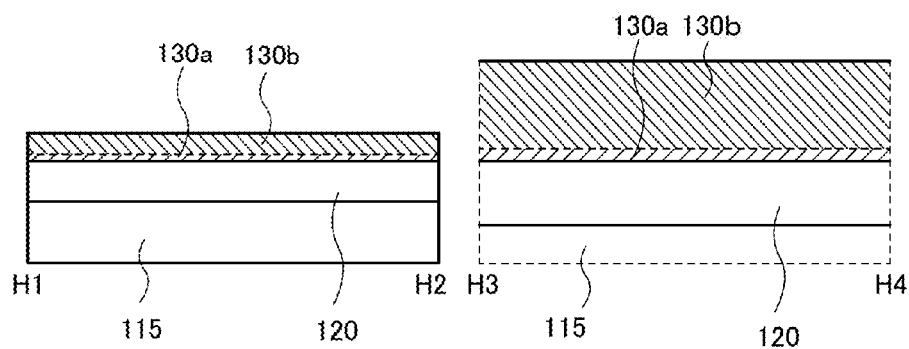
FIGS. 42A to 42C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer by a sputtering method, a CVD method, an MBE method, or the like (see FIG. 42A).

Figure 42B:
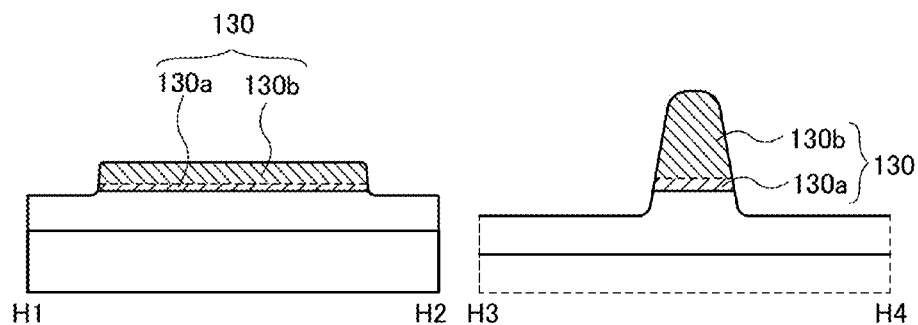

Next, the first conductive film is formed over the oxide semiconductor film 130B, and the conductive layer is formed using the first resist mask in the above-described manner. Then, the oxide semiconductor film 130A and the oxide semiconductor film 130B are selectively etched using the conductive layer as a hard mask, and the conductive layer is removed, whereby a stack of the oxide semiconductor layer 130a and the oxide semiconductor layer 130b is formed (see FIG. 42B). It is also possible to form the stack using the first resist mask, without forming the hard mask. Here, oxygen ions may be implanted into the oxide semiconductor layer 130.

Figure 42C:
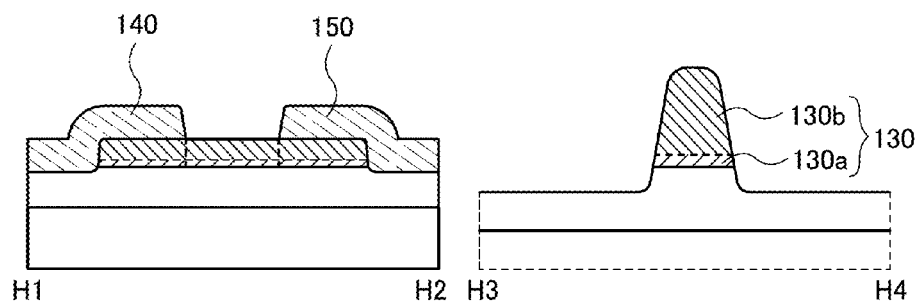

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 42C).

After that, the oxide semiconductor film 130C to be the oxide semiconductor layer 130c is formed over the stack of the oxide semiconductor layer 130a and the oxide semiconductor layer 130b, the conductive layer 140, and the conductive layer 150. Furthermore, the insulating film 160A serving as a gate insulating film, the third conductive film 171A serving as the conductive layer 170, and the fourth conductive film 172A are formed over the oxide semiconductor film 130C.

Figure 43A:
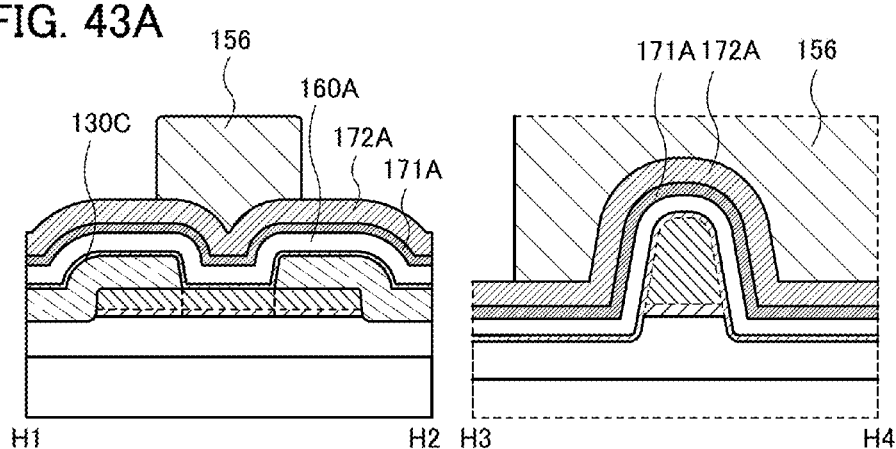
FIGS. 43A to 43C illustrate a method for manufacturing a transistor.
Figure 43B:
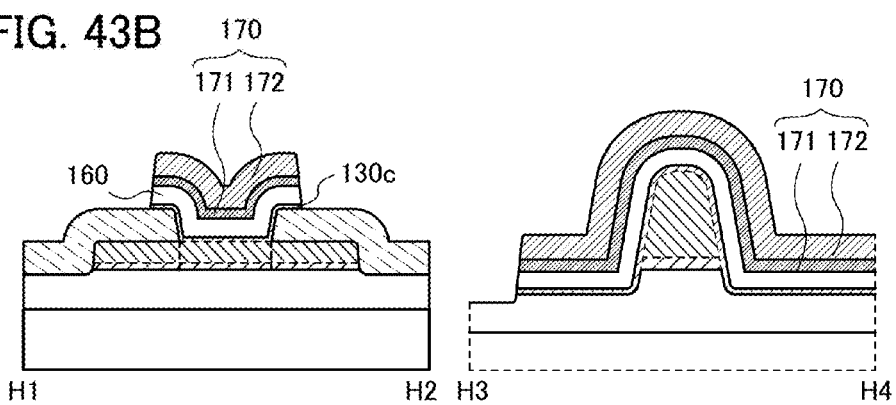

Then, the third resist mask 156 is formed over the fourth conductive film 172A (see FIG. 43A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 43B). Note that if the insulating film 160A and the oxide semiconductor film 130C are etched using a fourth resist mask, the transistor 108 can be manufactured.

Figure 43C:
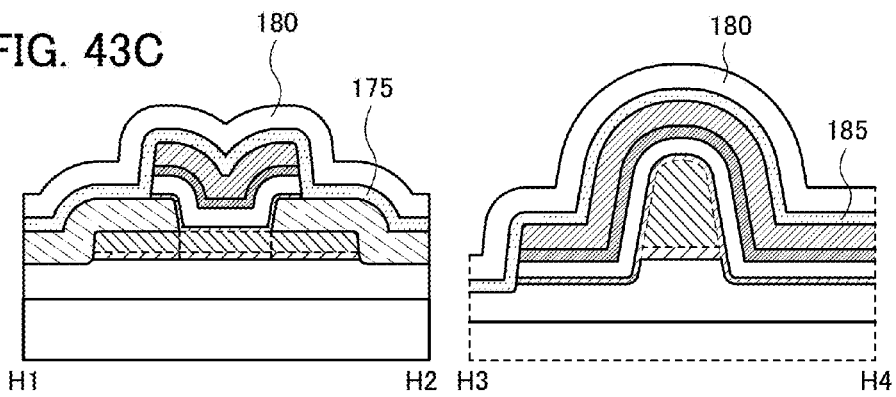

Next, the insulating layer 175 and the insulating layer 180 are formed over the insulating layer 120, the oxide semiconductor layer 130 (the oxide semiconductor layer 130a, the oxide semiconductor layer 130*b*, and the oxide semiconductor layer 130*c*), the conductive layer 140, the conductive layer 150, the insulating layer 160, and the conductive layer 170 (see FIG. 43C).

Through the above steps, the transistor 107 can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—$ZnO_x$ film (x>0) is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide and a hafnium amide such as hafnium tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—$ZnO_x$ film (x>0), is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

Embodiment 8

In this embodiment, an oxide semiconductor film that can be used for a transistor of one embodiment of the present invention is described.

Note that in this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 44A:
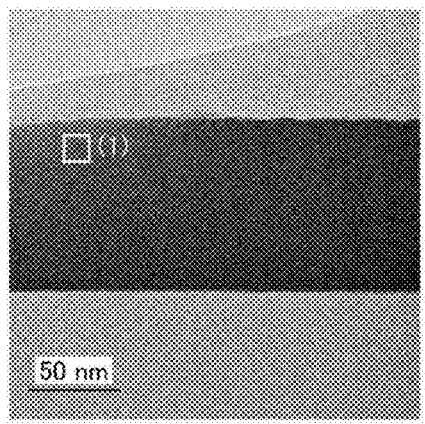
FIGS. 44A to 44D are Cs-corrected high-resolution TEM images of a cross section of a CAAC-OS and a cross-sectional schematic view of the CAAC-OS.

A CAAC-OS observed with TEM is described below. FIG. 44A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 44B:
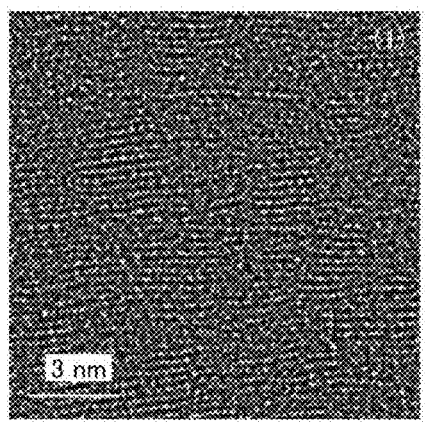

FIG. 44B is an enlarged Cs-corrected high-resolution TEM image of a region (1) in FIG. 44A. FIG. 44B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 44C:
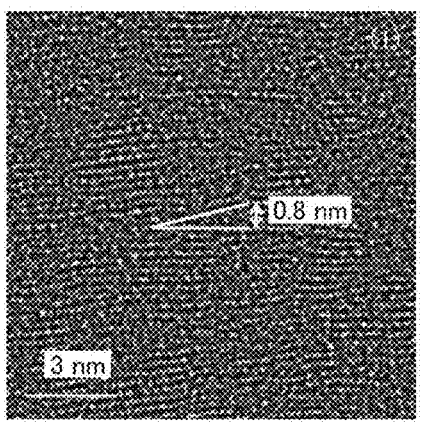

As shown in FIG. 44B, the CAAC-OS has a characteristic atomic arrangement. The characteristic atomic arrangement is denoted by an auxiliary line in FIG. 44C. FIGS. 44B and 44C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 44D:
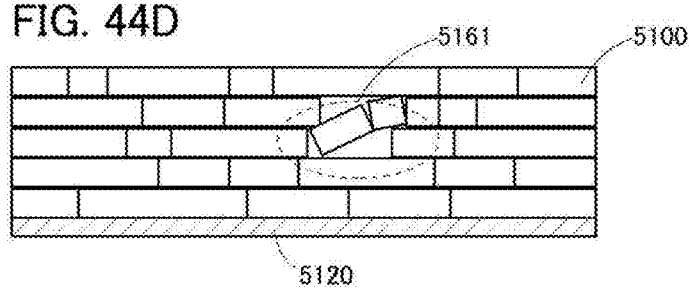

Here, according to the Cs-corrected high-resolution TEM images, the schematic arrangement of pellets 5100 of a CAAC-OS over a substrate 5120 is illustrated by such a structure in which bricks or blocks are stacked (see FIG. 44D). The part in which the pellets are tilted as observed in FIG. 44C corresponds to a region 5161 shown in FIG. 44D.

Figure 45A:
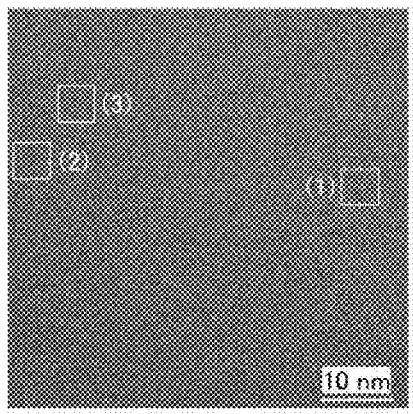
FIGS. 45A to 45D are Cs-corrected high-resolution TEM images of a plane of a CAAC-OS.
Figure 45B:
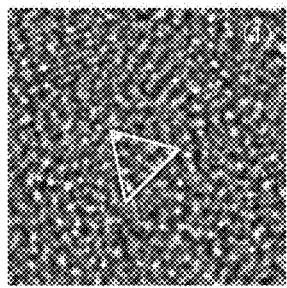
Figure 45C:
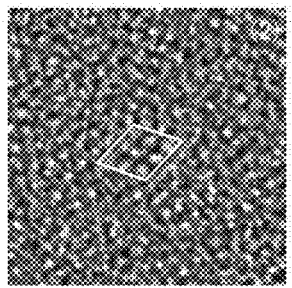
Figure 45D:
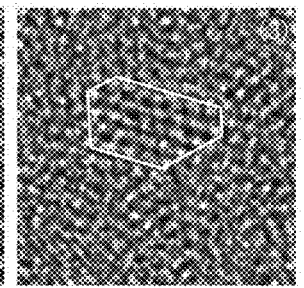

FIG. 45A shows a Cs-corrected high-resolution TEM image of a plane of the CAAC-OS observed from a direction substantially perpendicular to the sample surface. FIGS. 45B, 45C, and 45D are enlarged Cs-corrected high-resolution TEM images of regions (1), (2), and (3) in FIG. 45A, respectively. FIGS. 45B, 45C, and 45D indicate that metal atoms are arranged in a triangular, quadrangular, or hexagonal configuration in a pellet. However, there is no regularity of arrangement of metal atoms between different pellets.

Figure 46A:
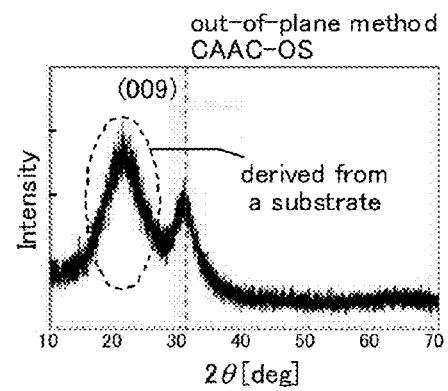
FIGS. 46A to 46C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 46A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 46B:
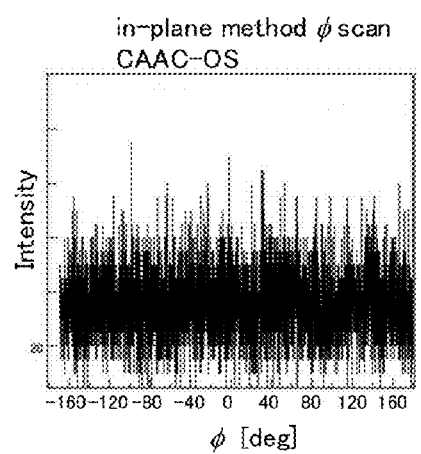
Figure 46C:
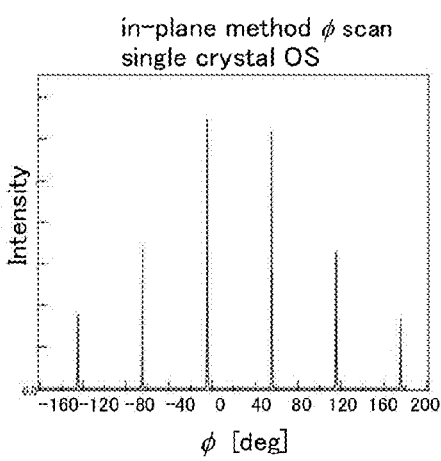

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 46B, a peak is not clearly observed. In contrast, in the case of a single crystal oxide semiconductor of InGaZnO$_4$, when φ scan is performed with 2θ fixed at around 56°, as shown in FIG. 46C, six peaks which are derived from crystal planes equivalent to the (110) plane are observed. Accordingly, the structural analysis using XRD shows that the directions of a-axes and b-axes are irregularly oriented in the CAAC-OS.

Figure 47A:
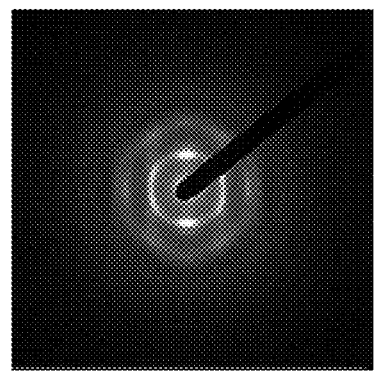
FIGS. 47A and 47B show electron diffraction patterns of a CAAC-OS.
Figure 47B:
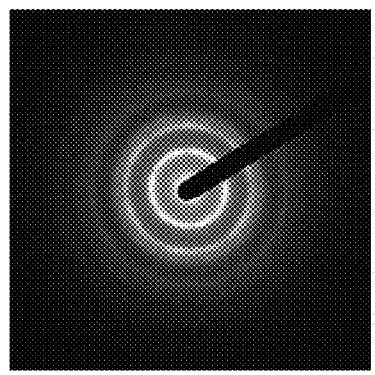

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 47A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 47B shows a diffraction pattern obtained in such a manner that an electron beam with a probe diameter of 300 nm is incident on the same sample in a direction perpendicular to the sample surface. As shown in FIG. 47B, a ring-like diffraction pattern is observed. Thus, the electron diffraction also indicates that the a-axes and b-axes of the pellets included in the CAAC-OS do not have regular alignment. The first ring in FIG. 47B is considered to be derived from the (010) plane, the (100) plane, and the like of the $InGaZnO_4$ crystal. The second ring in FIG. 47B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancy in the oxide semiconductor serve as carrier traps or serve as carrier generation sources when hydrogen is captured therein.

The CAAC-OS having small amounts of impurities and oxygen vacancy is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 70:
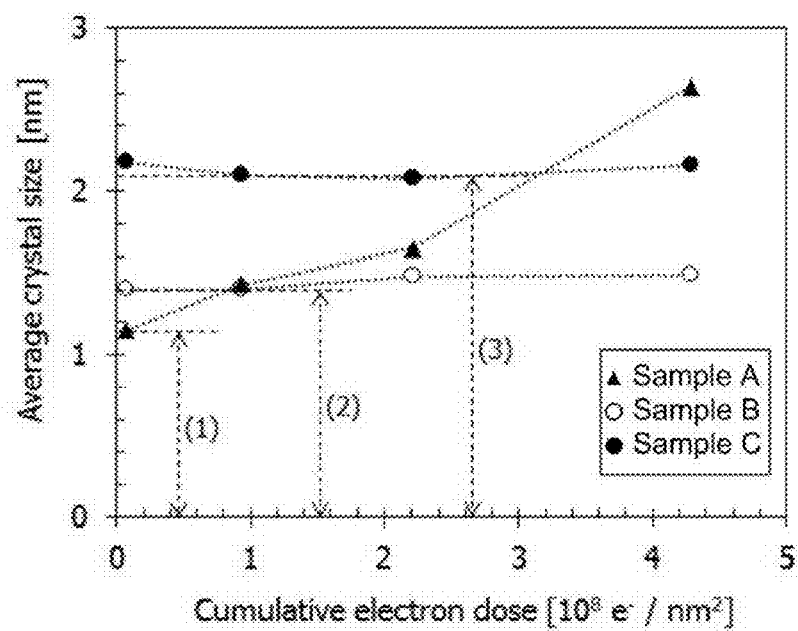
FIG. 70 shows a change in crystal part of an In—Ga—Zn oxide induced by electron irradiation.

FIG. 70 shows change in the average size of crystal parts (at 22 points to 45 points) in each sample. Note that the crystal part size corresponds to the length of a lattice fringe. FIG. 70 indicates that the crystal part size in the a-like OS increases with an increase in the cumulative electron dose. Specifically, as shown by (1) in FIG. 70, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 70, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

This embodiment can be combined with any of the other embodiments described in this specification as appropriate.

Embodiment 9

A band structure of the transistor of one embodiment of the present invention in an arbitrary cross section is described.

Figure 48A:
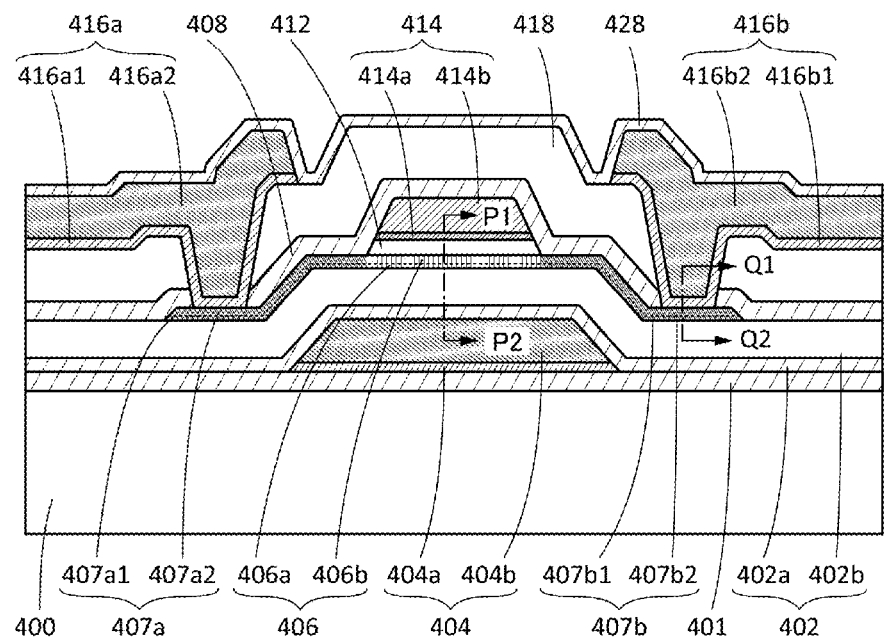
FIG. 48A is a cross-sectional view of a transistor.

FIG. 48A is a cross-sectional view of a transistor including an oxide semiconductor layer according to one embodiment of the present invention.

The transistor illustrated in FIG. 48A includes an insulating layer 401 over a substrate 400, a conductive layer 404a over the insulating layer 401, a conductive layer 404b over the conductive layer 404a, an insulating layer 402a over the insulating layer 401, the conductive layer 404a, and the conductive layer 404b, an insulating layer 402b over the insulating layer 402a, a semiconductor layer 406a over the insulating layer 402b, a semiconductor layer 406b over the semiconductor layer 406a, an insulating layer 412 over the semiconductor layer 406b, a conductive layer 414a over the insulating layer 412, a conductive layer 414b over the conductive layer 414a, an insulating layer 408 over the insulating layer 402b, the semiconductor layer 406a, the semiconductor layer 406b, the insulating layer 412, the conductive layer 414a, and the conductive layer 414b, an insulating layer 418 over the insulating layer 408, a conductive layer 416a1 and a conductive layer 416b1 over the insulating layer 418, a conductive layer 416a2 and a conductive layer 416b2 respectively over the conductive layer 416a1 and the conductive layer 416b1, and an insulating layer 428 over the insulating layer 418, the conductive layer 416a2, and the conductive layer 416b2.

In some cases, the insulating layer 401 has a function of suppressing entry of impurities to a channel formation region of the transistor. In the case where the conductive layer 404b or the like includes an impurity for the semiconductor layer 406a or 406b, such as copper, for example, the insulating layer 401 may have a function of blocking copper and the like.

The stacked conductive layers 404a and 404b are collectively referred to as a conductive layer 404. The conductive layer 404 has a function of a gate electrode of the transistor in some cases. The conductive layer 404 has a function of shielding the channel formation region of the transistor from light in some cases.

The insulating layers 402a and 402b are collectively referred to as an insulating layer 402. The insulating layer 402 has a function of a gate insulating layer of the transistor in some cases. Furthermore, in some cases, the insulating layer 402a has a function of suppressing entry of impurities to the channel formation region of the transistor. In the case where the conductive layer 404b or the like includes an impurity for the semiconductor layer 406a or 406b, such as copper, for example, the insulating layer 402a has a function of blocking copper or the like in some cases.

The semiconductor layers 406a and 406b are collectively referred to as a semiconductor layer 406. In some cases, the semiconductor layer 406 has a function of the channel formation region of the transistor. For example, the semiconductor layer 406a and the semiconductor layer 406b correspond to the oxide semiconductor layer 130b and the oxide semiconductor layer 130c described in the above embodiment, respectively.

The semiconductor layer 406a includes a region 407a1 and a region 407b1 which overlap none of the insulating layer 412, the conductive layer 414a, the conductive layer 414b, and the like. Furthermore, the semiconductor layer 406b includes a region 407a2 and a region 407b2 which overlap none of the insulating layer 412, the conductive layer 414a, the conductive layer 414b, and the like. The region 407a1 and the region 407b1 have lower resistance than the region overlapping the insulating layer 412, the conductive layer 414a, the conductive layer 414b, and the like in the semiconductor layer 406a. The region 407a2 and the region 407b2 have lower resistance than the region overlapping the insulating layer 412, the conductive layer 414a, the conductive layer 414b, and the like in the semiconductor layer 406b. Note that the region with low resistance can also be referred to as a region with high carrier density.

The region 407a1 and the region 407a2 are collectively referred to as a region 407a. The region 407b1 and the region 407b2 are collectively referred to as a region 407b. The region 407a and the region 407b have functions of the source region and the drain region of the transistor, in some cases.

The conductive layers 414a and 414b are collectively referred to as a conductive layer 414. The conductive layer 414 has a function of a gate electrode of the transistor in some cases. The conductive layer 414 has a function of shielding the channel formation region of the transistor from light in some cases.

The insulating layer 412 has a function of a gate insulating layer of the transistor in some cases.

In some cases, the insulating layer 408 has a function of suppressing entry of impurities to the channel formation region of the transistor. In the case where the conductive layer 416a2, the conductive layer 416b2, or the like includes an impurity for the semiconductor layer 406a or 406b, such as copper, for example, the insulating layer 408 has a function of blocking copper or the like in some cases.

The insulating layer 418 has a function of an interlayer insulating layer of the transistor, in some cases. For example, parasitic capacitance between wirings of the transistor can be reduced by the insulating layer 418 in some cases.

The conductive layers 416a1 and 416a2 are collectively referred to as a conductive layer 416a. The conductive layers 416b1 and 416b2 are collectively referred to as a conductive layer 416b. The conductive layer 416a and the conductive layer 416b have functions of the source electrode and the drain electrode of the transistor, in some cases.

In some cases, the insulating layer 428 has a function of suppressing entry of impurities to the channel formation region of the transistor.

Figure 48B:
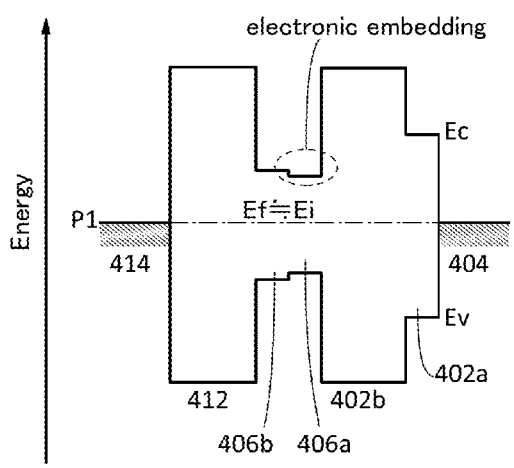
FIGS. 48B and 48C are diagrams illustrating the band structure of the transistor.

Now, a band structure in the P1-P2 cross section including the channel formation regions of the transistor is illustrated in FIG. 48B. Here, the semiconductor layer 406a has a slightly narrower energy gap than the semiconductor layer 406b. Furthermore, the insulating layer 402a, the insulating layer 402b, and the insulating layer 412 are assumed to have wider energy gaps than the semiconductor layer 406a and the semiconductor layer 406b. The Fermi levels (denoted by Ef) of the semiconductor layer 406a, the semiconductor layer 406b, the insulating layer 402a, the insulating layer 402b, and the insulating layer 412 are assumed to be equal to the intrinsic Fermi levels thereof (denoted by Ei). Work functions of the conductive layer 404 and the conductive layer 414 are assumed equal to the Fermi levels.

When a gate voltage is set to be higher than or equal to the threshold voltage of the transistor, an electron flows preferentially in the semiconductor layer 406a owing to the difference between the energies of the conduction band minimums of the semiconductor layers 406a and 406b. That is, it is probable that an electron is embedded in the semiconductor layer 406a. Note that the energy at the conduction band minimum is denoted by Ec, and the energy at the valence band maximum is denoted by Ev.

Accordingly, in the transistor according to one embodiment of the present invention, the electronic embedding reduces the influence of interface scattering. Therefore, the channel resistance of the transistor according to one embodiment of the present invention is low.

Figure 48C:
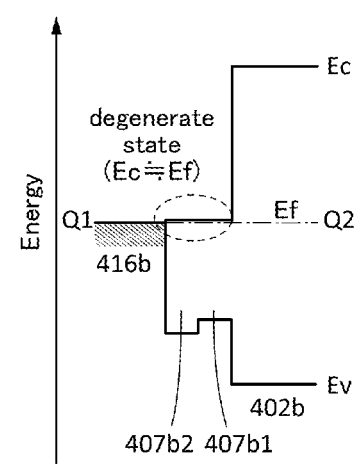

Next, FIG. 48C shows a band structure in the Q1-Q2 cross section including the source region or the drain region of the transistor. Note that the regions 407a1, 407b1, 407a2, and 407b2 are in a degenerate state. Furthermore, the Fermi level of the semiconductor layer 406a is assumed to be approximately the same as the energy of the conduction band minimum in the region 407b1. Furthermore, the Fermi level of the semiconductor layer 406b is assumed to be approximately the same as the energy of the conduction band minimum in the region 407b2. The same can apply to the regions 407a1 and 407a2.

At this time, an ohmic contact is made between the conductive layer 416b functioning as a source electrode or a drain electrode and the region 407b2 because an energy barrier therebetween is sufficiently low. Furthermore, an ohmic contact is made between the region 407b2 and the region 407b1. Similarly, an ohmic contact is made between the conductive layer 416a functioning as a source electrode or a drain electrode and the region 407a2 because an energy barrier therebetween is sufficiently low. Furthermore, an ohmic contact is made between the region 407a2 and the region 407a1. Therefore, electron transfer is conducted smoothly between the conductive layers 416a and 416b and the semiconductor layers 406a and 406b.

As described above, the transistor according to one embodiment of the present invention is a transistor in which the channel resistance is low and electron transfer between the channel formation region and the source and the drain electrodes is conducted smoothly. That is, the transistor has excellent switching characteristics.

This embodiment can be combined with any of the other embodiments in this specification as appropriate.

Embodiment 10

In this embodiment, effects of oxygen vacancy in an oxide semiconductor layer and hydrogen to which the oxygen vacancy is bonded are described below.

<(1) Ease of Formation and Stability of $V_oH$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters oxygen vacancy $V_o$ if the oxygen vacancy $V_o$ exists in IGZO. A state in which H is in oxygen vacancy $V_o$ is referred to as $V_oH$.

Figure 49:
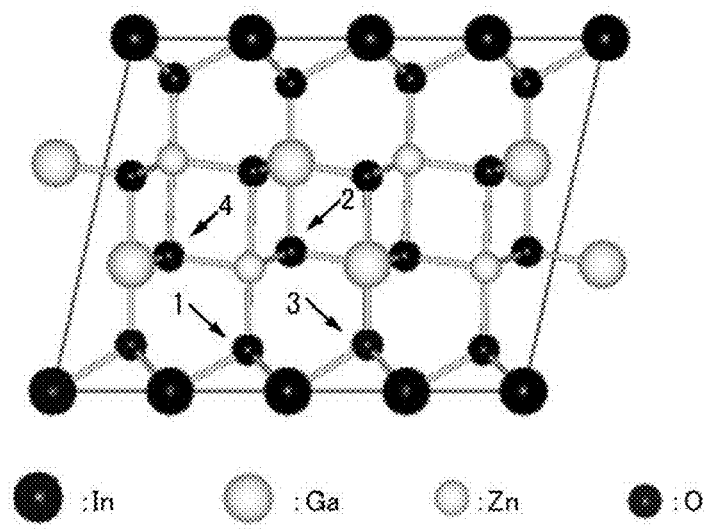
FIG. 49 shows a model of the calculation.

An $InGaZnO_4$ crystal model shown in FIG. 49 was used for calculation. The activation barrier ($E_a$) along the reaction path where H in $V_oH$ is released from $V_o$ and bonded to oxygen was calculated by a nudged elastic band (NEB) method. The calculation conditions are shown in Table 1.

TABLE 1

| | |
|---|---|
| Software | VASP |
| Calculation method | NEB method |
| Functional | GGA-PBE |
| Pseudopotential | PAW |
| Cut-off energy | 500 eV |
| k point | 2 × 2 × 3 |

In the $InGaZnO_4$ crystal model, there are oxygen sites 1 to 4 as shown in FIG. 49 which differ from each other in metal elements bonded to oxygen and the number of bonded metal elements. Here, calculation was made on the oxygen sites 1 and 2 in which oxygen vacancy $V_o$ is easily formed.

First, calculation was made on the oxygen site 1 in which oxygen vacancy $V_o$ is easily formed, which is herein the oxygen site that was bonded to three In atoms and one Zn atom.

Figure 51:
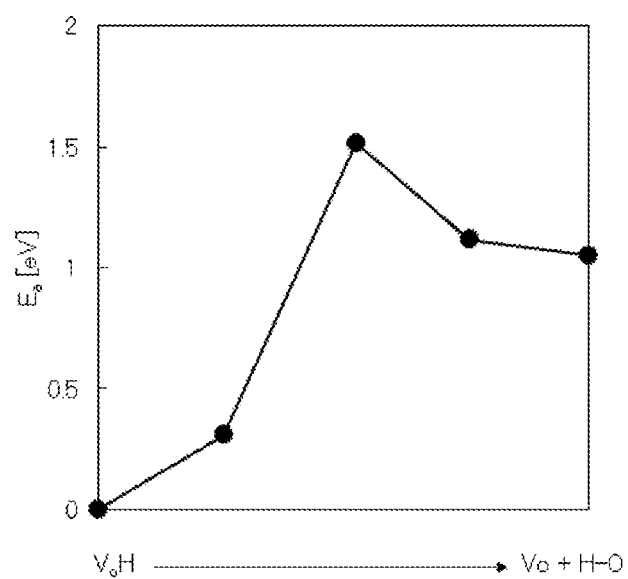
FIG. 51 shows an activation barrier.

FIG. 50A shows a model in the initial state and FIG. 50B shows a model in the final state. FIG. 51 shows the calculated activation barrier ($E_a$) in the initial state and the final state. Note that here, the initial state refers to a state in which H exists in oxygen vacancy $V_o$ ($V_oH$), and the final state refers to a structure including oxygen vacancy $V_o$ and a state in which H is bonded to oxygen bonded to one Ga atom and two Zn atoms (H—O).

From the calculation results, bonding of H in oxygen vacancy $V_o$ to another oxygen atom needs an energy of approximately 1.52 eV, while entry of H bonded to O into oxygen vacancy $V_o$ needs an energy of approximately 0.46 eV.

Reaction frequency (Γ) was calculated with use of the activation barriers ($E_a$) obtained by the calculation and Formula 1. In Formula 1, $k_B$ represents the Boltzmann constant and T represents the absolute temperature.

$$\Gamma = \nu \exp\left(-\frac{E_a}{k_B T}\right) \quad \text{[Formula 1]}$$

The reaction frequency at 350° C. was calculated on the assumption that the frequency factor $\nu=10^{13}$ [1/sec]. The frequency of H transfer from the model shown in FIG. 50A to the model shown in FIG. 50B was $5.52\times10^0$ [1/sec], whereas the frequency of H transfer from the model shown in FIG. 50B to the model shown in FIG. 50A was $1.82\times10^9$ [1/sec]. This suggests that H diffusing in IGZO is likely to form $V_oH$ if oxygen vacancy $V_o$ exists in the neighborhood, and H is unlikely to be released from the oxygen vacancy $V_o$ once $V_oH$ is formed.

Next, calculation was made on the oxygen site 2 in which oxygen vacancy $V_o$ is easily formed, which is herein the oxygen site that was bonded to one Ga atom and two Zn atoms.

Figure 53:
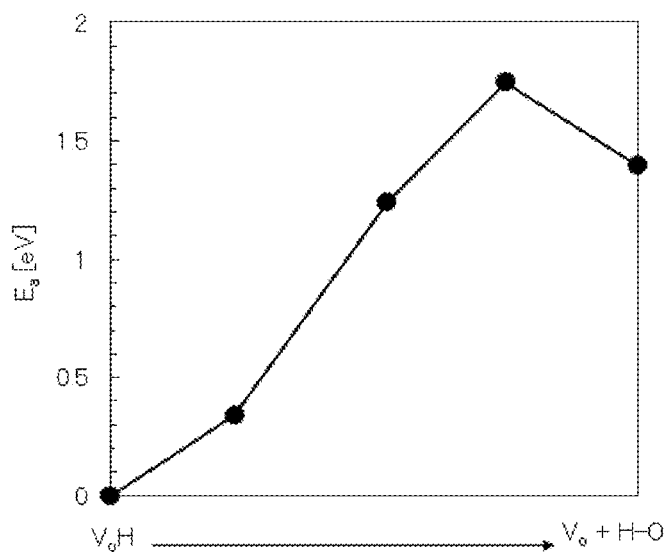
FIG. 53 shows an activation barrier.

FIG. 52A shows a model in the initial state and FIG. 52B shows a model in the final state. FIG. 53 shows the calculated activation barrier ($E_a$) in the initial state and the final state. Note that here, the initial state refers to a state in which H exists in oxygen vacancy $V_o$ ($V_oH$), and the final state refers to a structure including oxygen vacancy $V_o$ and a state in which H is bonded to oxygen bonded to one Ga atom and two Zn atoms (H—O).

From the calculation results, bonding of H in oxygen vacancy $V_o$ to another oxygen atom needs an energy of approximately 1.75 eV, while entry of H bonded to O in oxygen vacancy $V_o$ needs an energy of approximately 0.35 eV.

Reaction frequency (Γ) was calculated with use of the activation barriers ($E_a$) obtained by the calculation and Formula 1.

The reaction frequency at 350° C. was calculated on the assumption that the frequency factor $\nu=10^{13}$ [1/sec]. The frequency of H transfer from the model shown in FIG. 52A to the model shown in FIG. 52B was $7.53\times10^{-2}$ [1/sec], whereas the frequency of H transfer from the model shown in FIG. 52B to the model shown in FIG. 52A was $1.44\times10^{10}$ [1/sec]. This suggests that H is unlikely to be released from the oxygen vacancy $V_o$ once $V_oH$ is formed.

From the above results, it was found that H in IGZO easily diffused in annealing and if oxygen vacancy $V_o$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where oxygen vacancy $V_o$ and H exist in IGZO, the oxygen vacancy $V_o$ and H easily form $V_oH$ and $V_oH$ is stable. To determine whether $V_oH$ is related to a carrier trap, the transition level of $V_oH$ was calculated.

The model used for calculation is an InGaZnO$_4$ crystal model (112 atoms). $V_oH$ models of the oxygen sites 1 and 2 shown in FIG. 49 were made to calculate the transition levels. The calculation conditions are shown in Table 2.

TABLE 2

| Software | VASP |
|---|---|
| Model | InGaZnO$_4$ crystal (112 atoms) |
| Functional | HSE06 |
| Ratio of exchange terms | 0.25 |
| Pseudopotential | GGA-PBE |
| Cut-off energy | 800 eV |
| k point | 1 × 1 × 1 |

The ratio of exchange terms was adjusted to have a band gap close to the experimental value. As a result, the band gap of the InGaZnO$_4$ crystal model without defects was 3.08 eV that was close to the experimental value, 3.15 eV.

The transition level (∈(q/q′)) of a model having defect D can be calculated by the following Formula 2. Note that $\Delta E(D^q)$ represents the formation energy of defect D at charge q, which is calculated by Formula 3.

$$\varepsilon(q/q') = \frac{\Delta E(D^q) - \Delta E(D^{q'})}{q' - q} \quad \text{[Formula 2]}$$

$$\Delta E(D^q) = \quad \text{[Formula 3]}$$
$$E_{tot}(D^q) - E_{tot}(\text{bulk}) + \sum_i \Delta n_i \mu_i + q(\varepsilon_{VBM} + \Delta V_q + E_F)$$

In Formulae 2 and 3, $E_{tot}(D^q)$ represents the total energy of the model having defect D at the charge q in, $E_{tot}(\text{bulk})$ represents the total energy in a model without defects (complete crystal), $\Delta n_i$ represents a change in the number of atoms i contributing to defects, $\mu_i$ represents the chemical potential of atom i, $\in_{VBM}$ represents the energy of the valence band maximum in the model without defects, $\Delta V_q$ represents the correction term relating to the electrostatic potential, and $E_F$ represents the Fermi energy.

Figure 54:
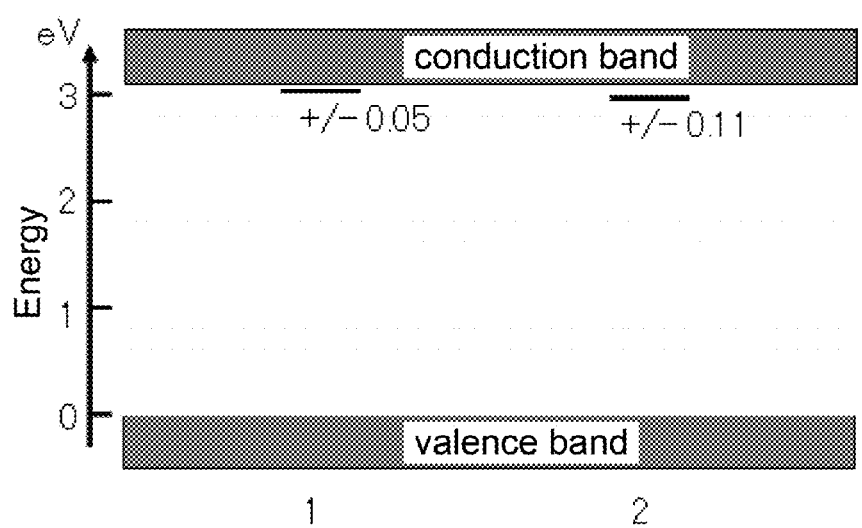
FIG. 54 shows the transition levels of $V_oH$.

FIG. 54 shows the transition levels of $V_oH$ obtained from the above formulae. The numbers in FIG. 54 represent the depth from the conduction band minimum. In FIG. 54, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ seems to be related to electron traps, that is, $V_oH$ seems to behave as a donor. Furthermore, IGZO including $V_oH$ has conductivity.

This embodiment can be combined as appropriate with any of the other embodiments in this specification.

Embodiment 11

Deposition Model

Examples of deposition models of a CAAC-OS and nc-OS are described below.

Figure 55A:
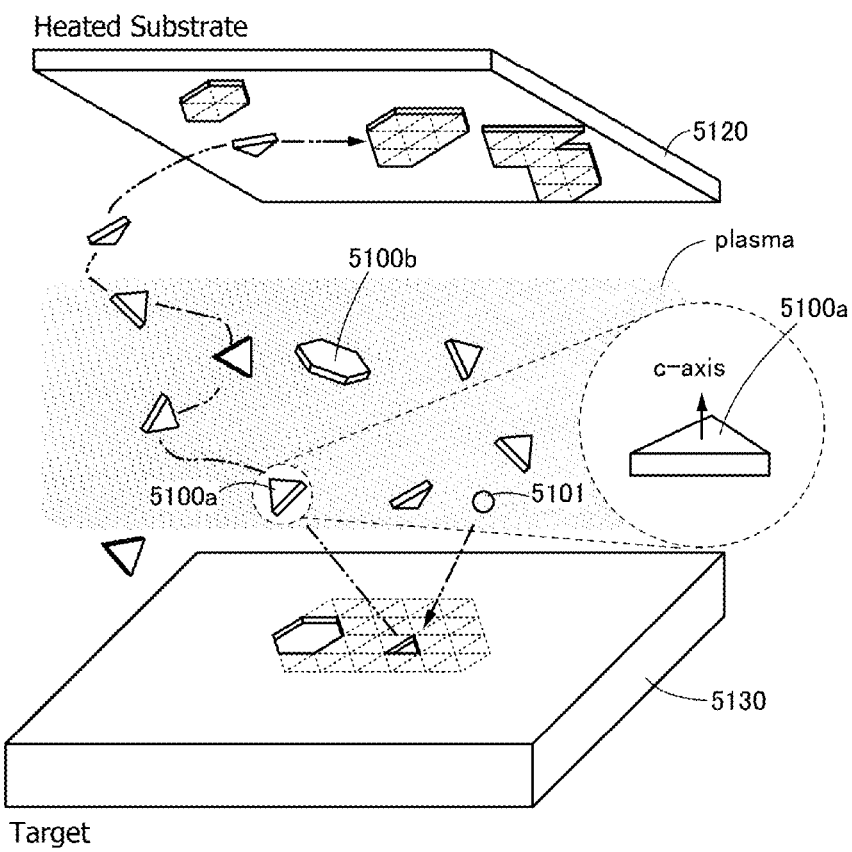
FIG. 55A schematically illustrates a CAAC-OS deposition model.
Figure 55B:
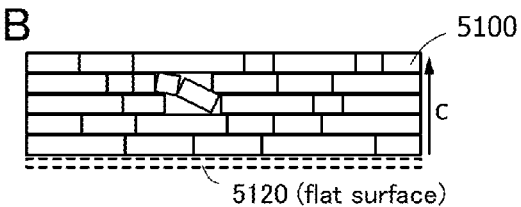
FIGS. 55B and 55C are cross-sectional views of pellets and a CAAC-OS.
Figure 55C:
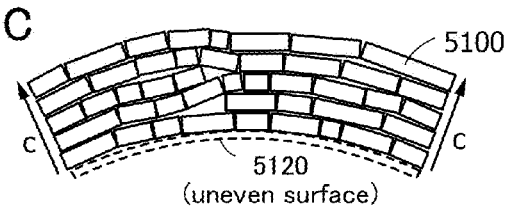

FIG. 55A is a schematic diagram of a deposition chamber illustrating a state where the CAAC-OS film is formed by a sputtering method.

A target 5130 is attached to a backing plate. Under the target 5130 and the backing plate, a plurality of magnets are provided. The plurality of magnets cause a magnetic field over the target 5130. A sputtering method in which the disposition speed is increased by utilizing a magnetic field of magnets is referred to as a magnetron sputtering method.

The target 5130 has a polycrystalline structure in which a cleavage plane exists in at least one crystal grain. Note that the details of the cleavage plane are described later.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. Note that the magnetic field over the target 5130 forms a high-density plasma region. In the high-density plasma region, the deposition gas is ionized, so that an ion 5101 is generated. Examples of the ion 5101 include an oxygen cation ($O^+$) and an argon cation ($Ar^+$).

The ion 5101 is accelerated to the target 5130 side by an electric field, and collides with the target 5130 eventually. At this time, a pellet 5100a and a pellet 5100b which are flat-plate-like or pellet-like sputtered particles are separated and sputtered from the cleavage plane. Note that structures of the pellet 5100a and the pellet 5100b may be distorted by an impact of collision of the ion 5101.

The pellet 5100a is a flat-plate-like or pellet-like sputtered particle having a triangle plane, e.g., a regular triangle plane. The pellet 5100b is a flat-plate-like or pellet-like sputtered particle having a hexagon plane, e.g., regular hexagon plane. Note that flat-plate-like or pellet-like sputtered particles such as the pellet 5100a and the pellet 5100b are collectively called pellets 5100. The shape of a flat plane of the pellet 5100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 5100 is determined depending on the kind of the deposition gas and the like. The thicknesses of the pellets 5100 are preferably uniform; the reasons thereof are described later. In addition, the sputtered particle preferably has a pellet shape with a small thickness as compared to a dice shape with a large thickness.

Figure 57:
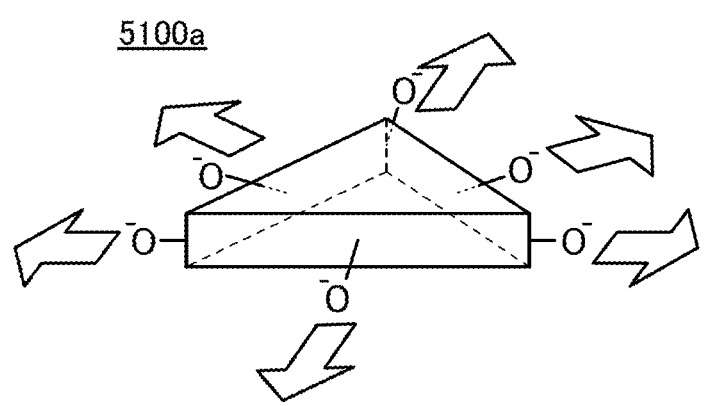
FIG. 57 illustrates a pellet.

The pellet 5100 receives charge when passing through the plasma, so that side surfaces of the pellet 5100 are negatively or positively charged in some cases. The pellet 5100 includes an oxygen atom on its side surface, and the oxygen atom may be negatively charged. For example, a case in which the pellet 5100a includes, on its side surfaces, oxygen atoms that are negatively charged is illustrated in FIG. 57. As in this view, when the side surfaces are charged in the same polarity, charges repel each other, and accordingly, the pellet can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 58:
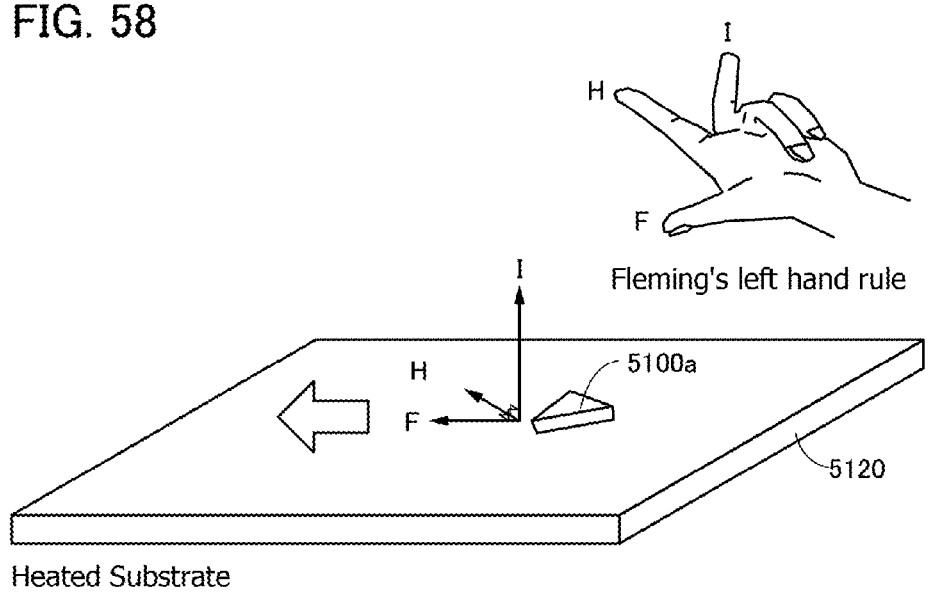
FIG. 58 illustrates force applied to a pellet on a formation surface.
Figure 64A:
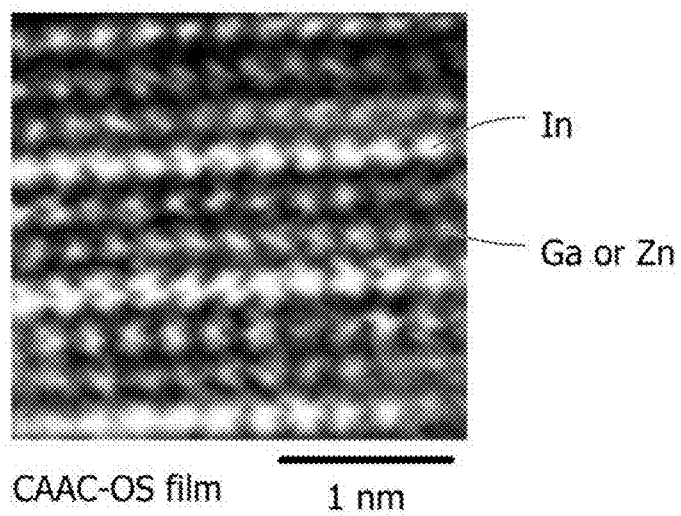
FIGS. 64A and 64B are cross-sectional HAADF-STEM images of a CAAC-OS and a target.

As shown in FIG. 64A, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field is generated in a direction parallel to a top surface of the substrate 5120. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current (see FIG. 58). This is explainable with Fleming's left-hand rule. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate is 1.5 times or higher, preferably twice or higher, further preferably 3 times or higher, still further preferably 5 times or higher as high as the magnetic field in a direction perpendicular to the top surface of the substrate 5120.

Figure 59A:
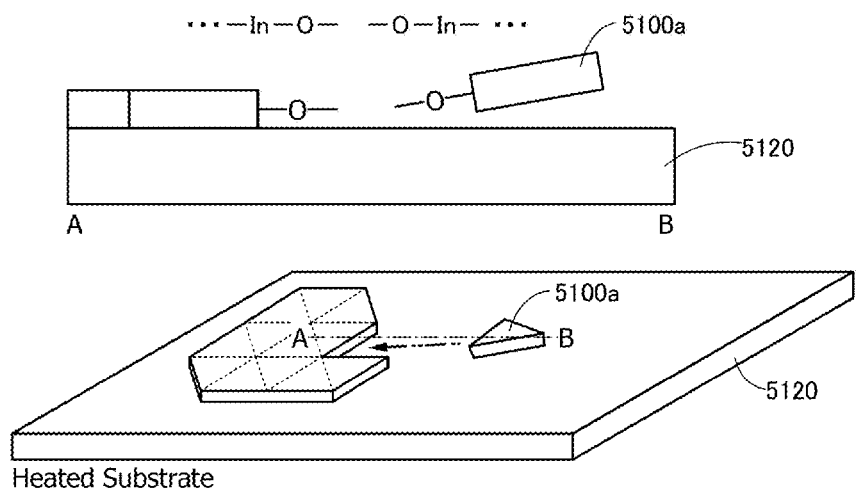
FIGS. 59A and 59B illustrate movement of a pellet on a formation surface.
Figure 59B:
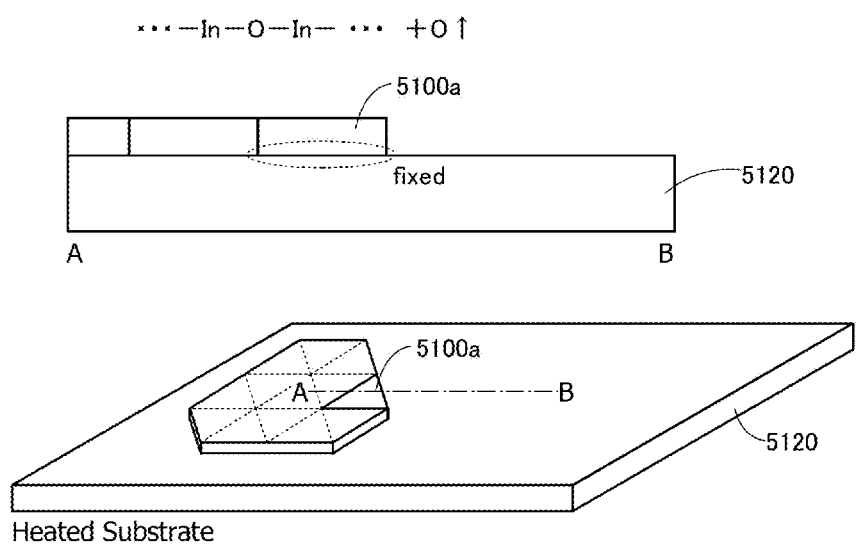

Furthermore, the substrate 5120 is heated, and resistance such as friction between the pellet 5100 and the substrate 5120 is low. As a result, as illustrated in FIG. 59A, the pellet 5100 glides above the surface of the substrate 5120. The glide of the pellet 5100 is caused in a state where the flat plane faces the substrate 5120. Then, as illustrated in FIG. 59B, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancy in a CAAC-OS is filled in some cases; thus, the CAAC-OS has a low density of defect states.

Further, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented. Further, the space is filled with elastic metal atoms and the like, whereby the elastic metal atoms have a function, like a highway, of jointing side surfaces of the pellets 5100 which are not aligned with each other.

It is considered that as shown in such a model, the pellets 5100 are deposited over the substrate 5120. Thus, a CAAC-OS film can be deposited even when a surface over which a film is formed (film formation surface) does not have a crystal structure, which is different from film deposition by epitaxial growth. For example, even when a surface (film formation surface) of the substrate 5120 has an amorphous structure, a CAAC-OS film can be formed.

Further, it is found that in formation of the CAAC-OS, the pellets 5100 are arranged in accordance with a surface shape of the substrate 5120 that is the film formation surface even when the film formation surface has unevenness besides a flat surface. For example, in the case where the surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 64B).

In the case where the top surface of the substrate 5120 has unevenness, a CAAC-OS where n layers (n is a natural number) in each of which the pellets 5100 are arranged along a convex surface are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be formed.

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 5120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 5100.

The zinc oxide particle reaches the substrate 5120 before the pellet 5100 does because the zinc oxide particle is smaller than the pellet 5100 in mass. On the surface of the substrate 5120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 5120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 56:
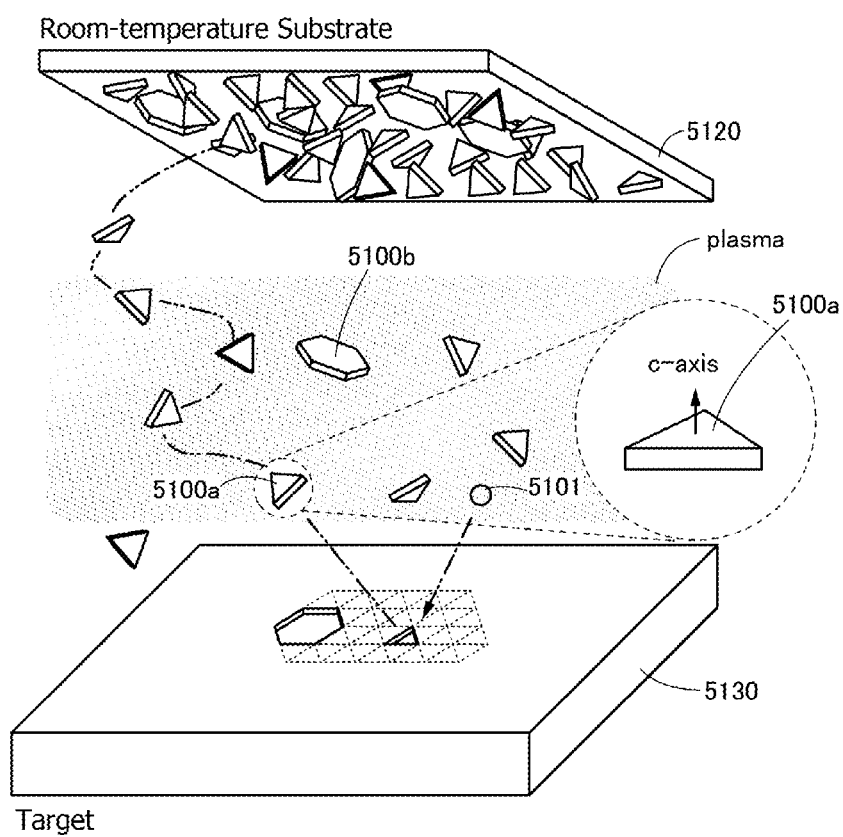
FIG. 56 schematically illustrates a deposition model of an nc-OS and a pellet.

An nc-OS can be understood with a deposition model illustrated in FIG. 56. Note that a difference between FIG. 56 and FIG. 64A lies only in the fact that whether the substrate 5120 is heated or not.

Thus, the substrate 5120 is not heated, and a resistance such as friction between the pellet 5100 and the substrate 5120 is high. As a result, the pellets 5100 cannot glide on the surface of the substrate 5120 and are stacked randomly, thereby forming an nc-OS.

<Cleavage Plane>

A cleavage plane that has been mentioned in the deposition model of the CAAC-OS will be described below.

Figure 60A:
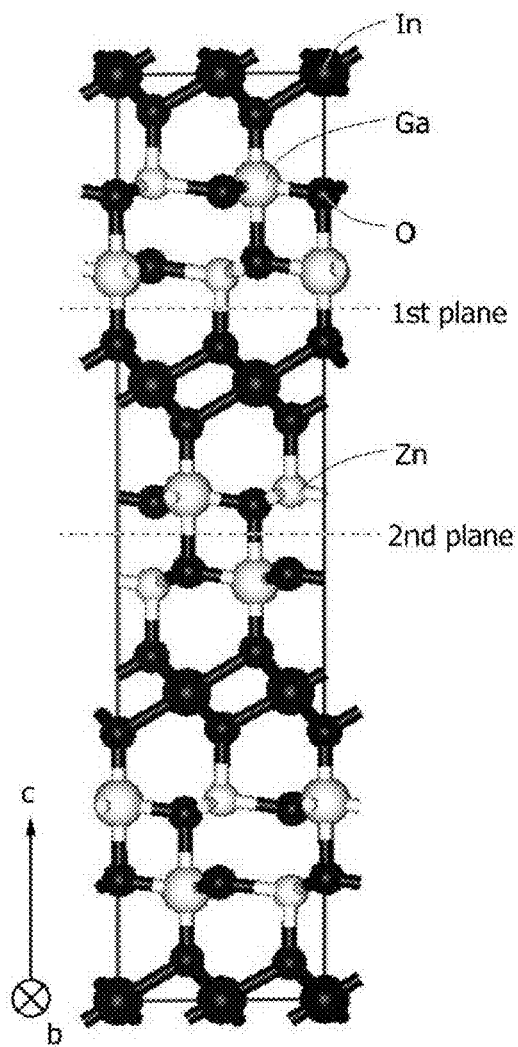
FIGS. 60A and 60B show an $InGaZnO_4$ crystal.
Figure 60B:
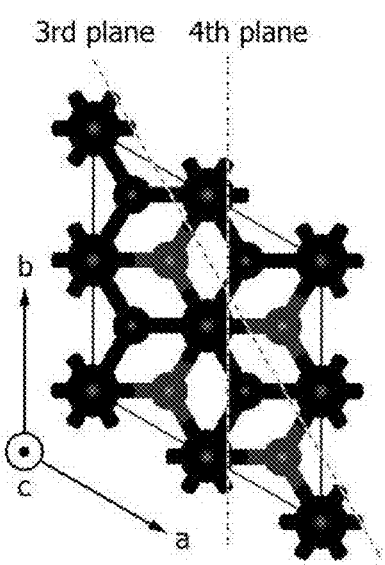

First, a cleavage plane of the target is described with reference to FIGS. 60A and 60B. FIGS. 60A and 60B show the crystal structure of $InGaZnO_4$. Note that FIG. 60A shows the structure of the case where an $InGaZnO_4$ crystal is observed from a direction parallel to the b-axis when the c-axis is in an upward direction. Furthermore, FIG. 60B shows the structure of the case where the $InGaZnO_4$ crystal is observed from a direction parallel to the c-axis.

Energy needed for cleavage at each of crystal planes of the $InGaZnO_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the $InGaZnO_4$ crystal in FIGS. 60A and 60B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 60A). The second plane is a crystal plane between a Ga—Zn—O layer and a Ga—Zn—O layer and is parallel to the (001) plane (or the a-b plane) (see FIG. 60A). The third plane is a crystal plane parallel to the (110) plane (see FIG. 60B). The fourth plane is a crystal plane parallel to the (100) plane (or the b-c plane) (see FIG. 60B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 $J/m^2$, that of the second plane was 0.68 $J/m^2$, that of the third plane was 2.18 $J/m^2$, and that of the fourth plane was 2.12 $J/m^2$ (see Table 3).

TABLE 3

| | Cleavage energy [$J/m^2$] |
|---|---|
| first plane | 2.60 |
| second plane | 0.68 |
| third plane | 2.18 |
| Fourth plane | 2.12 |

From the calculations, in the structure of the $InGaZnO_4$ crystal in FIGS. 60A and 60B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the $InGaZnO_4$ crystals in FIG. 60A can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of $InGaZnO_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 61A:
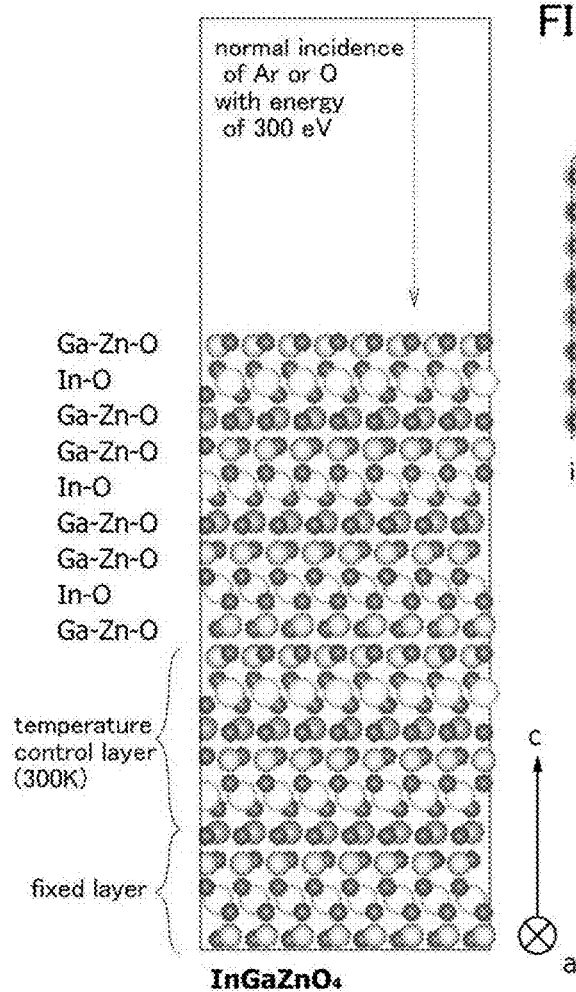
FIGS. 61A and 61B illustrate a structure of $InGaZnO_4$ and others before an atom collides.
Figure 61B:
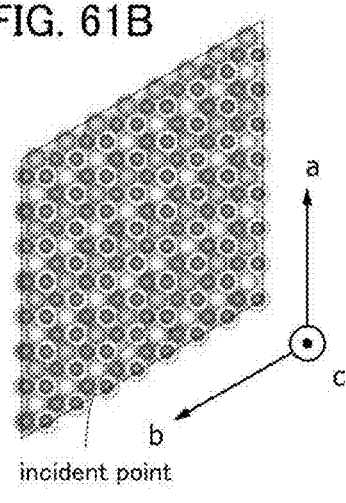

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 61A shows a cross-sectional structure of an InGaZnO$_4$ crystal (2688 atoms) used for the calculation, and FIG. 61B shows a top structure thereof. Note that a fixed layer in FIG. 61A prevents the positions of the atoms from moving. A temperature control layer in FIG. 61A is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the above-mentioned conditions.

FIG. 62A shows atomic order when 99.9 picoseconds have passed after argon enters the cell including the InGaZnO$_4$ crystal in FIGS. 61A and 61B. FIG. 62B shows atomic order when 99.9 picoseconds have passed after oxygen enters the cell. Note that in FIGS. 62A and 62B, part of the fixed layer in FIG. 61A is omitted.

According to FIG. 62A, in a period from entry of argon into the cell to when 99.9 picoseconds have passed, a crack is formed from the cleavage plane corresponding to the second plane in FIG. 60A. Thus, in the case where argon collides with the InGaZnO$_4$ crystal and the uppermost surface is the second plane (the zero-th), a large crack is found to be formed in the second plane (the second).

On the other hand, according to FIG. 62B, in a period from entry of oxygen into the cell to when 99.9 picoseconds have passed, a crack is found to be formed from the cleavage plane corresponding to the second plane in FIG. 60A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 63A:
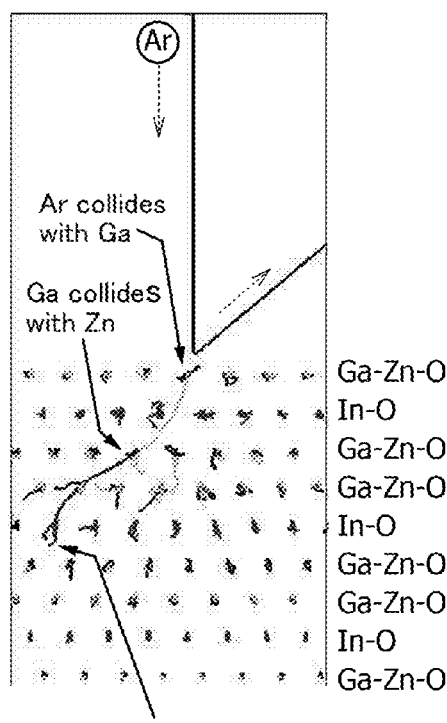
FIGS. 63A and 63B show trajectories of atoms after collision of atoms.

FIG. 63A shows trajectories of the atoms from 0 picosecond to 0.3 picoseconds after argon enters the cell including the InGaZnO$_4$ crystal in FIGS. 61A and 61B. Accordingly, FIG. 63A corresponds to a period from FIGS. 61A and 61B to FIG. 62A.

According to FIG. 63A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 61A.

Figure 63B:
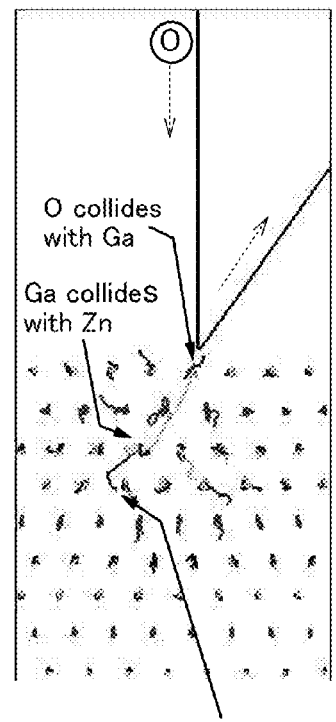

FIG. 63B shows trajectories of the atoms from 0 picosecond to 0.3 picoseconds after oxygen enters the cell including the InGaZnO$_4$ crystal in FIGS. 61A and 61B. Accordingly, FIG. 63B corresponds to a period from FIGS. 61A and 61B to FIG. 62A.

On the other hand, according to FIG. 63B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 61A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following Formula 4 and the following Formula 5. Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2}m_A v_A^2 + \frac{1}{2}m_{Ga} v_{Ga}^2 \quad \text{[Formula 4]}$$

$$m_A v_A + m_{Ga} v_{Ga} = m_A v'_A + m_{Ga} v'_{Ga} \quad \text{[Formula 5]}$$

On the assumption that collision of argon or oxygen is elastic collision, the relationship among $v_A$, $v'_A$, $v_{Ga}$, and $v'_{Ga}$ can be represented by the following Formula 6.

$$v'_A - v'_{Ga} = -(v_A - v_{Ga}) \quad \text{[Formula 6]}$$

From the formulae 4, 5, and 6, the speed of gallium $v'_{Ga}$ after collision of argon or oxygen can be represented by the following Formula 7.

$$v'_{Ga} = \frac{\sqrt{m_A}}{m_A + m_{Ga}} \cdot 2\sqrt{2E} \quad \text{[Formula 7]}$$

In Formula 7, mass of argon or oxygen is substituted into $m_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 64A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 64B:
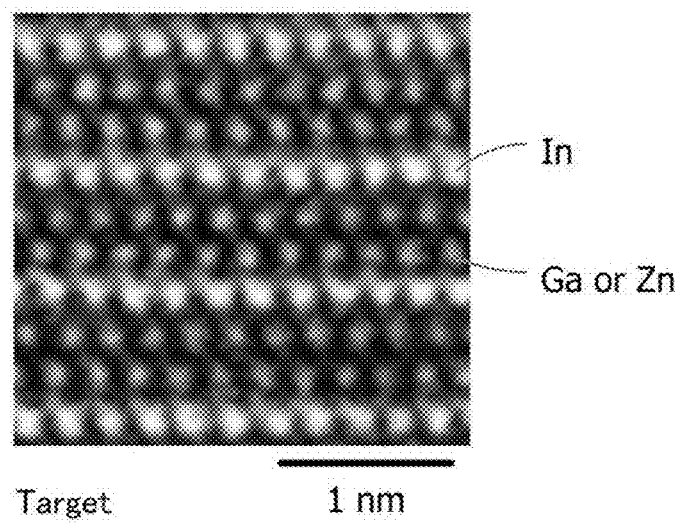

FIGS. 64A and 64B show atomic order of cross sections of an In—Ga—Zn oxide (see FIG. 64A) that is a CAAC-OS deposited by sputtering and a target thereof (see FIG. 64B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 64A and FIG. 64B are compared, it is found that the CAAC-OS and the target each have a homologous structure and atomic order in the CAAC-OS correspond to that in the target. Thus, as illustrated in the deposition model in FIG. 55A, the crystal structure of the target is transferred, whereby a CAAC-OS is formed.

This embodiment can be combined as appropriate with any of the other embodiments in this specification.

Embodiment 12

An imaging device according to one embodiment of the present invention and a semiconductor device including the imaging device can be used for display devices, personal computers, and image reproducing devices provided with recording media (typically, devices that reproduce the content of recording media such as digital versatile discs (DVDs) and have displays for displaying the reproduced images). Other than the above, as an electronic appliances which can use the imaging device according to one embodiment of the present invention or the semiconductor device including the imaging device, mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 65A to 65F illustrate specific examples of these electronic appliances.

Figure 65A:
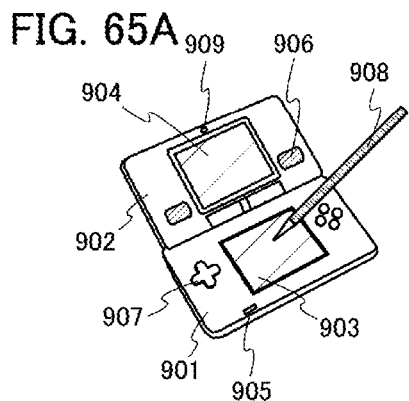
FIGS. 65A to 65F shows electronic appliances.

FIG. 65A illustrates a portable game console including a housing 901, a housing 902, a display portion 903, a display portion 904, a microphone 905, a speaker 906, an operation key 907, a stylus 908, a camera 909, and the like. Although the portable game console in FIG. 65A has the two display portions 903 and 904, the number of display portions included in a portable game console is not limited to this. The imaging device of one embodiment of the present invention can be used in the camera 909.

Figure 65B:
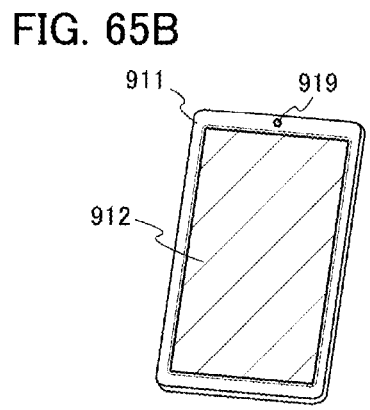

FIG. 65B illustrates a portable information terminal, which includes a first housing 911, a display portion 912, a camera 919, and the like. A touch panel function of the display portion 912 enables input and output of information. The imaging device of one embodiment of the present invention can be used in the camera 919.

Figure 65C:
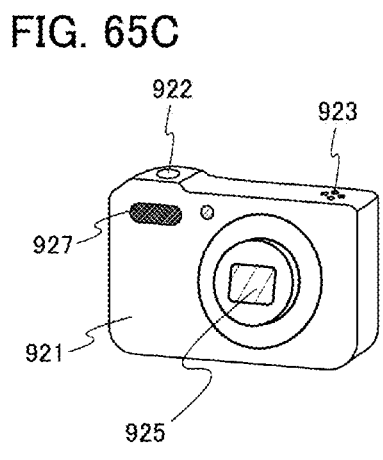

FIG. 65C illustrates a digital camera including a housing 921, a shutter button 922, a microphone 923, a light-emitting portion 927, a lens 925, and the like. The imaging device of one embodiment of the present invention can be used in a portion corresponding to a focus of the lens 925.

Figure 65D:
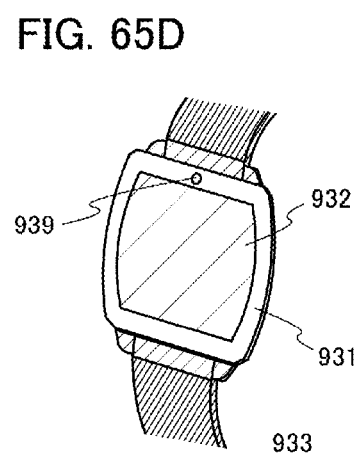

FIG. 65D illustrates a wrist-watch-type information terminal, which includes a housing 931, a display portion 932, a wristband 933, a camera 939, and the like. The display portion 932 may be a touch panel. The imaging device of one embodiment of the present invention can be used in the camera 939.

Figure 65E:
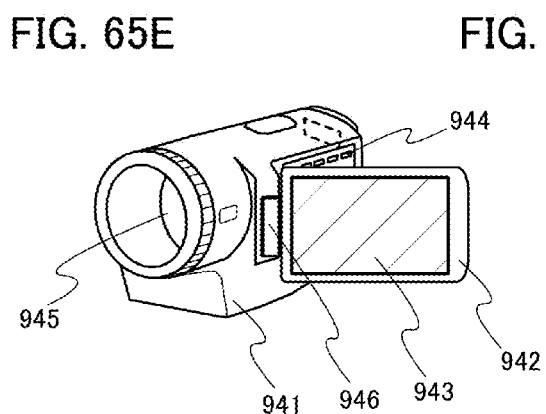

FIG. 65E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. The imaging device of one embodiment of the present invention can be used in a portion corresponding to a focus of the lens 945.

Figure 65F:
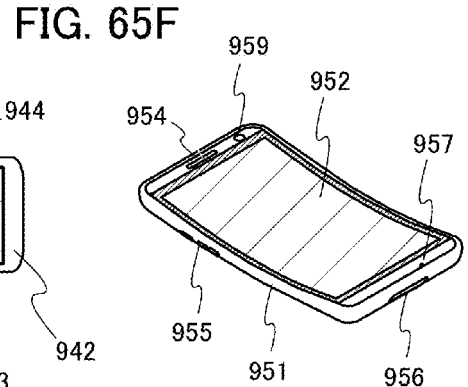

FIG. 65F illustrates a mobile phone which includes a display portion 952, a microphone 957, a speaker 954, a camera 959, an input/output terminal 956, an operation button 955, and the like in a housing 951. The imaging device of one embodiment of the present invention can be used in the camera 959

This embodiment can be combined with any of the other embodiments in this specification as appropriate.

Embodiment 13

In this embodiment, modification examples of the transistor described in the above embodiment will be described with reference to FIGS. 66A to 66F, FIGS. 67A to 67F, and FIGS. 68A to 68E. The transistors illustrated in FIGS. 66A to 66F each includes, over a substrate 821, an oxide semiconductor layer 828 over an insulating layer 824, an insulating layer 837 in contact with the oxide semiconductor layer 828, and a conductive layer 840 in contact with the insulating layer 837 and overlapping the oxide semiconductor layer 828. The insulating layer 837 functions as a gate insulating film. The conductive layer 840 functions as a gate electrode layer.

In addition, the transistors are provided with an insulating layer 846 in contact with the oxide semiconductor layer 828 and an insulating layer 847 in contact with the insulating layer 846. Moreover, conductive layers 856 and 857 in contact with the oxide semiconductor layer 828 through the openings in the insulating layer 846 and the insulating layer 847 are provided. The conductive layers 856 and 857 function as a source electrode layer and a drain electrode layer.

As the structures of the transistor described in this embodiment and the conductive layer and the insulating layer in contact with the structures, the structures of the transistor described in the above embodiment and the conductive layer and the insulating layer in contact with the structures can be used as appropriate.

Figure 66A:
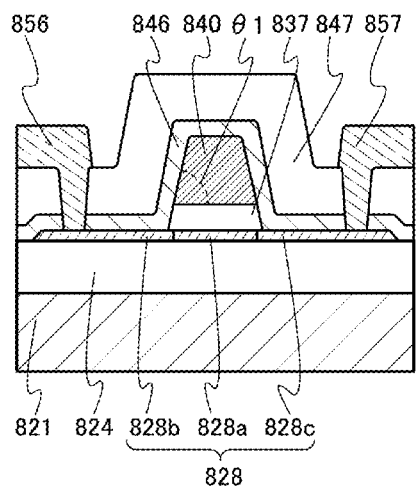
FIGS. 66A to 66F are each a cross-sectional view illustrating a transistor.

In the transistor illustrated in FIG. 66A, the oxide semiconductor layer 828 includes a region 828a overlapping the conductive layer 840 and regions 828b and 828c containing an impurity element. The regions 828b and 828c are formed so that the region 828a is sandwiched therebetween. The conductive layers 856 and 857 are in contact with the regions 828b and 828c respectively. The region 828a functions as a channel region. The regions 828b and 828c have lower resistivity than the region 828a and can be referred to as low resistance regions. The regions 828b and 828c function as a source region and a drain region.

Figure 66B:
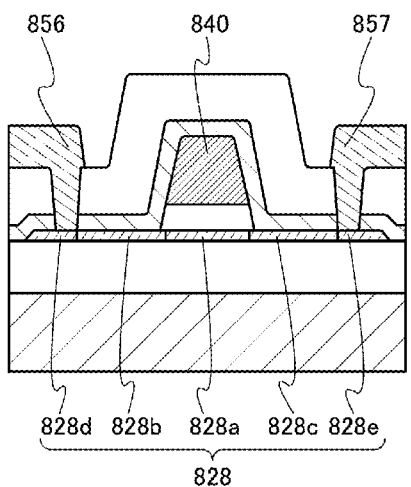

Alternatively, as in the transistor illustrated in FIG. 66B, the oxide semiconductor layer 828 may have a structure in which an impurity element is not added to regions 828d and 828e in contact with the conductive layers 856 and 857. In this case, the regions 828b and 828c containing an impurity element are provided between the region 828a and the regions 828d and 828e in contact with the conductive layers 856 and 857. The regions 828d and 828e have conductivity when the voltage is applied to the conductive layers 856 and 857; thus, the regions 828d and 828e function as a source region and a drain region.

Note that the transistor illustrated in FIG. 66B can be formed in such a manner that after the conductive layers 856 and 857 are formed, an impurity element is added to the oxide semiconductor layer using the conductive layer 840 and the conductive layers 856 and 857 as masks.

An end portion of the conductive layer 840 may have a tapered shape. The angle θ1 formed between a surface where the insulating layer 837 and the conductive layer 840 are in contact with each other and a side surface of the conductive layer 840 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating layer 837 and the conductive layer 840 with the insulating layer 846 can be improved.

Next, modification examples of the regions 828b and 828c are described. FIGS. 66C to 66F are each an enlarged view of the vicinity of the oxide semiconductor layer 828 illustrated in FIG. 66A. The channel length L indicates a distance between a pair of regions containing an impurity element.

Figure 66C:
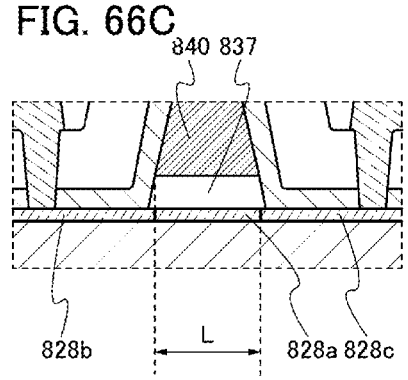

As illustrated in FIG. 66C in a cross-sectional view in the channel length direction, the boundaries between the region 828a and the regions 828b and 828c are aligned or substantially aligned with the end portion of the conductive layer 840 with the insulating layer 837 positioned therebetween. In other words, the boundaries between the region 828a and the regions 828b and 828c are aligned or substantially aligned with the end portion of the conductive layer 840, when seen from the above.

Figure 66D:
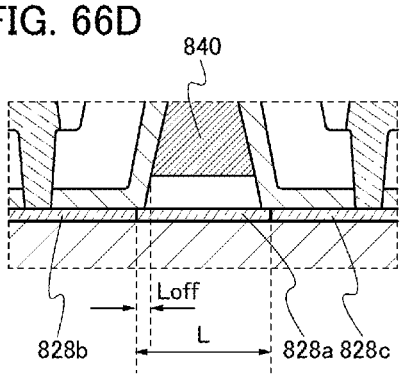

Alternatively, as illustrated in FIG. 66D in a cross-sectional view in the channel length direction, the region 828a has a region that does not overlap the end portion of the conductive layer 840. The region functions as an offset region. The length of the offset region in the channel length direction is referred to as $L_{off}$. Note that when a plurality of offset regions are provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 66E:
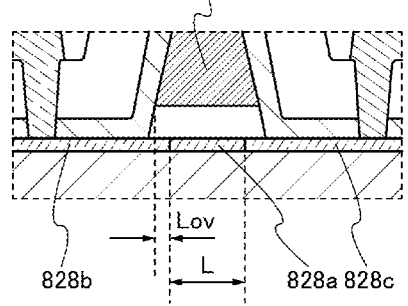

Alternatively, as illustrated in FIG. 66E in a cross-sectional view in the channel length direction, the regions 828b and 828c each have a region overlapping the conductive layer 840 with the insulating layer 837 positioned therebetween. The regions function as an overlap region. The overlap region in the channel length direction is referred to as $L_{ov}$. $L_{ov}$ is smaller than 20%, smaller than 10%, smaller than 5%, or smaller than 2% of the channel length L.

Figure 66F:
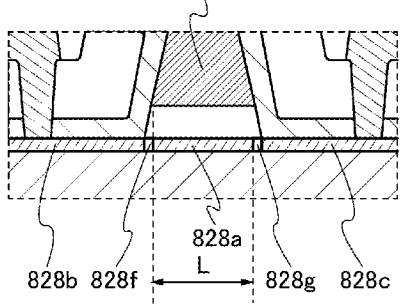

Alternatively, as illustrated in FIG. 66F in a cross-sectional view in the channel length direction, a region 828f is provided between the region 828a and the region 828b, and a region 828g is provided between the region 828a and the region 828c. The regions 828f and 828g have lower concentration of an impurity element and higher resistivity than the regions 828b and 828c. Although the regions 828f and 828g overlap the insulating layer 837 in this case, they may overlap the insulating layer 837 and the conductive layer 840.

Note that in FIGS. 66C to 66F, the transistor illustrated in FIG. 66A is described; however, the transistor illustrated in FIG. 66B can employ any of the structures in FIGS. 66C to 66F as appropriate.

Figure 67A:
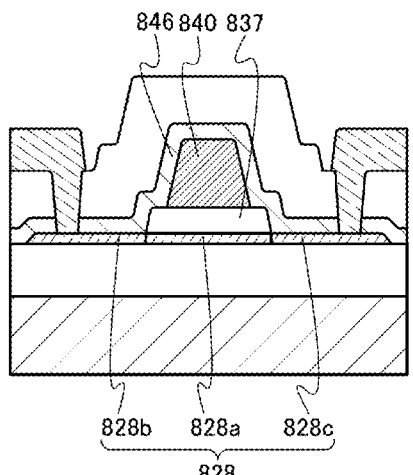
FIGS. 67A to 67F are each a cross-sectional view illustrating a transistor.

In the transistor illustrated in FIG. 67A, the end portion of the insulating layer 837 is positioned on an outer side than the end portion of the conductive layer 840. In other words, the insulating layer 837 has a shape such that the end portion extends beyond the end portion of the conductive layer 840. The insulating layer 846 can be kept away from the region 828a; thus, nitrogen, hydrogen, and the like contained in the insulating layer 846 can be prevented from entering the region 828a functioning as a channel region.

Figure 67B:
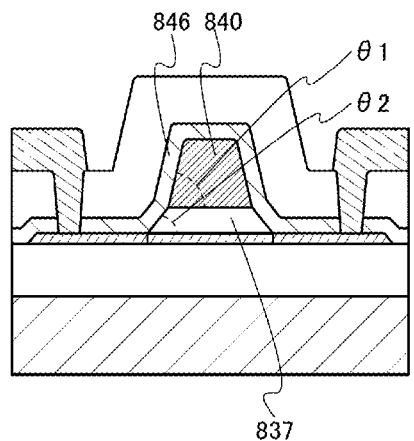

In the transistor illustrated in FIG. 67B, the insulating layer 837 and the conductive layer 840 each have a tapered shape, and the angles of the tapered shapes are different from each other. In other words, the angle θ1 formed between a surface where the insulating layer 837 and the conductive layer 840 are in contact with each other and a side surface of the conductive layer 837 is different from an angle θ2 formed between a surface where the oxide semiconductor layer 828 and the insulating layer 837 are in contact with each other and the side surface of the conductive layer 840. The angle θ2 may be less than 90°, greater than or equal to 30° and less than or equal to 85°, or greater than or equal to 45° and less than or equal to 70°. For example, when the angle θ2 is less than the angle θ1, the coverage with the insulating layer 846 is improved. Alternatively, when the angle θ2 is greater than the angle θ1, the insulating layer 846 can be kept away from the region 828a; thus, nitrogen, hydrogen, or the like contained in the insulating layer 846 can be prevented from entering the region 828a functioning as a channel region.

Next, modification examples of the regions 828b and 828c are described with reference to FIGS. 67C to 67F. Note that FIGS. 67C to 67F are each an enlarged view of the vicinity of the oxide semiconductor layer 828 illustrated in FIG. 67A.

Figure 67C:
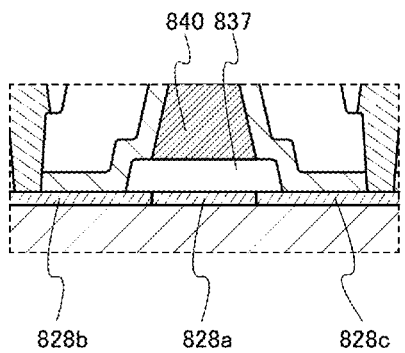

As illustrated in FIG. 67C in a cross-sectional view in the channel length direction, the boundaries between the region 828a and the regions 828b and 828c are aligned or substantially aligned with the end portion of the conductive layer 840 with the insulating layer 837 positioned therebetween. In other words, when seen from the above, the boundaries between the region 828a and the regions 828b and 828c are aligned or substantially aligned with the end portion of the conductive layer 840.

Figure 67D:
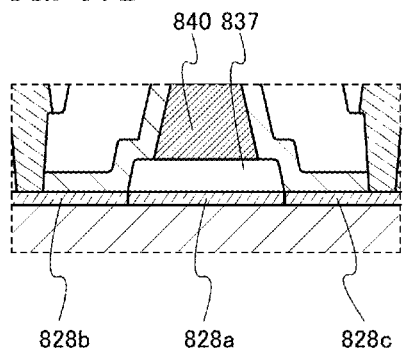

As illustrated in FIG. 67D in a cross-sectional view in the channel length direction, the region 828a has a region that does not overlap the conductive layer 840. The region functions as an offset region. In other words, when seen from the above, the end portions of the regions 828b and 828c are aligned or substantially aligned with the end portion of the insulating layer 837 and do not overlap the end portion of the conductive layer 840.

Figure 67E:
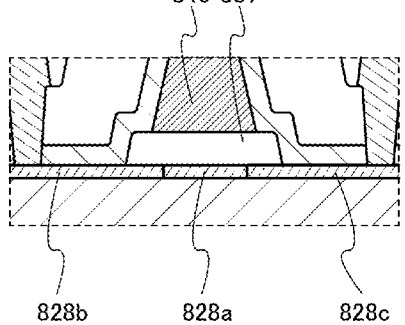

As illustrated in FIG. 67E in a cross-sectional view in the channel length direction, the regions 828b and 828c each have a region overlapping the conductive layer 840 with the insulating layer 837 positioned therebetween. Such a region is referred to as an overlap region. In other words, when seen from the above, the end portions of the regions 828b and 828c overlap the conductive layer 840.

Figure 67F:
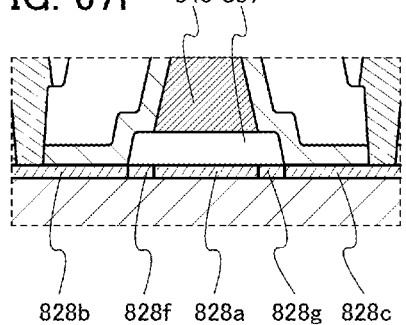

As illustrated in FIG. 67F in a cross-sectional view in the channel length direction, the region 828f is provided between the region 828a and the region 828b, and the region 828g is provided between the region 828a and the region 828c. The regions 828f and 828g have lower concentration of an impurity element and higher resistivity than the regions 828b and 828c. Although the regions 828f and 828g overlap the insulating layer 837 in this case, they may overlap the insulating layer 837 and the conductive layer 840.

Note that in FIGS. 67C to 67F, the transistor illustrated in FIG. 67A is described; however, the transistor illustrated in FIG. 67B can employ any of the structures in FIGS. 67C to 67F as appropriate.

In the transistor illustrated in FIG. 68A, the conductive layer 840 has a stacked structure including a conductive layer 840a in contact with the insulating layer 837 and a conductive layer 840b in contact with the conductive layer 840a. The end portion of the conductive layer 840a is positioned on an outer side than the end portion of the conductive layer 840b. In other words, the conductive layer 840a has such a shape that the end portion extends beyond the end portion of the conductive layer 840b.

Next, modification examples of the regions 828b and 828c are described. Note that FIGS. 68B to 68E are each an enlarged view in the vicinity of the oxide semiconductor layer 828 illustrated in FIG. 68A.

As illustrated in FIG. 68B in a cross-sectional view in the channel length direction, the boundaries between the region 828a and the regions 828b and 828c are aligned or substantially aligned with the end portion of the conductive layer 840a in the conductive layer 840 with the insulating layer 837 positioned therebetween. In other words, when seen from the above, the boundaries between the region 828a and the regions 828b and 828c are aligned or substantially aligned with the end portion of the conductive layer 840.

As illustrated in FIG. 68C in a cross-sectional view in the channel length direction, the region 828a has a region that does not overlap the conductive layer 840. The region functions as an offset region. In other words, when seen from the above, the end portions of the regions 828b and 828c are aligned or substantially aligned with the end portion of the insulating layer 837 and do not overlap the end portion of the conductive layer 840.

As illustrated in FIG. 68D in a cross-sectional view in the channel length direction, the regions 828b and 828c each have a region overlapping the conductive layer 840, specifically the conductive layer 840a. Such a region is referred to as an overlap region. In other words, when seen from the above, the end portions of the regions 828b and 828c overlap the conductive layer 840a.

As illustrated in FIG. 68E in a cross-sectional view in the channel length direction, the region 828f is provided between the region 828a and the region 828b, and the region 828g is provided between the region 828a and the region 828c. The impurity element is added to the regions 828f and 828g through the conductive layer 840a; thus, the regions 828f and 828g have lower concentration of impurity element and higher resistivity than the regions 828b and 828c. Although the regions 828f and 828g overlap the conductive layer 840a, they may overlap both the conductive layer 840a and the conductive layer 840b.

The end portion of the insulating layer 837 may be positioned on the outer side than the end portion of the conductive layer 840a.

Alternatively, the side surface of the insulating layer 837 may be curved.

Alternatively, the insulating layer 837 may have a tapered shape. In other words, an angle formed between a surface where the oxide semiconductor layer 828 and the insulating layer 837 are in contact with each other and a side surface of the insulating film layer may be less than 90°, preferably greater than or equal to 30° and less than 90°.

As described with FIGS. 68A to 68E, the oxide semiconductor layer 828 includes the region 828f, and the region 828g having lower concentration of an impurity element and higher resistivity than the regions 828b and 828c, whereby the electric field of the drain region can be relaxed. Thus, a deterioration of the transistor due to the electric field of the drain region, such as a shift of the threshold voltage of the transistor, can be inhibited.

This embodiment can be combined as appropriate with any of the other embodiments in this specification.

Embodiment 14

Figure 69:
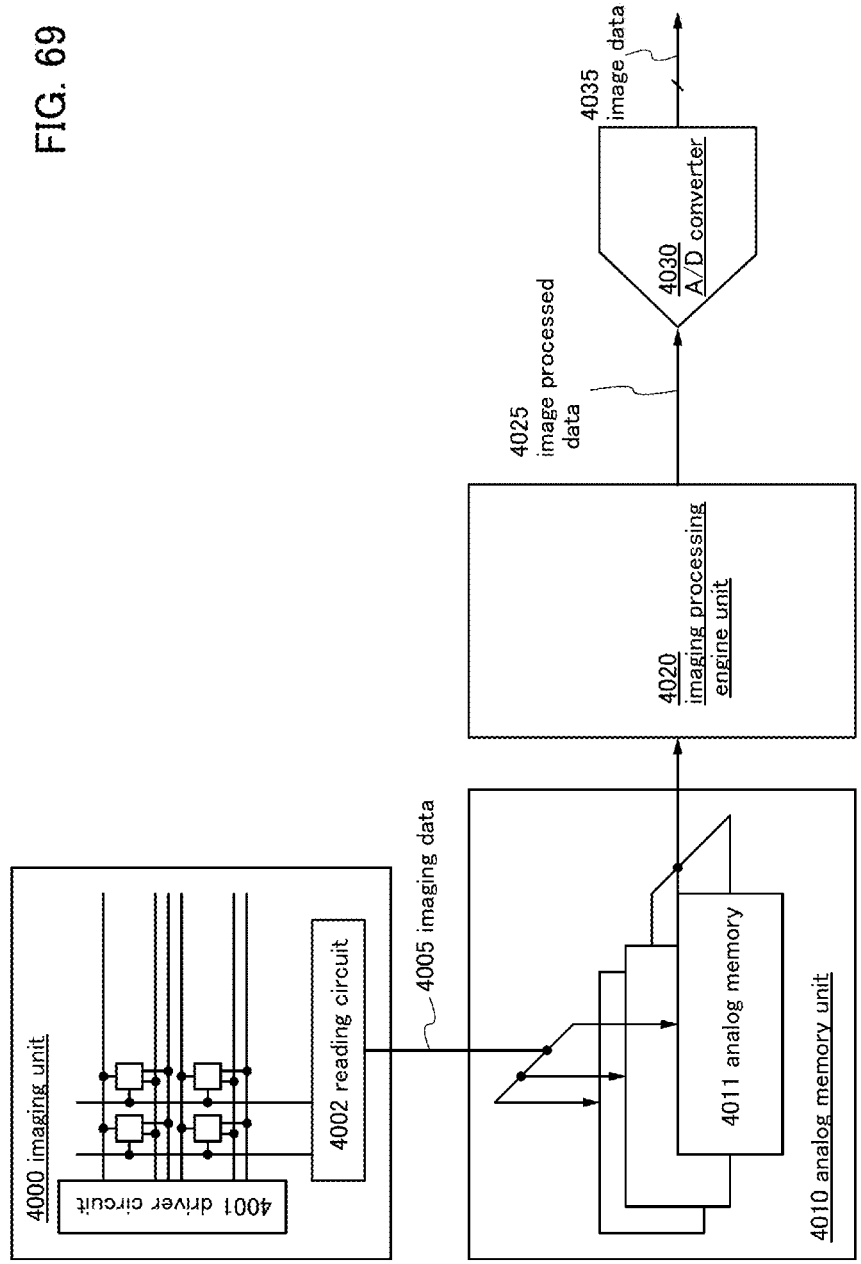
FIG. 69 shows an image processing engine of an imaging device.

In this embodiment, an example of an image processing engine of an imaging device (image sensor) is described with reference to FIG. 69.

The imaging device includes an imaging unit 4000, an analog memory unit 4010, an image processing engine unit 4020, and an A/D converter 4030. The imaging unit 4000 includes a plurality of pixels arranged in a matrix, a driver circuit 4001, and a reading circuit 4002. Each pixel includes a photodiode and a transistor. The analog memory unit 4010 includes a plurality of analog memories. Here, each analog memory includes memory cells the number of which is greater than the number of pixels in the imaging unit 4000. That is, each analog memory can store first imaging data 4005 of one frame obtained by the imaging unit 4000.

The operation of the imaging device is described below. As a first step, the first imaging data 4005 is obtained in each pixel. Imaging may be conducted by what is called a rolling shutter system, in which pixels are sequentially exposed to light and first imaging data 4005 is sequentially read out, or by what is called a global shutter system, in which all the pixels are exposed to light at a time and the imaging data 4005 is sequentially read out.

In the case of the rolling shutter system, during a period in which the imaging data 4005 of pixels in a certain row is read out, light exposure can be performed on pixels in another row; as a result, the frame frequency of imaging can be easily increased. In the case of the global shutter system, even when an object is moving, an image with little distortion can be obtained.

As a second step, the first imaging data 4005 obtained in each pixel is stored in a first analog memory through the reading circuit 4002. Here, unlike in a general imaging device, it is effective that the first imaging data 4005 that is analog data is stored in the first analog memory as it is. In other words, analog-to-digital conversion processing is unnecessary, and thus the frame frequency of imaging can be easily increased.

Subsequently, the first step and the second step are repeated n times. Note that in the n-th repetition, n-th imaging data 4005 obtained in each pixel is stored in an n-th analog memory through the reading circuit 4002.

As a third step, with use of the first to n-th imaging data 4005 stored in the plurality of analog memories, desired image processing is performed in the image processing engine unit 4020 to obtain image-processed imaging data 4025.

As a fourth step, the image-processed imaging data 4025 is subjected to analog-to-digital conversion in the A/D converter 4030 to obtain image data 4035.

As a way of the image processing, image-processed imaging data 4025 having no focus blur is obtained from a plurality of pieces of imaging data 4005. The sharpness of all the imaging data 4005 is calculated, and most clear imaging data 4005 can be obtained as the image-processed imaging data 4025. Alternatively, a region with high sharpness is extracted from each piece of imaging data 4005 and the obtained regions are connected to each other, whereby the image-processed imaging data 4025 can be obtained.

Furthermore, as another way of the image processing, image-processed data 4025 having optimal brightness is obtained from the plurality of pieces of imaging data 4005. The image-processed imaging data 4025 can be obtained as follows: the highest brightness of each piece of imaging data 4005 is calculated, and the image-processed imaging data 4025 can be obtained from the imaging data 4005 except imaging data 4005 whose highest brightness has reached a saturation value.

In addition, the lowest brightness of each piece of imaging data 4005 is calculated, and the image-processed imaging data 4025 can be obtained from the imaging data 4005 except imaging data 4005 whose lowest brightness has reached a saturation value.

Note that in the case where the first and second steps are executed in time with lighting of a flash light for imaging, imaging data 4005 corresponding to the timing at which irradiation with an optimal amount of light is conducted can be obtained.

This embodiment can be combined with any of the other embodiments in this specification as appropriate.

EXPLANATION OF REFERENCE

30: atomic number; 31: atomic number; 40: silicon substrate; 51: transistor; 52: transistor; 53: transistor; 54: transistor; 55: transistor; 56: transistor; 58a: transistor; 58b: transistor; 58c: transistor; 60: photodiode; 60a: photodiode; 60b: photodiode; 60c: photodiode; 61: anode; 62: cathode; 63: low-resistance region; 70: contact plug; 71: wiring layer; 72: wiring layer; 73: wiring layer; 80: insulating layer; 91: circuit; 91a: circuit; 91b: circuit; 91c: circuit; 92: circuit; 101: transistor; 102: transistor; 103: transistor; 104: transistor; 105: transistor; 106: transistor; 107: transistor; 108: transistor; 109: transistor; 110: transistor; 111: transistor; 112: transistor; 115: substrate; 120: insulating layer; 130: oxide semiconductor layer; 130a: oxide semiconductor layer; 130A: oxide semiconductor film; 130b: oxide semiconductor layer; 130B: oxide semiconductor film; 130c: oxide semiconductor layer; 130C: oxide semiconductor film; 140: conductive layer; 141: conductive layer; 142: conductive layer; 150: conductive layer; 151: conductive layer; 152: conductive layer; 156: resist mask; 160: insulating layer; 160A: insulating film; 170: conductive layer; 171: conductive layer; 171A: conductive film; 172: conductive layer; 172A: conductive film; 173: conductive layer; 175: insulating layer; 180: insulating layer; 190: insulating layer; 231: region; 232: region; 233: region; 301: transistor; 311: wiring; 312: wiring; 313: wiring; 314: wiring; 315: wiring; 316: wiring; 317: wiring; 331: region; 332: region; 333: region; 334: region; 335: region; 400: substrate; 401: insulating layer; 402: insulating layer; 402a: insulating layer; 402b: insulating layer; 404: conductive layer; 404a: conductive layer; 404b: conductive layer; 406: semiconductor layer; 406a: semiconductor layer; 406b: semiconductor layer; 407a: region; 407a1: region; 407a2: region; 407b: region; 407b1: region; 407b2: region; 408: insulating layer; 408a: insulating layer; 412: insulating layer; 414: conductive layer; 414a: conductive layer; 414b: conductive layer; 416a: conductive layer; 416a1: conductive layer; 416a2: conductive layer; 416b: conductive layer; 416b1: conductive layer; 416b2: conductive layer; 418: insulating layer; 428: insulating layer; 501: signal; 502: signal; 503: signal; 504: signal; 505: signal; 506: signal; 507: signal; 508: signal; 509: signal; 510: period; 511: period; 520: period; 531: period; 610: period; 611: period; 612: period; 621: period; 622: period; 623: period; 631: period; 701: signal; 702: signal; 703: signal; 704: signal; 705: signal; 821: substrate; 824: insulating layer; 828: oxide semiconductor layer; 828a: region; 828b: region; 828c: region; 828d: region; 828e: region; 828f: region; 828g: region; 828h: region; 828i: region; 837: insulating layer; 840: conductive layer; 840a: conductive layer; 840b: conductive layer; 846: insulating layer; 847: insulating layer; 856: conductive layer; 857: conductive layer; 901: housing; 902: housing; 903: display portion; 904: display portion; 905: microphone; 906: speaker; 907: operation key; 908: stylus; 909: camera; 911: housing; 912: display portion; 919: camera; 921: housing; 922: shutter button; 923: microphone; 925: lens; 927: light-emitting portion; 931: housing; 932: display portion; 933: wristband; 939: camera; 941: housing; 942: housing; 943: display portion; 944: operation key; 945: lens; 946: joint; 951: housing; 952: display portion; 954: speaker; 955: button; 956: input/output terminal; 957: microphone; 959: camera; 1100: layer; 1200: layer; 1300: layer; 1400: layer; 1500: insulating layer; 1510: light-blocking layer; 1520: organic resin layer; 1530a: color filter; 1530b: color filter; 1530c: color filter; 1540: microlens array; 1550: optical conversion layer; 1600: supporting substrate; 1700: pixel matrix; 1730: circuit; 1740: circuit; 1750: circuit; 1800: shift register; 1810: shift register; 1900: buffer circuit; 1910: buffer circuit; 2100: analog switch; 2110: vertical output line; 2200: image output line; 4000: imaging unit; 4002: circuit; 4005: first imaging data; 4010: analog memory unit; 4020: image processing engine unit; 4025: image-processed imaging data; 4030: A/D converter; 4035: image data; 5100: pellet; 5100a: pellet; 5100b: pellet; 5101: ion; 5120: substrate; 5130: target; 5161: region.

This application is based on Japanese Patent Application serial no. 2014-050267 filed with Japan Patent Office on Mar. 13, 2014, the entire contents of which are hereby incorporated by reference.

The invention claimed is:

1. An imaging device comprising:
a first circuit including a first transistor and a second transistor; and
a second circuit including a third transistor and a photodiode,
wherein the first transistor and the third transistor are each an n-channel transistor comprising an oxide semiconductor layer as an active layer,
wherein the second transistor is a p-channel transistor comprising an active region in a silicon substrate,
wherein one of a source and a drain of the first transistor is electrically connected to one of a source and a drain of the second transistor,
wherein a gate of the first transistor is electrically connected to a gate of the second transistor,
wherein the photodiode is positioned in the silicon substrate, wherein the first transistor and the second transistor overlap each other with an insulating layer therebetween, wherein the third transistor and the photodiode overlap each other with the insulating layer therebetween, wherein the second transistor is positioned on a first surface of the silicon substrate, and wherein the photodiode has a light-receiving surface that is opposite to the first surface of the silicon substrate.

2. The imaging device according to claim 1, wherein the oxide semiconductor layer comprises In and Zn.

3. The imaging device according to claim 2, wherein the oxide semiconductor layer further comprises one selected from the group consisting of Al, Ti, Ga, Y, Zr, La, Ce, Nd and Hf.

4. The imaging device according to claim 1, wherein the first circuit is a CMOS circuit.

5. The imaging device according to claim 1, wherein a plane orientation of a crystal in the first surface of the silicon substrate is (110).

6. An electronic appliance comprising:
the imaging device according to claim 1; and
a display device.

7. The imaging device according to claim 1, wherein the photodiode comprises an anode on an opposite surface to the first surface of the silicon substrate.

8. An imaging device comprising:
a first circuit including a first transistor and a second transistor; and
a second circuit including a third transistor, a fourth transistor, a fifth transistor, a sixth transistor and a photodiode,
wherein the first transistor, the third transistor and the fourth transistor are each an n-channel transistor comprising an oxide semiconductor layer as an active layer,
wherein the second transistor is a p-channel transistor,
wherein an active region of the second transistor is positioned in a silicon substrate,
wherein one of a source and a drain of the first transistor is electrically connected to one of a source and a drain of the second transistor,
wherein a gate of the first transistor is electrically connected to a gate of the second transistor,
wherein one of a source and a drain of the third transistor is electrically connected to the photodiode,
wherein the other of the source and the drain of the third transistor is electrically connected to one of a source and a drain of the fourth transistor,
wherein the other of the source and the drain of the third transistor is electrically connected to a gate of the fifth transistor,
wherein one of a source and a drain of the fifth transistor is electrically connected to one of a source and a drain of the sixth transistor,
wherein the photodiode is positioned in the silicon substrate,
wherein the first transistor and the second transistor overlap each other with an insulating layer therebetween,
wherein the photodiode and each of the third to sixth transistors overlap each other with the insulating layer therebetween,
wherein the second transistor is positioned on a first surface of the silicon substrate, and
wherein the photodiode has a light-receiving surface that is opposite to the first surface of the silicon substrate.

9. The imaging device according to claim 8, wherein the oxide semiconductor layer comprises In and Zn.

10. The imaging device according to claim 9, wherein the oxide semiconductor layer further comprises one selected from the group consisting of Al, Ti, Ga, Y, Zr, La, Ce, Nd and Hf.

11. The imaging device according to claim 8, wherein a plane orientation of a crystal in the first surface of the silicon substrate is (110).

12. The imaging device according to claim 8, wherein the fifth transistor and the sixth transistor are each an n-channel transistor comprising an oxide semiconductor layer.

13. The imaging device according to claim 8, wherein the photodiode comprises an anode on an opposite surface to the first surface of the silicon substrate.

14. An electronic appliance comprising:
the imaging device according to claim 8; and
a display device.

15. An imaging device comprising:
a first circuit including a first transistor and a second transistor; and
a second circuit including a third transistor and a photodiode,
wherein the first transistor and the third transistor are each an n-channel transistor comprising an oxide semiconductor layer,
wherein the second transistor is a p-channel transistor comprising an active region in a silicon substrate,
wherein one of a source and a drain of the first transistor is electrically connected to one of a source and a drain of the second transistor,
wherein a gate of the first transistor is electrically connected to a gate of the second transistor,
wherein the photodiode is positioned in the silicon substrate,
wherein the third transistor and the photodiode overlap each other with an insulating layer therebetween,
wherein the second transistor is positioned on a first surface of the silicon substrate, and
wherein the photodiode has a light-receiving surface that is opposite to the first surface of the silicon substrate.

16. The imaging device according to claim 15, wherein the oxide semiconductor layer comprises In and Zn.

17. The imaging device according to claim 16, wherein the oxide semiconductor layer further comprises one selected from the group consisting of Al, Ti, Ga, Y, Zr, La, Ce, Nd and Hf.

18. The imaging device according to claim 15, wherein a plane orientation of a crystal in the first surface of the silicon substrate is (110).

19. The imaging device according to claim 15, wherein the photodiode comprises an anode on an opposite surface to the first surface of the silicon substrate.

20. An electronic appliance comprising:
the imaging device according to claim 15; and
a display device.

21. The imaging device according to claim 15,
wherein the second transistor is positioned over the substrate,
wherein the insulating layer is positioned over the second transistor, and
wherein the first transistor is positioned over the insulating layer.

* * * * *